(12) United States Patent
Iwamatsu et al.

(10) Patent No.: US 8,872,267 B2
(45) Date of Patent: Oct. 28, 2014

(54) SEMICONDUCTOR DEVICE

(71) Applicant: Renesas Electronics Corporation, Kawasaki (JP)

(72) Inventors: Toshiaki Iwamatsu, Kawasaki (JP); Katsuyuki Horita, Kawasaki (JP); Hideki Makiyama, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 73 days.

(21) Appl. No.: 13/675,682

(22) Filed: Nov. 13, 2012

(65) Prior Publication Data
US 2013/0119469 A1 May 16, 2013

(30) Foreign Application Priority Data

Nov. 16, 2011 (JP) ................................. 2011-250491

(51) Int. Cl.
| | | |
|---|---|---|
| H01L 27/088 | (2006.01) |
| H01L 29/78 | (2006.01) |
| H01L 21/84 | (2006.01) |
| H01L 27/12 | (2006.01) |
| H01L 27/11 | (2006.01) |
| H01L 27/02 | (2006.01) |
| H01L 29/786 | (2006.01) |

(52) U.S. Cl.
CPC ............ *H01L 27/0207* (2013.01); *H01L 21/84* (2013.01); *H01L 27/1207* (2013.01); *H01L 29/78648* (2013.01); *H01L 27/1116* (2013.01); *H01L 27/1108* (2013.01)
USPC ...... 257/347; 257/350; 257/368; 257/E27.06; 257/E29.255

(58) Field of Classification Search
CPC ...................... H01L 21/823842; H01L 27/11
USPC ............ 257/347, 368, 350, E27.06, E29.255
See application file for complete search history.

(56) References Cited

U.S. PATENT DOCUMENTS

| | | | |
|---|---|---|---|
| 6,714,439 B2 * | 3/2004 | Kobayashi et al. | 365/154 |
| 6,885,609 B2 | 4/2005 | Lee et al. | |
| 2008/0179676 A1 | 7/2008 | Hirano et al. | |
| 2009/0134468 A1 * | 5/2009 | Tsuchiya et al. | 257/368 |

FOREIGN PATENT DOCUMENTS

| | | |
|---|---|---|
| JP | 2002-353340 A | 12/2002 |
| JP | 2004-200702 A | 7/2004 |
| JP | 2008-187007 A | 8/2008 |
| JP | 2009-135140 A | 6/2009 |

* cited by examiner

*Primary Examiner* — Cathy N Lam
(74) *Attorney, Agent, or Firm* — Sughrue Mion, PLLC

(57) ABSTRACT

Improvements are achieved in the characteristics of a semiconductor device including SRAM memory cells. Under an active region in which an access transistor forming an SRAM is disposed, a p-type semiconductor region is disposed via an insulating layer such that the bottom portion and side portions thereof come in contact with an n-type semiconductor region. Thus, the p-type semiconductor region is pn-isolated from the n-type semiconductor region, and the gate electrode of the access transistor is coupled to the p-type semiconductor region. The coupling is achieved by a shared plug which is an indiscrete conductive film extending from over the gate electrode of the access transistor to over the p-type semiconductor region. As a result, when the access transistor is in an ON state, a potential in the p-type semiconductor region serving as a back gate simultaneously increases to allow an increase in an ON current for the transistor.

19 Claims, 60 Drawing Sheets

|     | on  | off     |
| --- | --- | ------- |
| G   | Vdd | 0(VSS)  |
| 1W  | Vdd | 0(VSS)  |
| 2W  | Vdd | Vdd     |

|  | on | off |
|---|---|---|
| G | Vdd | 0(VSS) |
| 1W | Vdd | 0(VSS) |
| 2W | 0(VSS) | 0(VSS) |

SEMICONDUCTOR DEVICE

CROSS-REFERENCE TO RELATED APPLICATIONS

The disclosure of Japanese Patent Application No. 2011-250491 filed on Nov. 16, 2011 including the specification, drawings and abstract is incorporated herein by reference in its entirety.

BACKGROUND

The present invention relates to a semiconductor device, and particularly to a technology which is effective when applied to a semiconductor device having MOSFETs and an SRAM which are disposed in a SOI substrate.

An SRAM (Static Random Access Memory) is a type of a semiconductor memory which stores data using a flip-flop. For example, in the SRAM, data ("1" or "0") is stored in two cross-coupled CMOS inverters including four transistors. Since two transistors are required for a read access and a write access, in a typical SRAM, a memory cell includes six transistors. The CMOS is the abbreviation of Complementary MOS (Metal Oxide Semiconductor).

For example, Patent Document 1 (Japanese Unexamined Patent Publication No. 2004-200702) shown below discloses a semiconductor memory device including eight transistors N1 to N6 and P1 and P2, in which the two PMOS transistors P1 and P2 and the six NMOS transistors N1 to N6 are respectively arranged in one N-well and one P-well each formed in a semiconductor substrate, and the N-well is disposed in one corner of a memory cell (see the paragraphs [0037] to [0048] and FIGS. 3 to 5).

Also, Patent Document 2 (Japanese Unexamined Patent Publication No. 2002-353340) shown below discloses a semiconductor storage device including a data storage portion 20 in which data is stored, and a transfer gate portion having a MOSFET 12 of a first conductivity type for writing data into the data storage portion and reading data from the data storage portion. As a substrate bias for the MOSFET 12, a potential corresponding to the data stored in the data storage portion is applied thereto (see the paragraphs [0020] to [0025] and FIGS. 2 and 3).

Also, Patent Document 3 (Japanese Unexamined Patent Publication No. 2009-135140) shown below discloses a semiconductor device including a semiconductor supporting substrate 1, an insulating film having a thickness of not more than 10 nm, and a semiconductor layer 4, in which a first field effect transistor having a first gate electrode 20 and forming a logic circuit is formed in the upper surface of the semiconductor layer 4, and a second field effect transistor having a second gate electrode and forming a memory circuit is formed in the upper surface of the semiconductor layer 4. In the semiconductor supporting substrate 1, at least three or more well regions 6, 6T, 7, and the like of different conductivity types are formed, and the well regions electrically isolate the region of the semiconductor supporting substrate 1 located under the first gate electrode and the region of the semiconductor supporting substrate 1 located under the second gate electrode (see FIG. 5 or the like).

On the other hand, Patent Document 4 (Japanese Unexamined Patent Publication No. 2008-187007) shown below discloses an SRAM cell formed in a SOI substrate. In the SRAM, electrical coupling between the drain region of a driver transistor Q2 and the drain region of a load transistor Q3 and electrical coupling between the drain region of a driver transistor Q5 and the drain region of a load transistor Q6 are respectively achieved by interconnect structures 15 and 16 each formed using a SOI layer 3 under an isolation oxide film 4 serving as a partial trench isolation (see FIG. 5 or the like).

RELATED ART DOCUMENTS

Patent Documents

[Patent Document 1]
Japanese Unexamined Patent Publication No. 2004-200702
[Patent Document 2]
Japanese Unexamined Patent Publication No. 2002-353340
[Patent Document 3]
Japanese Unexamined Patent Publication No. 2009-135140
[Patent Document 4]
Japanese Unexamined Patent Publication No. 2008-187007

SUMMARY

To enhance the performance of an LSI (Large Scale Integration) including a reduction in power consumption and an increase in operating speed, the use of a SOI (Silicon On Insulator) substrate is examined.

There is also a technology which uses a SOI substrate for a CMOS (Complementary Metal Oxide Semiconductor) to provide a so-called double gate structure and thereby adjust the threshold of a transistor.

However, in the study of the foregoing double gate structure, the application thereof to one CMOS is practical, but the application thereof to a memory (e.g., SRAM) including a large number of transistors is difficult.

An object of the present invention is to provide a semiconductor device having excellent characteristics. In particular, the present invention aims at achieving improvements in the characteristics of a semiconductor device including transistors (MOSFETs or MOSFETs). Another object of the present invention is to achieve improvements in the characteristics of a semiconductor device having an SRAM memory cell.

The above and other objects and novel features of the present invention will become apparent from a statement in the present specification and the accompanying drawings.

A semiconductor device shown in a representative embodiment of the invention disclosed in the present application includes the followings (a1) to (d2). (a1) is a first transistor coupled between a first potential and a first node. (a2) is a second transistor coupled between the foregoing first node and a second potential lower than the foregoing first potential. (a3) is a third transistor coupled between the foregoing first potential and a second node. (a4) is a fourth transistor coupled between the foregoing second node and the foregoing second potential. (a5) is a fifth transistor coupled between the foregoing first node and a first bit line. (a6) is a sixth transistor coupled between the foregoing second node and a second bit line. (b1) is a first active region which is surrounded by an isolation region and in which the foregoing fifth transistor is disposed. (b2) is a second active region which is surrounded by the isolation region and in which the foregoing sixth transistor is disposed. (c) is an insulating layer disposed under the foregoing first active region and the second active region. (d1) is a first semiconductor region of a first conductivity type disposed under the foregoing first active region via the foregoing insulating layer. (d2) is a second semiconductor region of a second conductivity type opposite to the foregoing first conductivity type disposed under the foregoing first semiconductor region. A bottom portion and a side portion of the foregoing first semiconductor region are disposed so as to come in contact with the foregoing second semiconductor region, and the foregoing first semiconductor region is coupled to a gate electrode of the foregoing fifth transistor.

A semiconductor device shown in another representative embodiment of the invention disclosed in the present application includes the followings (a) to (d). (a) is an n-channel transistor disposed in an active region surrounded by an isolation region. (b) is an insulating layer disposed under the foregoing active region. (c) is a first semiconductor region of a first conductivity type disposed under the foregoing active region via the foregoing insulating layer. (d) is a second semiconductor region of a second conductivity type opposite to the foregoing first conductivity type disposed under the foregoing first semiconductor region. A bottom portion and a side portion of the foregoing first semiconductor region are disposed so as to come in contact with the foregoing second semiconductor region, and the foregoing first semiconductor region is coupled to a gate electrode of the foregoing n-channel transistor.

The semiconductor devices shown in the following representative embodiments of the invention disclosed in the present application allow the characteristics thereof to be improved.

DETAILED DESCRIPTION

Figure 1:
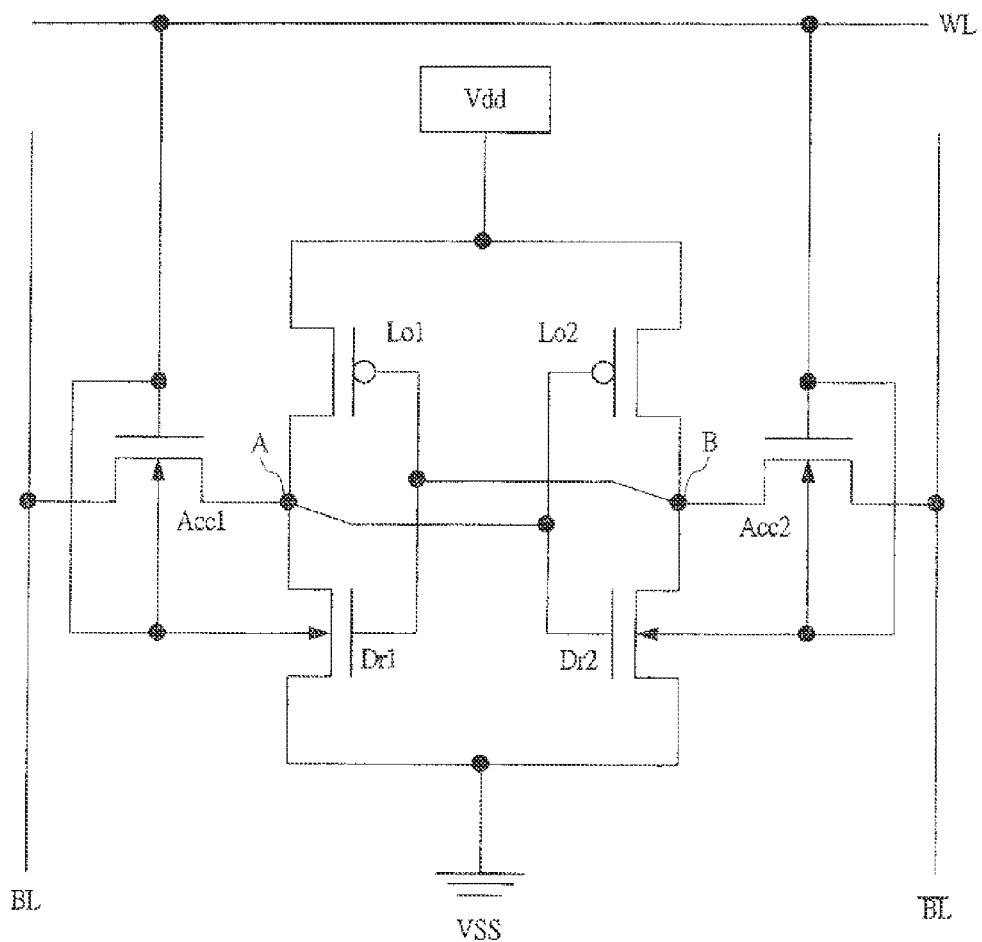
FIG. 1 is an equivalent circuit diagram showing a memory cell in an SRAM of Embodiment 1.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, applications, detailed explanation, supplementary explanation, and so forth of part or the whole of the others. When the number and the like (including the number, numerical value, amount, range, and the like thereof) of elements are referred to in the following embodiments, they are not limited to specific numbers unless particularly explicitly described otherwise or unless they are obviously limited to specific numbers in principle. The number and the like of the elements may be not less than or not more than specific numbers.

In the present embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing number and the like (including the number, numerical value, amount, range, and the like thereof).

Hereinbelow, the embodiments of the present invention will be described in detail with reference to the drawings. Note that, throughout all the drawings for illustrating the embodiments, members having the same functions are designated by the same or associated reference numerals, and a repeated description thereof is omitted. When there are a plurality of similar members (portions), marks may be added to general reference numerals to show individual or specific portions. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

In a cross-sectional view or plan view, the sizes of individual portions do not correspond to those in a real device. For improved clarity of illustration, a specific portion may be shown in a relatively large size. Even when a plan view and a cross-sectional view correspond to each other, individual portions may be shown in varied sizes.

Embodiment 1

A semiconductor device (semiconductor integrated circuit device or semiconductor storage device) of the present embodiment has a memory area in an SRAM and a peripheral circuit area PA.

A description will be given first to a configuration of the memory area in the SRAM, and then to a configuration of the peripheral circuit area PA.

<Configuration of Memory Area>

The memory area has a memory cell area MCA where memory cells in the SRAM are formed, and a tap cell area F'A where tap cells are formed.

<Circuit Configuration>

First, a description will be given to a circuit configuration of each of the memory cells in the SRAM of the semiconductor device (semiconductor integrated circuit device or semiconductor memory device) of the present embodiment. FIG. 1 is an equivalent circuit diagram showing the memory cell in the SRAM of the present embodiment. As shown in the drawing, the memory cell is disposed at the intersection of a pair of bit lines (bit line BL and bit line /BL (bar bit line)) and a word line WL. The memory cell includes a pair of load transistors (load MOSFETs, transistors for load, or MOSFETs for load) Lo1 and Lo2, a pair of access transistors (access MOSFETs, transistors for access, access MOSFETs, or transistors for transfer) Acc1 and Acc2, and a pair of driver transistors (driver MOSFETs, transistors for driving, or MOSFETs for driving) Dr1 and Dr2.

Of the foregoing six transistors included in the foregoing memory cell, the load transistors (Lo1 and Lo2) are p-type (p-channel) transistors, and the access transistors (Acc1 and Acc2) and the driver transistors (Dr1 and Dr2) are n-type (n-channel) transistors.

Note that a MISFET is the abbreviation of Metal Insulator Semiconductor Field Effect Transistor, which may also be called "MOS". In the following description, the foregoing load transistors, access transistor, and driver transistors may be simply called "transistors". Also, each of the transistors may be shown only by its reference numeral (Lo1, Lo2, Acc1, Acc2, Dr1, or Dr2).

Of the foregoing six transistors included in the foregoing memory cell, the transistors Lo1 and Acc1 form a CMOS inverter, and the transistors Lo2 and Acc2 form another CMOS inverter. The respective input/output terminals (storage nodes A and B) of the pair of CMOS inverters are cross-coupled to form a flip-flop circuit as an information storing portion which stores 1-bit information.

The following is a detailed description of the coupling relations among the six transistors included in the foregoing SRAM memory cell.

Between a power source potential (first potential) Vdd and the storage node A, the transistor Lo1 is coupled. Between the storage node A and a ground potential (GND, 0 V, reference potential, or a second potential lower than the foregoing first potential) VSS, the transistor Dr1 is coupled. The gate electrodes of the transistors Lo1 and Dr1 are each coupled to the storage node B.

Between the power source potential Vdd and the storage node B, the transistor Lo2 is coupled. Between the storage node B and the ground potential VSS, the transistor Dr2 is coupled. The gate electrodes of the transistors Lo2 and Dr2 are each coupled to the storage node B.

Between the bit line BL and the storage node A, the transistor Acc1 is coupled. Between the bit line /BL and the storage node B, the transistor Acc2 is coupled. The gate electrodes of the Acc1 and Acc2 are each coupled to the word line WL (serving as the word line).

Here, in the present embodiment, as will be described later, the foregoing six transistors are formed in a semiconductor region 3 as the SOI layer of the SOI substrate (see FIGS. 2, 3, and the like).

Also, the gate electrode of the access transistor (Acc1) of the present embodiment is coupled to the back gate of the access transistor (Acc1) (FIG. 1). The back gate in the present embodiment is a p-type semiconductor region (well region or back gate region) 1W disposed under the foregoing semiconductor region 3 via an insulating layer BOX. Also, the gate electrode of the access transistor (Acc2) is coupled to the back gate of the access transistor (Acc2) (FIG. 1). The back gate in the present embodiment is the p-type semiconductor region 1W disposed under the foregoing semiconductor region 3 via the insulating layer BOX. The details thereof will be described later.

<Memory Operation>

A description will be given to a memory operation by each of the memory cells in the foregoing SRAM. When the storage node A of the CMOS inverter is at a high potential (H), the transistor Dr2 is in an ON state so that the storage node B of the other CMOS inverter is at a low potential (L). Consequently, the transistor Lo1 is brought into the ON state and the transistor Dr1 is brought into an OFF state so that the high potential (H) at the storage node A is maintained. That is, by the latch circuit obtained by cross-coupling the pair of CMOS inverters, the respective states of the storage nodes A and B are maintained so that, while a power source voltage is applied, information is stored.

On the other hand, to the gate electrode of each of the transistors Acc1 and Acc2, the word line WL is coupled. That is, when the word line WL is at the high potential (H), the transistors Acc1 and Acc2 are each in the ON state to electrically couple the flip-flop circuit to the bit lines (BL and /BL). Accordingly, the states of the potentials at the storage nodes A and B (a combination of H and L or a combination of L and H) appear in the bit lines BL and /BL to be read as information in the memory cell.

To write information into the memory cell, the word line WL is set at the high potential (H) and the transistors Acc1 and Acc2 are each brought into the ON state to thereby electrically couple the flip-flop circuit to the bit lines (BL and /BL), transmit the information in the bit lines BL and /BL (the combination of H and L or the combination of L and B) to the storage nodes A and B, and store the information as described above.

<Transistor Configuration>

Figures 2A, 2B:
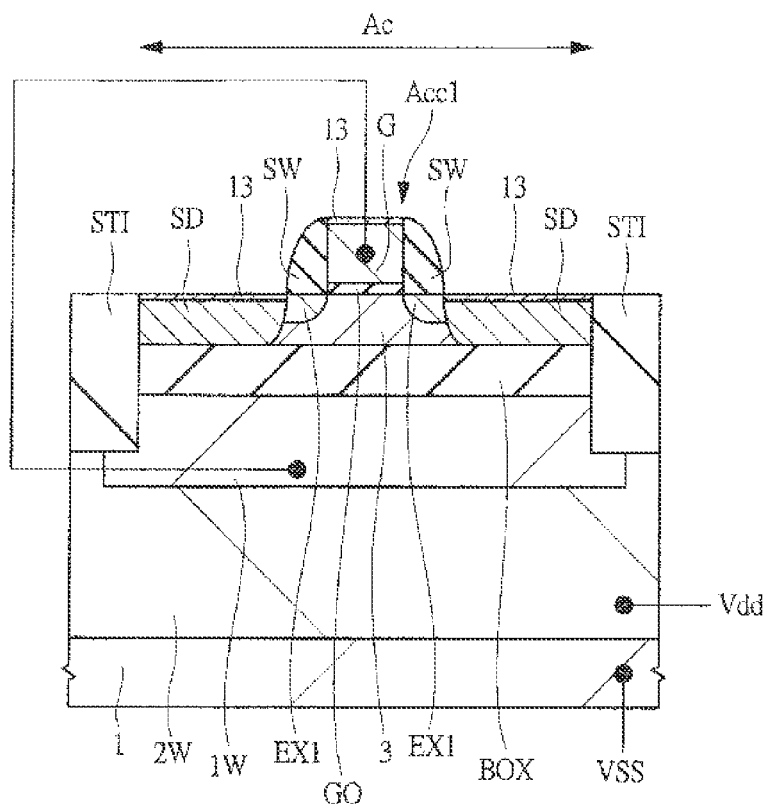
FIG. 2A is a schematic cross-sectional view of an access transistor included in the memory cell in the SRAM of Embodiment 1.
FIG. 2B is a table showing the states of applied potentials in the access transistor.

Here, a schematic configuration of each of the memory cells in the SRAM of the present embodiment will be described with reference to FIGS. 2 and 3. FIG. 2A is a schematic cross-sectional view of the access transistor (Acc1) included in the memory cell in the SRAM of the present embodiment. FIG. 2B is a table showing the states of applied potentials in the access transistor (Acc1). Note that the access transistor (Acc2) also has the same configuration. Also, each of the driver transistors (Dr1 and Dr2), which are similarly the n-type transistors, has the same configuration. FIG. 3 is a schematic cross-sectional view of a load transistor (Lo1) included in the memory cell in the SRAM of the present embodiment. Note that the load transistor (Lo2) also has the same configuration.

Figure 3:
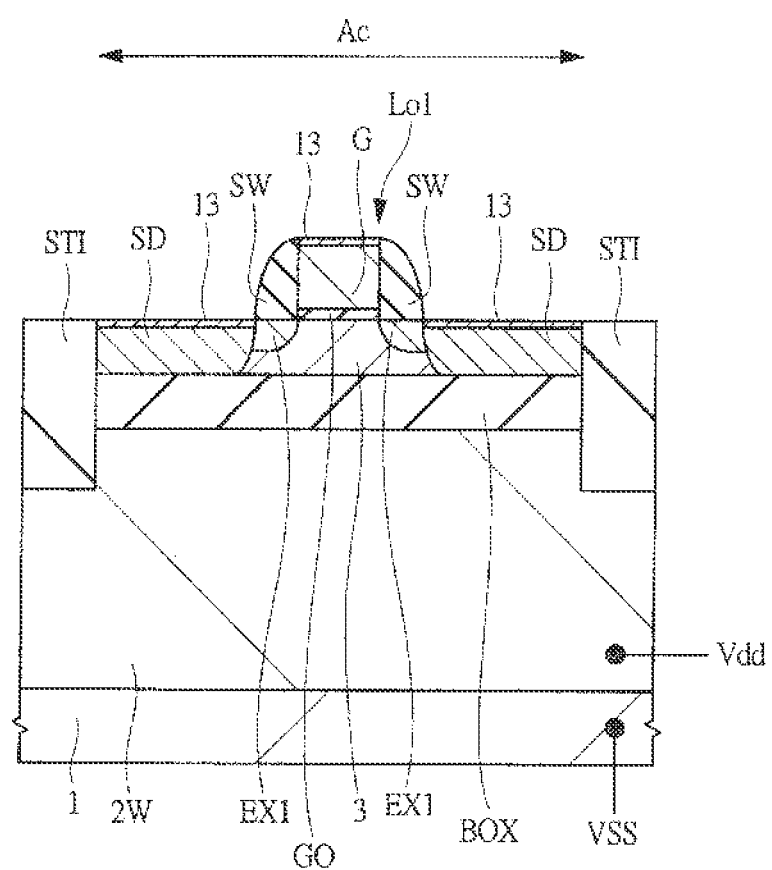
FIG. 3 is a schematic cross-sectional view of a load transistor (Lo1) included in the memory cell in the SRAM of Embodiment 1.

As shown in FIGS. 2 and 3, the six transistors included in the memory cell in the SRAM of the present embodiment are formed in a SOI substrate. The SOI substrate includes a supporting substrate 1 made of a semiconductor such as p-type silicon, the insulating layer BOX located thereover, and the semiconductor region (element formation region) 3 located thereover. The semiconductor region (element formation region) is isolated by an isolation region STI, and a region defined by the isolation region STI serves as an active region (element formation region or transistor formation region) Ac.

As shown in FIG. 2A, the access transistor Acc1 is formed in the main surface of the semiconductor region 3 included in the SOI substrate. The transistor includes a gate electrode G disposed over the semiconductor region 3 via a gate insulating film GO, and source/drain regions disposed on both sides of the gate electrode G. Each of the source/drain regions has an LDD (Lightly Doped Drain) structure, and includes an n-type lightly doped impurity region EX1 and an n-type heavily doped impurity region SD. Note that the source/drain region indicates a region serving as the source or drain. Note that the source/drain region may also be shown as "one end" of a transistor, "the other end" thereof, or the like. Note that 13 denotes a metal silicide layer.

Under the semiconductor region 3 in which the transistor is disposed, the p-type semiconductor region (well region or back-gate region) 1W is disposed via the insulating layer BOX. The bottom portion of the p-type semiconductor region 1W is located at a position deeper than that of the bottom portion of the isolation region STI. Further under the p-type semiconductor region 1W, an n-type semiconductor region (well region or back-gate region) 2W of the conductivity type opposite to that of the p-type semiconductor region 1W is disposed. That is, the p-type semiconductor region 1W is surrounded by the n-type semiconductor region 2W to be pn-isolated. Specifically, over the p-type semiconductor region 1W, the insulating layer BOX is located, and the bottom portion and side portions of the p-type semiconductor region 1W are located so as to come in contact with the n-type semiconductor region 2W. Note that a part of each of the side portions of the p-type semiconductor region 1W may also be in contact with the isolation region STI. Note that, as will be described later, the n-type semiconductor region 2W is continuous under the isolation region STI so as to extend to a position under the load transistor Lo1.

Here, in the present embodiment, the gate electrode G of the access transistor is electrically coupled to the p-type semiconductor region 1W located thereunder. The n-type semiconductor region 2W is fixed to a power source potential (Vdd, drive potential, or first potential). On the other hand, the supporting substrate 1 under the n-type semiconductor region 2W is fixed to a ground potential (VSS, reference potential, second potential, or potential lower than the foregoing first potential).

Thus, the p-type semiconductor region 1W under the region (Ac or either of active regions AcP1 and AcP2 described later) where the access transistor is formed is electrically isolated by the n-type semiconductor region 2W located under the bottom portion thereof and around the outer periphery thereof, while the gate electrode G of the access transistor is electrically coupled to the foregoing p-type semiconductor region 1W, to allow improvements in the transistor operation characteristics of the access transistor (Acc1 or Acc2). That is, when the access transistor (Acc1 or Acc2) is in the ON state (on), a potential in the p-type semiconductor region 1W serving as the back gate is simultaneously increased, and therefore an ON current for the transistor can be increased. In addition, a forward bias voltage is not applied between the p-type semiconductor region 1W and the n-type semiconductor region 2W, and a leakage current therebetween can be reduced (see FIG. 2B). In this manner, the threshold voltage of the access transistor (formed over the p-type semiconductor region 1W) can be individually controlled.

As shown in FIG. 3, the load transistor Lo1 is formed in the main surface of the semiconductor region 3 included in the SOI substrate. The transistor includes the gate electrode G disposed over the semiconductor region 3 via the gate insulating film GO, and the source/drain regions disposed on both sides of the gate electrode G. Each of the source/drain regions has an LDD structure, and includes the p-type lightly doped impurity region EX1 and the p-type heavily doped impurity region SD.

Under the semiconductor region 3 in which the load transistor Lo1 is disposed, the n-type semiconductor region 2W is disposed via the insulating layer BOX. The bottom portion of the n-type semiconductor region 2W is located at a position deeper than that of the bottom portion of the isolation region STI. Moreover, as described above, the n-type semiconductor region 2W has the conductivity type opposite to that of the p-type semiconductor region 1W, extends continuously to a position under the p-type semiconductor region 1W under the driver transistor and the access transistor (Dr1 and Acc1), and is fixed to the power source potential (Vdd).

Figure 4:
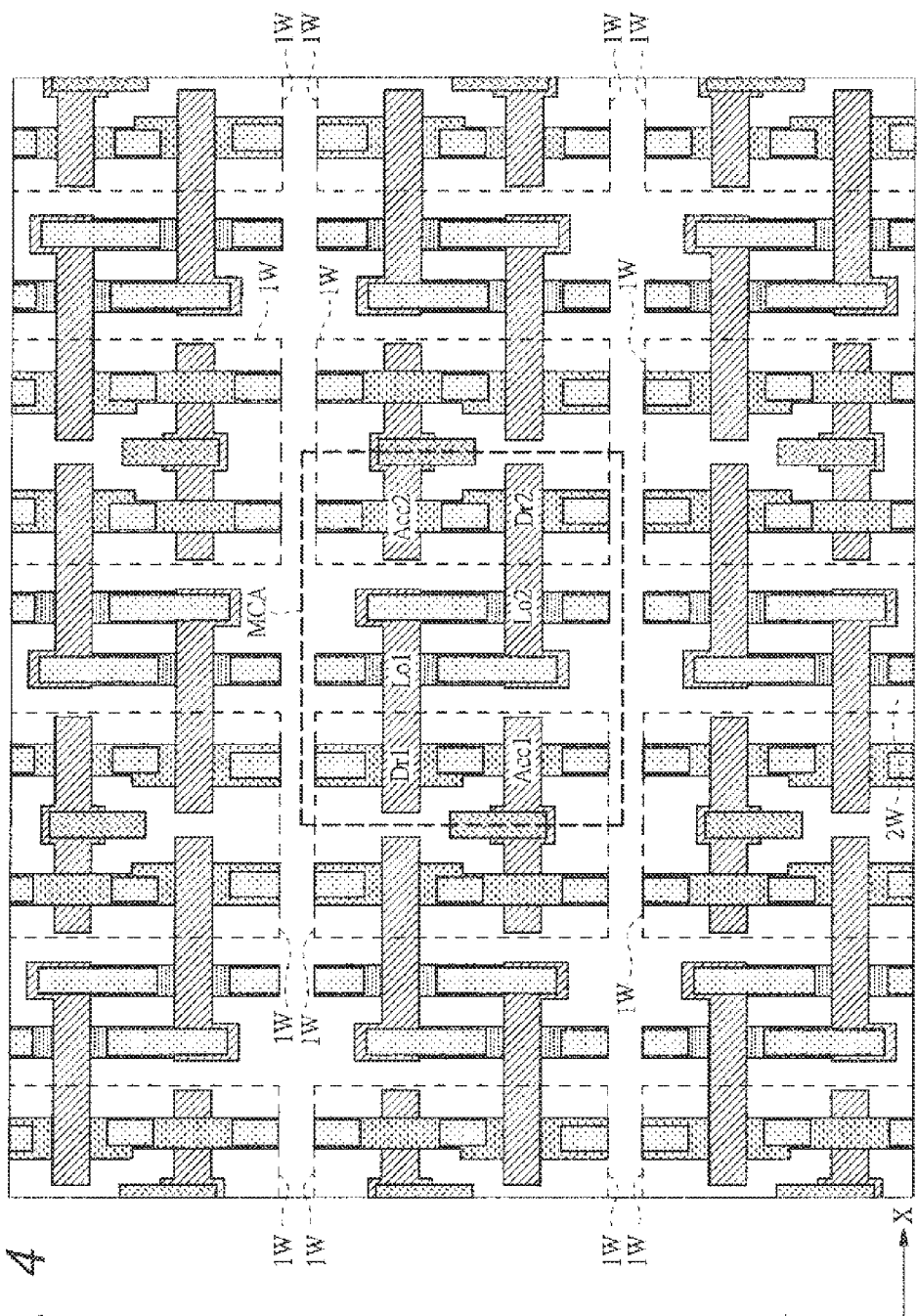
FIG. 4 is a plan view showing a configuration of a memory area in the SRAM of Embodiment 1.
Figure 5:
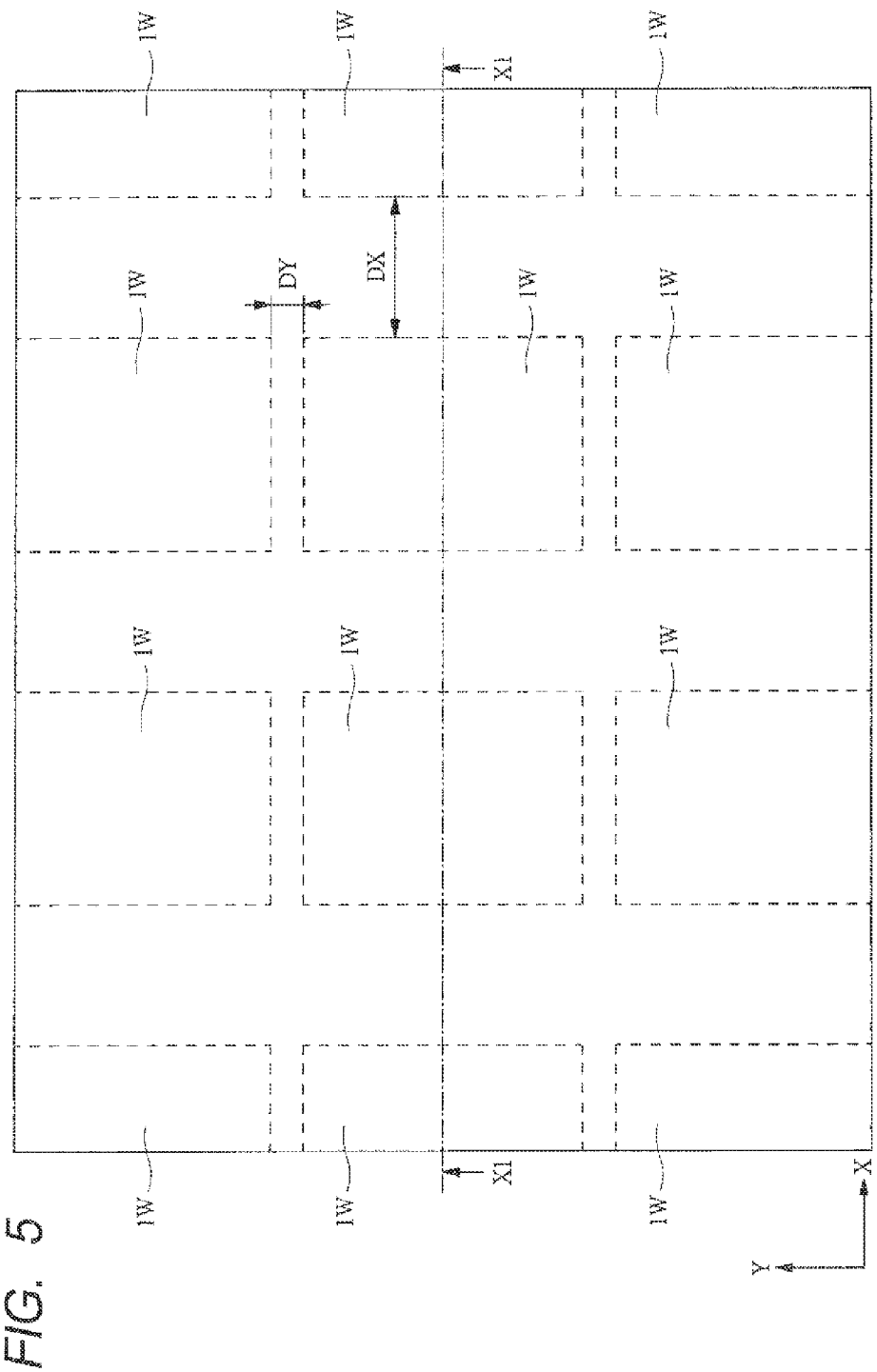
FIG. 5 is a plan view showing the configuration of the memory area in the SRAM of Embodiment 1.
Figure 6:
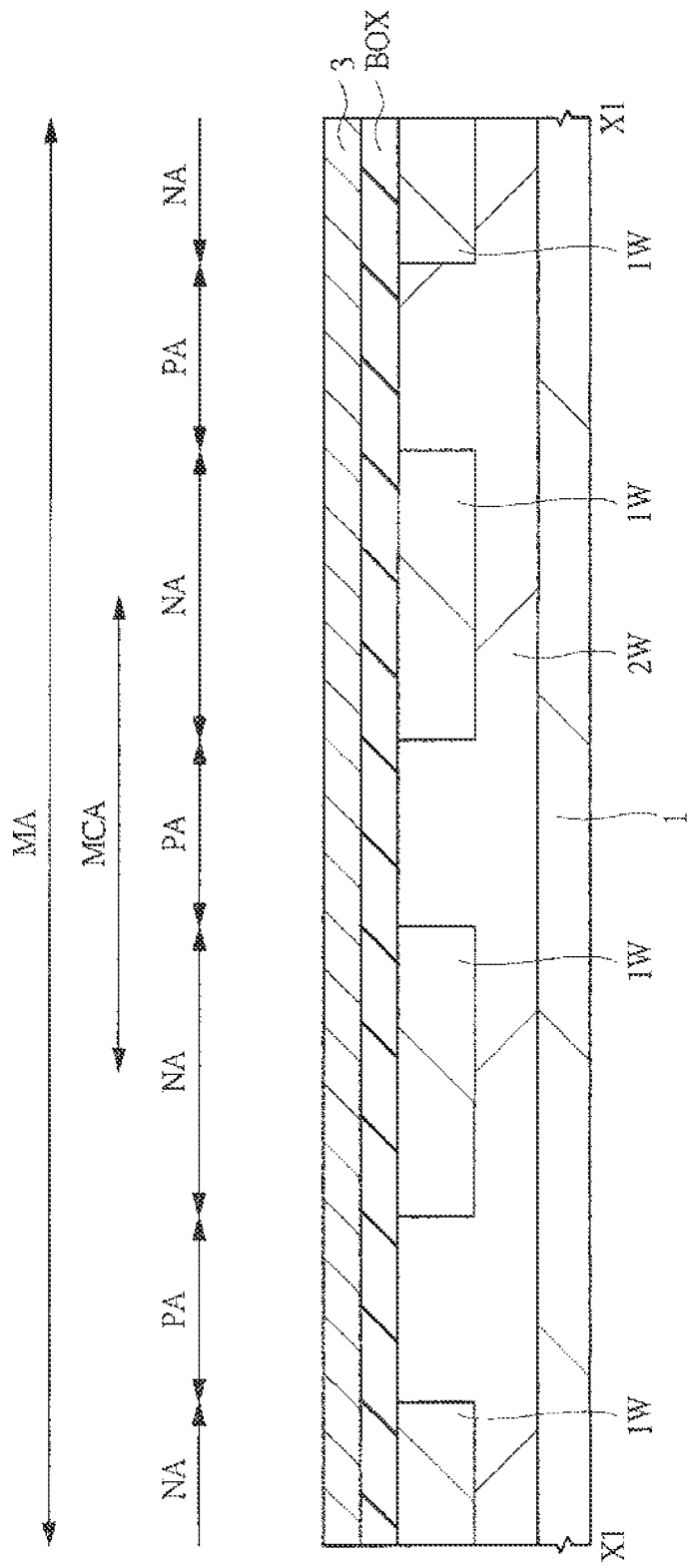
FIG. 6 is a cross-sectional view showing the configuration of the memory area in the SRAM of Embodiment 1.

FIGS. 4 to 6 are plan views and a cross-sectional view each showing a configuration of the memory area in the SRAM of the present embodiment. FIG. 6 corresponds to the X1-X1 cross-sectional portion of FIG. 5.

As shown in FIG. 4, the SRAM of the present embodiment has a configuration in which various patterns are stacked in layers, and the pattern of a memory cell area MCA is repeatedly arranged in the X-direction and in the Y-direction. The configuration of the various patterns will be described later in detail.

As shown in FIG. 5, in the memory area, in planar view, the generally rectangular p-type semiconductor regions 1W are arranged as an array with predetermined spacings (DX and DY) being provided therebetween in the X-direction and in the Y-direction. In planar view, the n-type semiconductor region 2W is indiscreetly disposed (continuously disposed) in a grid-like shape which is continuous in the X-direction and in the Y-direction in the foregoing predetermined spacing (DX and DY) portions, i.e., the spacing portion (first portion or second portion) extending in the X-direction and having the width (distance) DY and the spacing portion (first portion or second portion) extending in the Y-direction and having the width (distance) DX. In the depth direction, as described above, the n-type semiconductor region 2W is disposed so as to cover the bottom portion of the p-type semiconductor region 1W and the side portions thereof (see FIGS. 6, 2, 3, and the like). In the regions (NA) where the p-type semiconductor regions 1W shown in FIG. 6 are formed, the n-type transistors are disposed and, in the exposed areas (PA or areas in contact with the insulating layer BOX) of the n-type semiconductor region 2W, the p-type transistors are disposed.

Note that the semiconductor region 2W may have any shape as long as it can be pn-isolated so as to allow the semiconductor regions 1W to be individually controlled. The shape of the semiconductor region 2W is not necessarily limited to the grid-like shape which is continuous in the X-direction and in the Y-direction (the same holds true in the other embodiments).

<Structure of SRAM>

Next, a structure of each of the memory cells in the SRAM of the present embodiment will be described in detail using plan views and cross-sectional views.

Figure 7:
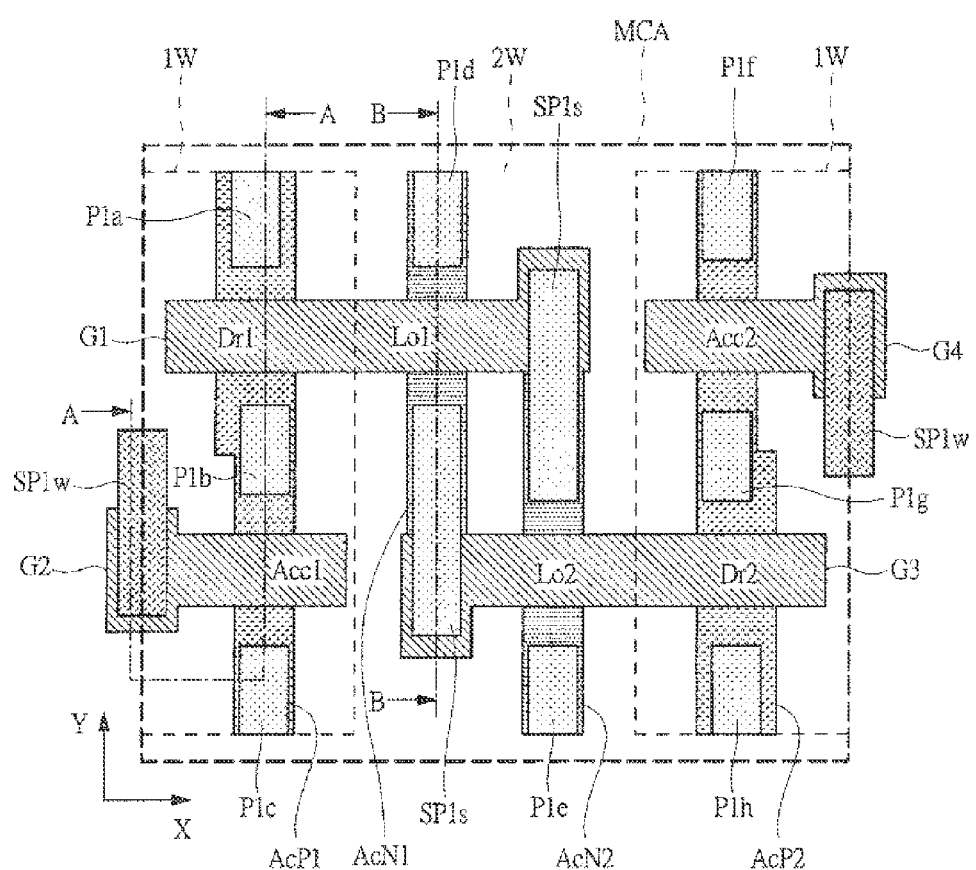
FIG. 7 is a plan view showing a configuration of a memory cell area in the SRAM of Embodiment 1.
Figure 8:
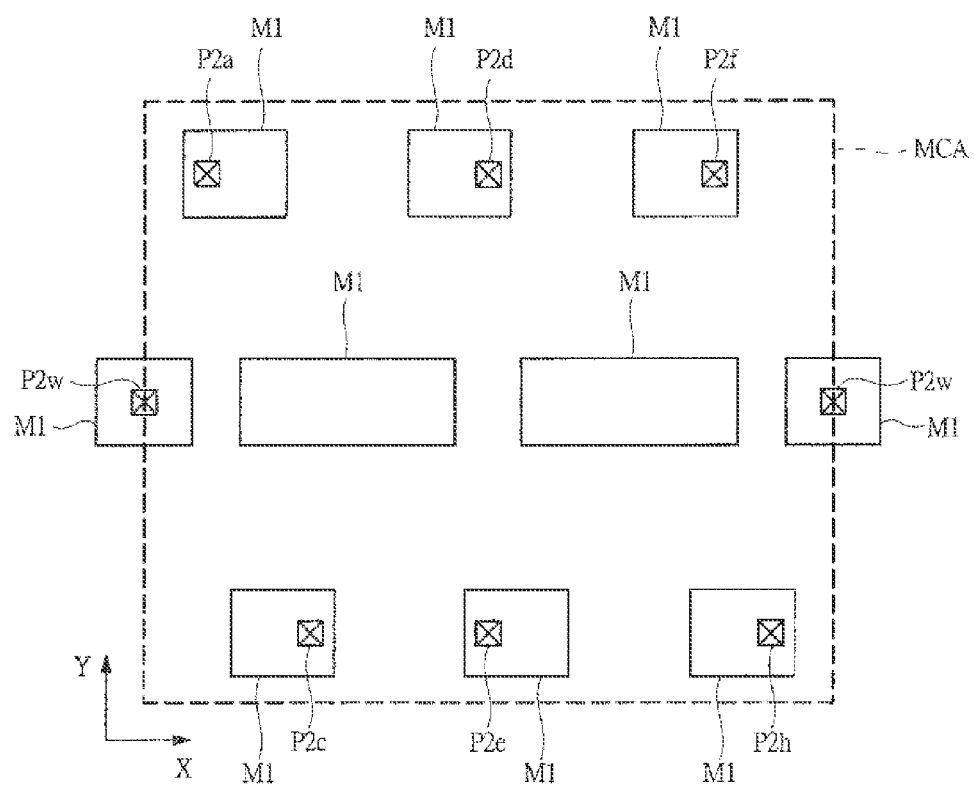
FIG. 8 is a plan view showing the configuration of the memory cell area in the SRAM of Embodiment 1.
Figure 9:
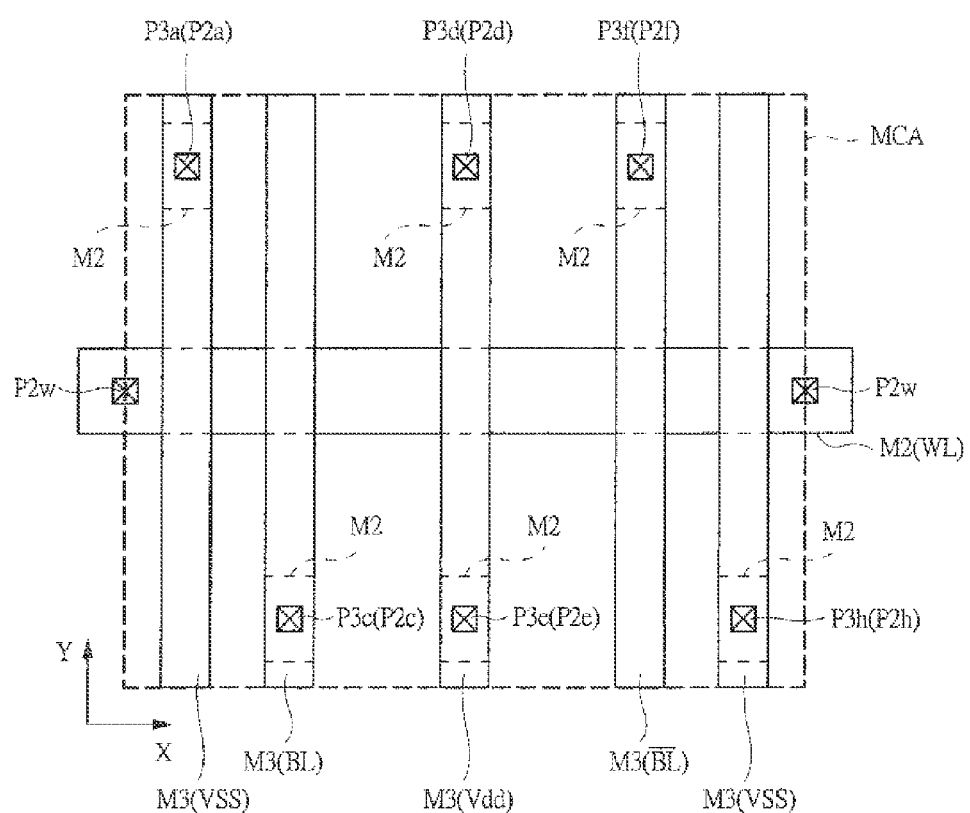
FIG. 9 is a plan view showing the configuration of the memory cell area in the SRAM of Embodiment 1.
Figure 10:
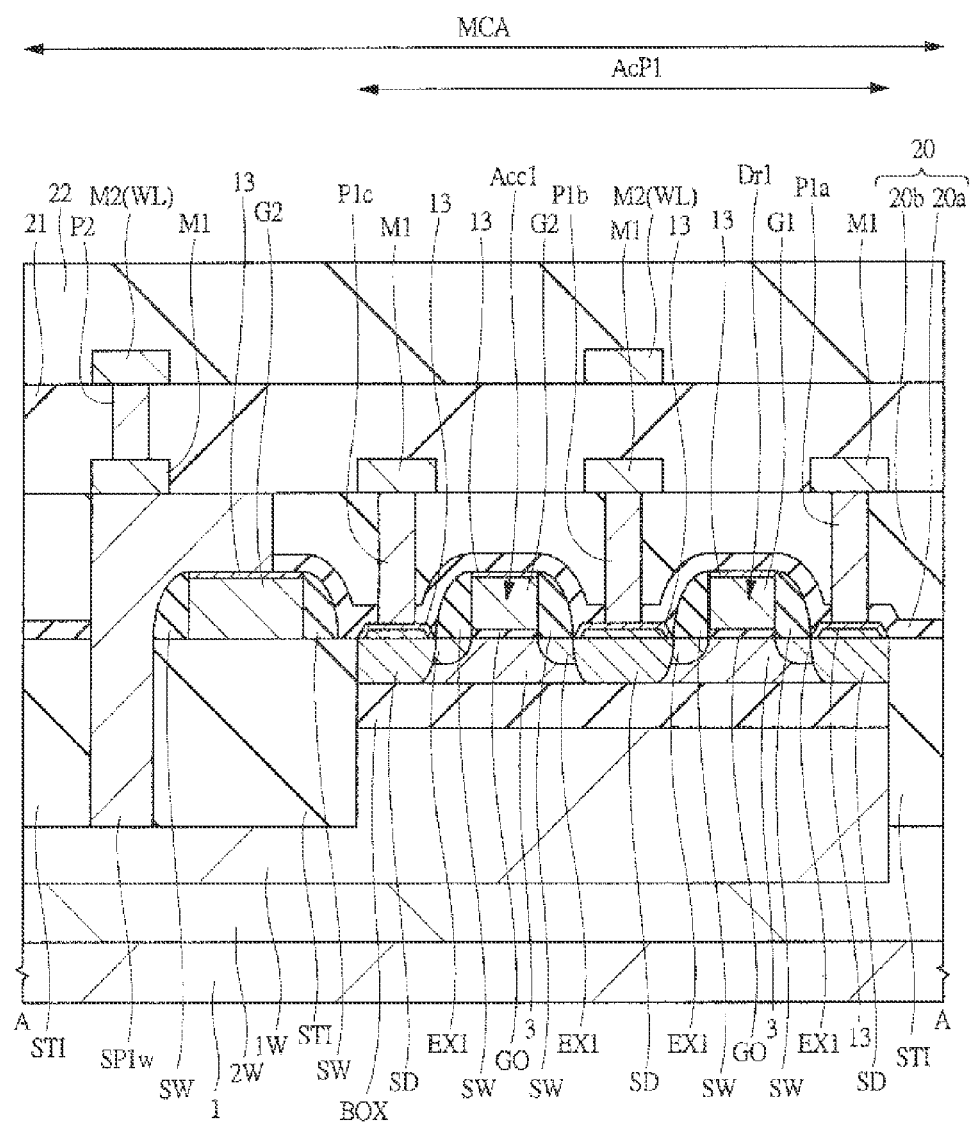
FIG. 10 is a cross-sectional view showing the configuration of the memory cell area in the SRAM of Embodiment 1.
Figure 11:
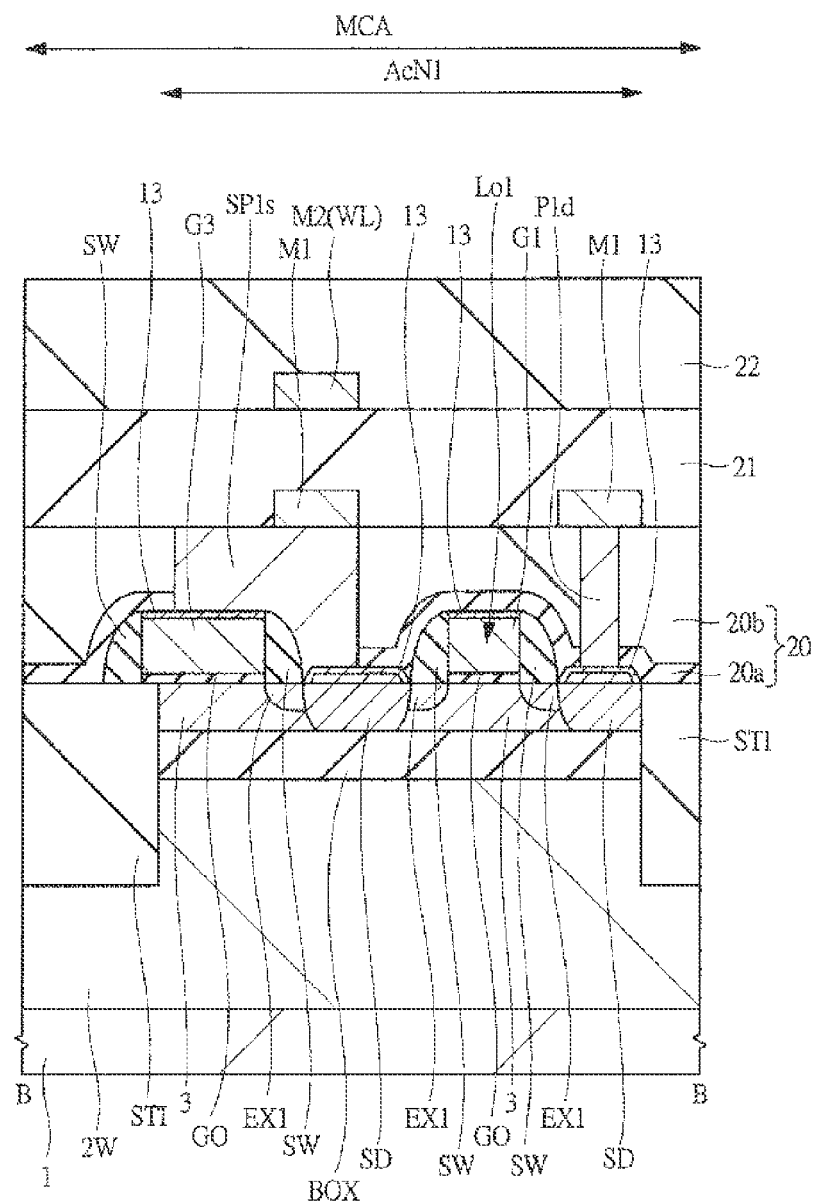
FIG. 11 is a cross-sectional view showing the configuration of the memory cell area in the SRAM of Embodiment 1.

FIGS. 7 to 9 are plan views each showing a configuration of the memory cell area in the SRAM of the present embodiment. FIGS. 10 and 11 are cross-sectional views each showing the configuration of the memory cell area in the SRAM of the present embodiment. FIG. 10 corresponds to the A-A cross-sectional portion of FIG. 7. FIG. 11 corresponds to the B-B cross-sectional portion of FIG. 7. Note that, in the present specification, for simpler illustration, only the cross-sectional views of the active regions AcP1 and AcN1 described later are shown. However, the cross-sectional portions to which the active regions AcP2 and AcN2 correspond also have the same structures.

<Memory Cell Area>

As shown in FIGS. 10 and 11, each of the memory cells in the SRAM of the present embodiment is formed in the SOI substrate. As described above, the SOI substrate includes the supporting substrate 1, the insulating layer BOX, and the semiconductor region (element formation region) 3 located thereover. The semiconductor region (element formation region) 3 is isolated by the isolation region STI. The region defined by the isolation region STI is referred to also as the active region Ac.

Thus, as shown in FIGS. 10 and 11, under the active region (semiconductor region 3) Ac, the insulating layer BOX is disposed. Additionally, in the present embodiment, the semiconductor regions (1W and 2W) are disposed under the insulating layer BOX, and the n-type semiconductor region 2W is further disposed under the p-type semiconductor region 1W.

The generally rectangular region enclosed by the broken line shown in FIG. 7 is the one (1-bit) memory cell area MCA. As shown in the drawing, the four active regions (AcP1, AcN1, AcN2, and AcP2) are arranged in this order in the X-direction. Here, extra marks are added to the reference mark "Ac" showing the active region to show the individual regions. As described above, between the active regions (Ac), the isolation region (STI) is provided. In other words, the active regions (Ac) are defined by the isolation region (STI).

As also described above, under the active regions (Ac), the semiconductor regions (1W and 2W) are disposed via the insulating layer BOX. Of the semiconductor regions (1W and 2W), the p-type semiconductor regions 1W are disposed under the two active regions (AcP1 and AcP2), and the n-type semiconductor region 2W is disposed under each of the active regions (AcN1 and AcN2) to extend to positions under the p-type semiconductor regions W1 under the two active regions (AcP1 an AcP2). Thus, the p-type semiconductor regions 1W are pn-isolated from the n-type semiconductor region 2W.

As shown in FIG. 7, the active region AcP1 has a polygonal shape having long sides in the Y-direction. Specifically, the active region AcP1 has a linear shape in which the width of the portion where the driver transistor Dr1 is disposed in the X-direction is larger than the width of the portion where the access transistor Acc1 is disposed in the X-direction. In FIG. 7, the active region AcP1 has a wider portion in the upper part thereof. Under the active region AcP1, the p-type semiconductor region 1W is disposed via the insulating layer BOX. Further under the p-type semiconductor region 1W, the n-type semiconductor region 2W is disposed (see FIG. 10).

The active region AcN1 has a quadrilateral shape having long sides in the Y-direction (FIG. 7). Under the active region AcN1, the n-type semiconductor region 2W is disposed via the insulating layer BOX (FIG. 11). Note that the n-type semiconductor region 2W extends to a position under the p-type semiconductor region 1W (see FIG. 10).

The active region AcN2 has a quadrilateral shape having long sides in the Y-direction (FIG. 7). Under the active region AcN2, the n-type semiconductor region 2W is disposed via the insulating layer BOX. Note that the n-type semiconductor region 2W extends to a position under the p-type semiconductor region 1W.

The active region AcP2 has a polygonal shape having long sides in the Y-direction. More specifically, the active region AcP2 has a linear shape in which the width of the portion where the driver transistor Dr2 is disposed in the X-direction is larger than the width of the portion where the access transistor Acc2 is disposed in the X-direction. In FIG. 7, the active region AcP2 has a wider portion in the lower part thereof. Under the active region AcP2, the p-type semiconductor region 1W is disposed via the insulating layer BOX. Further under the p-type semiconductor region 1W, the n-type semiconductor region 2W is disposed.

As shown in FIG. 7, over the foregoing active regions (AcP1, AcN1, AcN2, and AcP2), the gate electrodes (gate wires or linear gates) G (G1 to G4) extend via the gate insulating film (see GO in FIGS. 10, 11, and the like) so as to traverse the individual active regions in the X-direction and form the six transistors described in the section <Circuit Configuration>. Note that the active regions (Ac) on both sides of the gate electrodes G serve as the source/drain regions of the transistors (see FIGS. 10, 11, and the like).

Specifically, the common gate G1 is disposed over the active regions AcP1 and AcN1 so as to traverse the active regions AcP1 and AcN1. Consequently, the transistor Dr1 is disposed over the active region AcP1 and the transistor Lo1 is disposed over the active region AcN1 so that the gate electrodes (G) thereof are coupled to each other. The common gate electrode G1 extends to a position over the active region AcN2 to be coupled to the source/drain regions of the transistor Lo2 with a shared plug SP1s described later (see FIG. 11).

Over the active region AcP1, in parallel with the foregoing common gate electrode G1, the gate electrode G2 is disposed. Consequently, the transistor Acc1 is disposed over the active region AcP1, and the source/drain regions of the transistor Dr1 are coupled to the source/drain regions of the transistor Acc1 (commonalized). The gate electrode G2 extends from the active region AcP1 to a position over the isolation region STI and, over the gate electrode G2, a shared plug SP1w is disposed. The shared plug SP1w extends through the isolation region STI to be coupled to the p-type semiconductor region 1W (see FIG. 10). That is, the shared plug SP1w achieves coupling between the gate electrode G2 of the transistor Acc1 and the p-type semiconductor region 1W. Thus, by coupling the gate electrode G2 of the transistor Acc1 to the p-type semiconductor region 1W located thereunder with the shared plug SP1w which is one conductive member (undivided conductive film or indiscrete conductive film), a reduction in the area of the memory cell area MCA can be achieved.

In addition, the common gate electrode G3 is disposed over the active regions AcP2 and AcN2 so as to traverse the active regions AcP2 and AcN2. Consequently, the transistor Dr2 is disposed over the active region AcP2 and the transistor Lo2 is disposed over the active region AcN2 so that the gate electrodes (G) thereof are coupled to each other. The common gate electrode G3 extends to a position over the active region AcN1 to be coupled to the source/drain regions of the transistor Lo1 with the shared plug SP1s described later.

Over the active region AcP2, in parallel with the foregoing common gate electrode G3, the gate electrode G4 is disposed. Consequently, the transistor Acc2 is disposed over the active region AcP2, and the source/drain regions of the transistor Dr2 are coupled to the source/drain regions of the transistor Acc2 (commonalized). The gate electrode G4 extends from the active region AcP2 to a position over the isolation region STI and, over the gate electrode G4, the shared plug SP1w is disposed. The shared plug SP1w extends through the isolation region STI to be coupled to the p-type semiconductor region 1W. That is, the shared plug SP1w achieves coupling between the gate electrode G2 of the transistor Acc2 and the p-type semiconductor region 1W. Thus, by coupling the gate electrode G2 of the transistor Acc2 to the p-type semiconductor region 1W located thereunder with the shared plug SP1w which is one conductive member (undivided conductive film or indiscrete conductive film), a reduction in the area of the memory cell area MCA can be achieved.

The foregoing four gate electrodes G1 to G4 are grouped into two pairs, and the two gate electrodes in each of the two pairs are arranged on the same line (in a linear configuration). Specifically, the common gate electrode G1 traversing the active regions AcP1 and AcN1 thereover and the gate electrode G4 over the active region AcP2 are arranged on the same line extending in the X-direction. The common gate electrode G3 traversing the active regions AcP2 and AcN2 thereover and the gate electrode G2 over the active region AcP1 are arranged on the same line extending in the X-direction.

Over the source/drain regions of the foregoing six transistors (Dr1, Acc1, Lo1, Lo2, Acc2, and Dr2), first plugs (P1a to P1h) are disposed (FIG. 7). The first plugs P1 are coupled to first-layer interconnect wires M1 described later. Over the four gate electrodes (G1 to G4) also, the first plugs P1 are disposed. Since the first plugs P1 disposed over the four gates (G1 to G4) form the shared plugs, they are denoted by SP1s and SP1w, as described above.

As described above, each of the foregoing shared plugs SP1w is a deeply buried plug reaching the p-type semiconductor region 1W (see FIG. 10). In other words, the bottom portions of the shared plugs SP1w are located at positions deeper than those of the bottom portions of the other first plugs P1 (P1a to P1h and SP1s).

The shared plug (shared contact) SP1s connecting the common gate electrode G3 of the transistors Lo2 and Dr2 and the other source/drain region of the transistor Lo1 can be associated with the storage node A of FIG. 1.

Also, the shared plug (shared contact) SP1s connecting the common gate electrode G3 of the transistors Lo1 and Dr1 and the other source/drain region of the transistor L2 can be associated with the storage node B of FIG. 1.

Over the foregoing first plugs P1 (including SP1s and SP1w), the first-layer interconnect wires M1 are disposed. Over the first-layer interconnect wires M1, a multilayer interconnect layer is further disposed. For example, over the first-layer interconnect wires M1, second plugs P2 and second-layer interconnect wires M2 are disposed and, over the second-layer interconnect wires M2, third plugs P3 and third-layer interconnect wires M3 or the like are disposed. Via these interconnect wires and the like, electrical coupling between the first plugs P1 is achieved.

As long as the state of coupling between the transistors shown in FIG. 1 is achieved, there is no limit to a specific form of coupling between the first plugs P1, e.g., to a layout of the first-layer interconnect wires M1, the second plugs P2, the second-layer interconnect wires M2, the third plugs P3, the third-layer interconnect wires M3, and the like. An example of the layout will be described below.

FIGS. 8 and 9 are plan views each showing a configuration of the memory cells in the SRAM of the present embodiment. FIG. 8 described above shows the layout of the first-layer interconnect wires M1 and the second plugs P2. FIG. 9 shows the layout of the second plugs P2, the second-layer interconnect wires M2, the third plugs P3, and the third-layer interconnect wires M3. In FIGS. 7 to 9, by superimposing the plan views based on the memory cell area MCA, the positional relations among the patterns shown in the individual drawings are made clear.

As shown in FIG. 8, the first-layer interconnect wires M1 are disposed so as to couple the shared plug (shared contact) SP1s over the common gate electrode G3 of the transistors Lo2 and Dr2 to the first plug P1b over the common source/drain region of the transistors Dr1 and Acc1.

The first-layer interconnect wires M1 are disposed so as to couple the shared plug (shared contact) SP1s over the common gate electrode G1 of the transistors Lo1 and Dr2 to the first plug P1g over the common source/drain region of the transistors Dr2 and Acc2.

Over the first plugs P1a, P1c, P1d, P1e, P1f, and P1h and the two shared plugs (shard contacts) SP1w, the first-layer interconnect wires (pad regions) M1 are formed respectively and, over the respective first-layer interconnect wires M1, the second plugs P2 (the plugs P2a, P2c, P2d, P2e, P2f, P2h, and the two plugs P2w) are disposed.

As shown in FIG. 9, the second-layer interconnect wire M2 is disposed so as to couple the second plugs P2w coupled to the two shared plugs (shared contacts) SP1w to each other in the X-direction. The second-layer interconnect wire M2 serves as the word line WL.

Over the other second plugs P2 (P2a, P2c, P2d, P2e, P2f, and P2h), the second-layer interconnect wires (pad regions) M2 are formed respectively and, over the respective second-layer interconnect wires M2, the third plugs P3 (P3a, P3c, P3d, P3e, P3f, and P3h) are disposed.

The third-layer interconnect wire M3 is disposed so as to couple the third plugs P3d and P3e coupled to the first plugs P1d and P1e to each other in the Y-direction. The third-layer interconnect wire M3 serves as a power-source potential line (Vdd).

The third-layer interconnect wire M3 is disposed over the third plug P3a coupled to the first plug P1a so as to couple the third plug P3a thereto in the Y-direction, and the third-layer interconnect wire M3 is disposed over the third plug P3h coupled to the first plug P1h so as to couple the third plug P3h thereto in the Y-direction. The two third-layer interconnect wires M3 serve as ground potential lines (VSS).

The third-layer interconnect wire M3 is disposed over the third plug P3c coupled to the first plug P1c so as to couple the third plug P3c thereto in the Y-direction, and the third-layer interconnect wire M3 is disposed over the third plug P3f coupled to the first plug P1f so as to couple the third plug P3f thereto in the Y-direction. The two third-layer interconnect wires M3 serve as the bit lines (BL and /BL).

<Configuration of Memory Cell Array>

Figure 12:
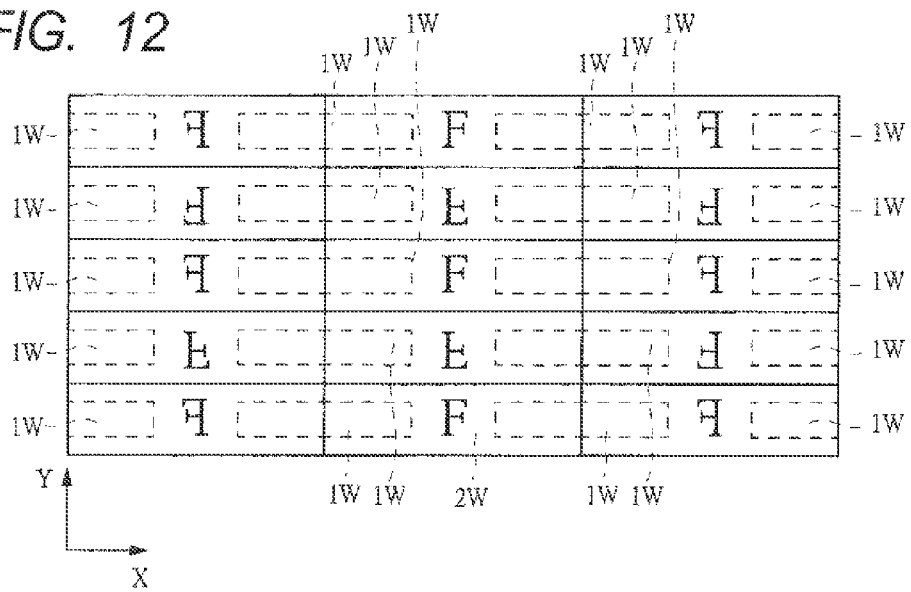
FIG. 12 is a plan view showing the concept of a memory cell array in the SRAM of Embodiment 1.

FIG. 12 is a plan view showing the concept of a memory cell array in the SRAM of the present embodiment. As shown in FIG. 12, when the memory cell area MCA described with reference to FIG. 7 and the like is represented by "F", in the memory cell array, the memory cell area MCA is repeatedly disposed in the vertical direction (Y-direction) in the drawing line-symmetrically with respect to the line (X-axis) extending in the X-direction. The memory cell area MCA is also repeatedly disposed in the lateral direction (X-direction) in the drawing line-symmetrically with respect to the line (Y-axis) extending in the Y-direction (see also FIG. 4).

Note that, as described above, the plurality of p-type semiconductor regions 1W are arranged in the X-direction and in the Y-direction, while the n-type semiconductor region 2W is indiscreetly disposed in a grid-like shape which is continuous in the X-direction and in the Y-direction between the p-type semiconductor regions 1W.

Such a configuration allows the threshold voltages of the n-type access transistors forming the memory cell array in the SRAM and formed over the p-type semiconductor regions 1W to be individually controlled.

<Description of Tap Cells>

As described above, the n-type semiconductor region 2W is fixed to the power source potential (Vdd), and the supporting substrate 1 is fixed to the ground potential (VSS) (see FIGS. 2 and 3). In the memory areas, regions (tap cells) for applying predetermined potentials to the substrate and the semiconductor regions may be provided.

Figure 13:
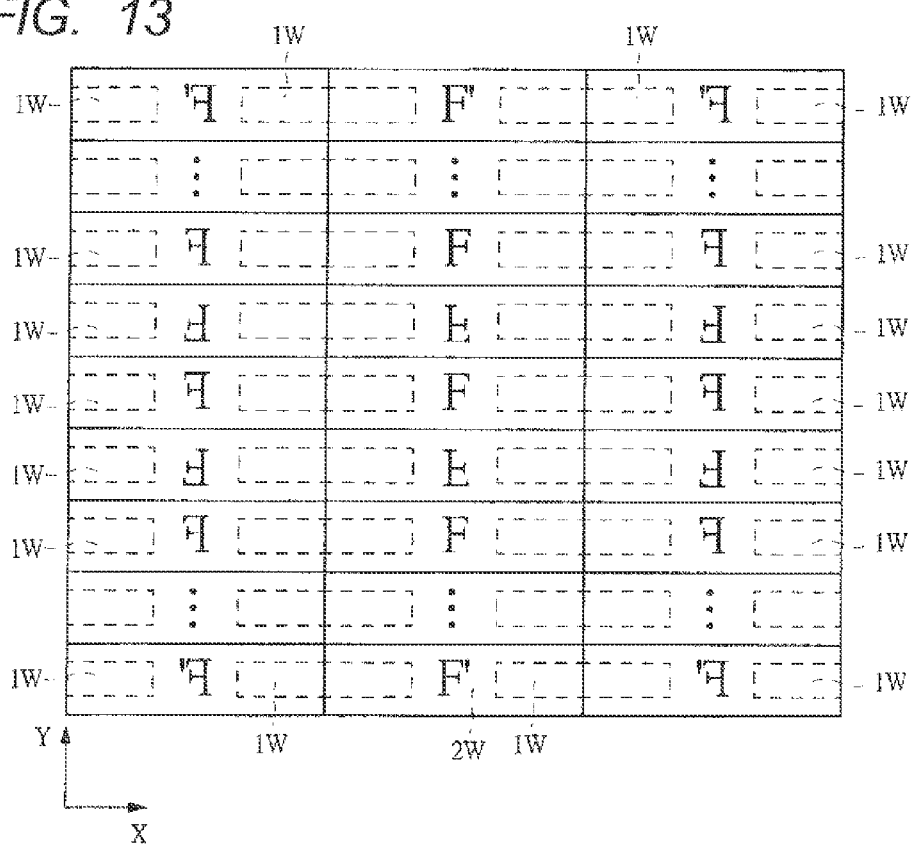
FIG. 13 is a plan view conceptually showing the positions of tap cell areas in the memory area in the SRAM of Embodiment 1.

FIG. 13 is a plan view conceptually illustrating the positions of the tap cells in the memory areas in the SRAM of the present embodiment. As shown in the drawing, each of the tap cells (power supply cells) is disposed for each n sets of m memory cell areas arranged in the Y-direction, and repeatedly disposed in the X-direction line-symmetrically with respect to the line extending in the Y-direction. In other words, a set of tap cell areas is disposed for each array region portion including m×n memory cell areas. The set of tap cell areas include the plurality of tap cells arranged in the X-direction. In FIG. 13, one of the plurality of tap cells arranged in the X-direction is represented by "F'".

In the tap cell (F'), the power source potential (Vdd) is applied to the n-type semiconductor region 2W, and the ground potential (VSS) is applied to the supporting substrate 1. In other words, the n-type semiconductor region 2W is coupled to the power-source potential line (Vdd) via plugs and wires which are disposed in the tap cell (F'). Also, the supporting substrate 1 is coupled to the ground potential (VSS) via the plugs and the wires which are disposed in the tap cell (F').

As long as the state of coupling in which the predetermined potentials are applied to the n-type semiconductor region 2W and the supporting substrate 1 is achieved, there is no limit to a specific form of coupling therebetween, e.g., to a layout of the first plugs P1, the first-layer interconnect wires M1, the second plugs P2, the second-layer interconnect wires M2, the third plugs P3, the third-layer interconnect wires M3, and the like. An example of the layout will be described below.

Figure 14:
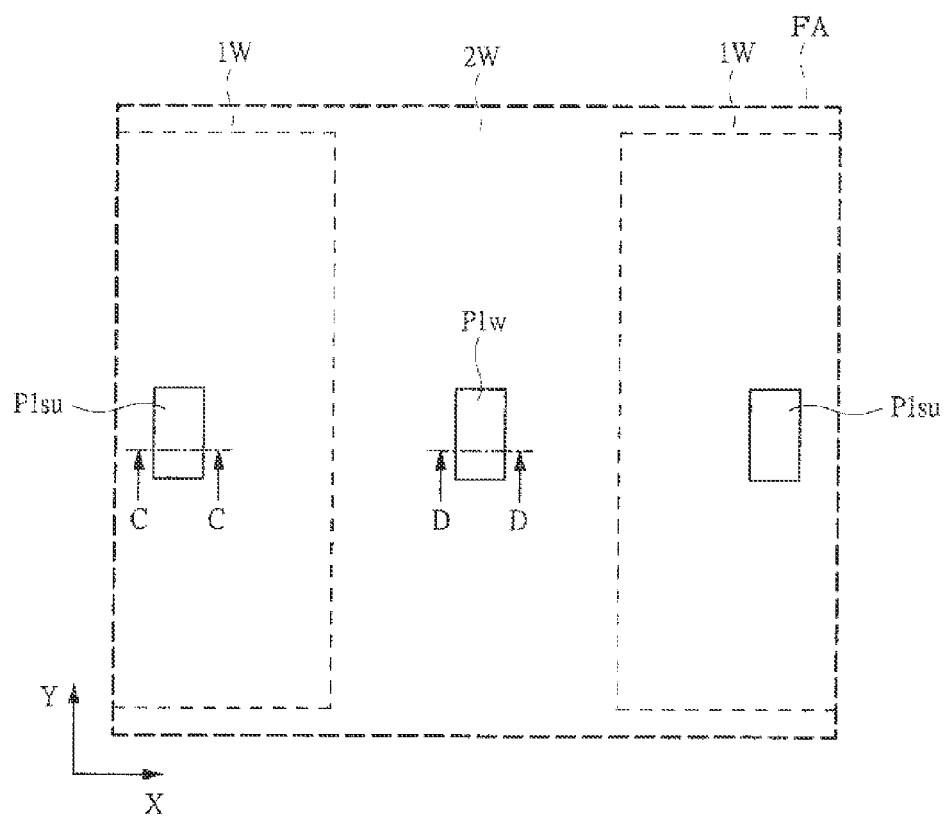
FIG. 14 is a plan view showing a configuration of a tap cell in the SRAM of Embodiment 1.
Figure 15:
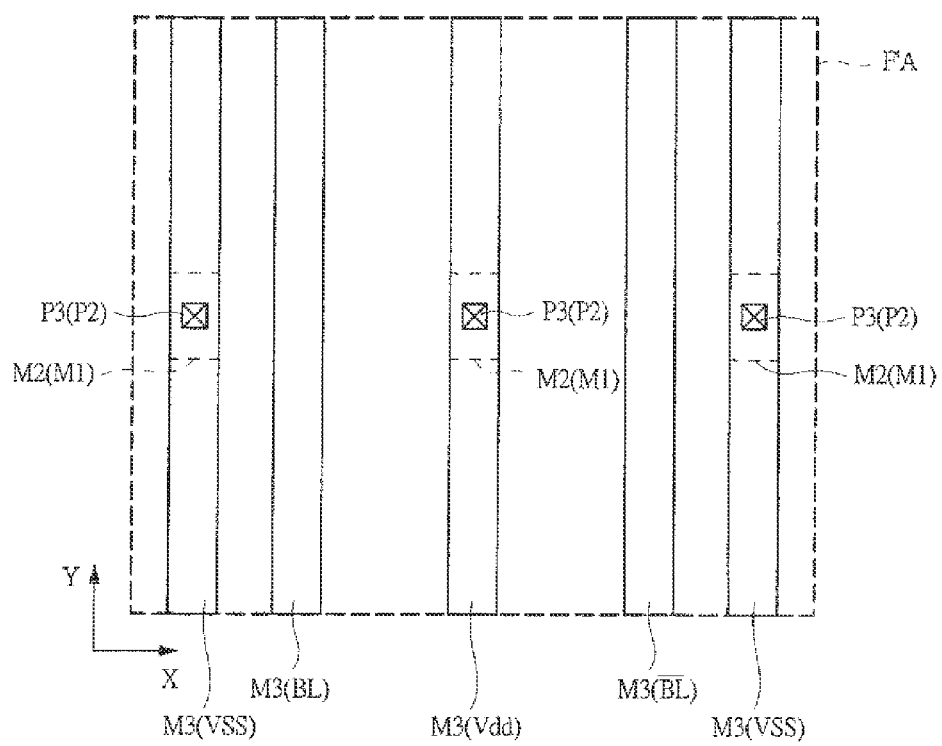
FIG. 15 is a plan view showing the configuration of the tap cell in the SRAM of Embodiment 1.
Figure 16:
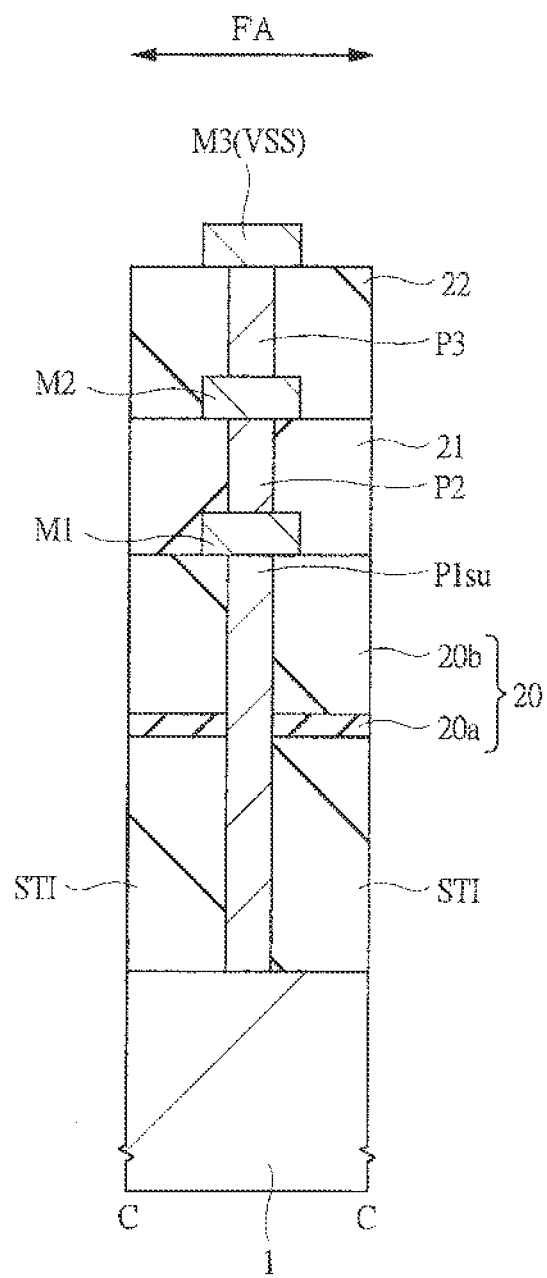
FIG. 16 is a cross-sectional view showing the configuration of the tap cell in the SRAM of Embodiment 1.
Figure 17:
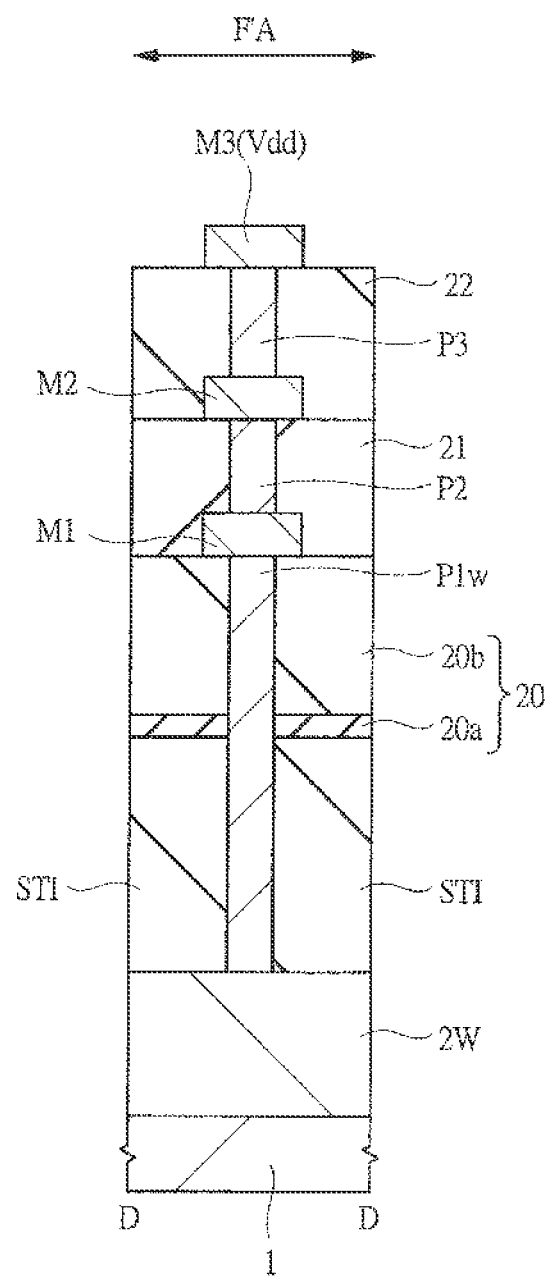
FIG. 17 is a cross-sectional view showing the configuration of the tap cell in the SRAM of Embodiment 1.

FIGS. 14 and 15 are plan views each showing a configuration of the tap cell (F') in the SRAM of the present embodiment. FIGS. 16 and 17 are cross-sectional views each showing the configuration of the tap cell in the SRAM. FIG. 16 corresponds to the C-C cross-sectional portion of FIG. 14. FIG. 17 corresponds to the D-D cross-sectional portion of FIG. 14.

For example, as shown in FIG. 14, in a tap cell area F'A which is a generally rectangular region enclosed by the broken line, plugs P1su and P1w are disposed. As shown in FIG. 16, in the C-C cross-sectional portion, the supporting substrate 1 is disposed under the isolation region (STI). Each of the plugs P1su is disposed to extend through the isolation region STI and be coupled to the supporting substrate 1. As shown in FIG. 17, in the D-D cross-sectional portion, the n-type semiconductor region 2W is disposed under the isolation region (STI). The plug P1w is disposed to extend through the isolation region STI and be coupled to the n-type semiconductor region 2W.

The plug P1su coupled to the supporting substrate 1 is coupled to the third-layer interconnect wire M3 (VSS) via the first-layer interconnect wire M1, the second plug P2, the second-layer interconnect wire M2, and the third plug P3 (FIGS. 15 and 16). The plug P1w coupled to the n-type semiconductor region 2W is coupled to the third-layer interconnect wire M3 (Vdd) via the first-layer interconnect wire M1, the second plug P2, the second-layer interconnect wire M2, and the third plug P3 (FIGS. 15 and 17).

As shown in FIG. 15, the third-layer interconnect wire M3 (VSS) coupled to the plug P1su is a ground potential line described in the foregoing section <Configuration of Memory Cell>, and extends from the memory cell area MCA. The third-layer interconnect wire M3 (Vdd) coupled to the plug P1w is the power-source potential line described in the section <Configuration of Memory Cell>, and extends from the memory cell area MCA. These lines may also be provided as lines other than the potential lines described in the section <Configuration of Memory Cell>. Between these potential lines, the bit lines (BL and /BL) extending from the memory cell area MCA are disposed.

<Configuration of Peripheral Circuit Area>

Figure 18:
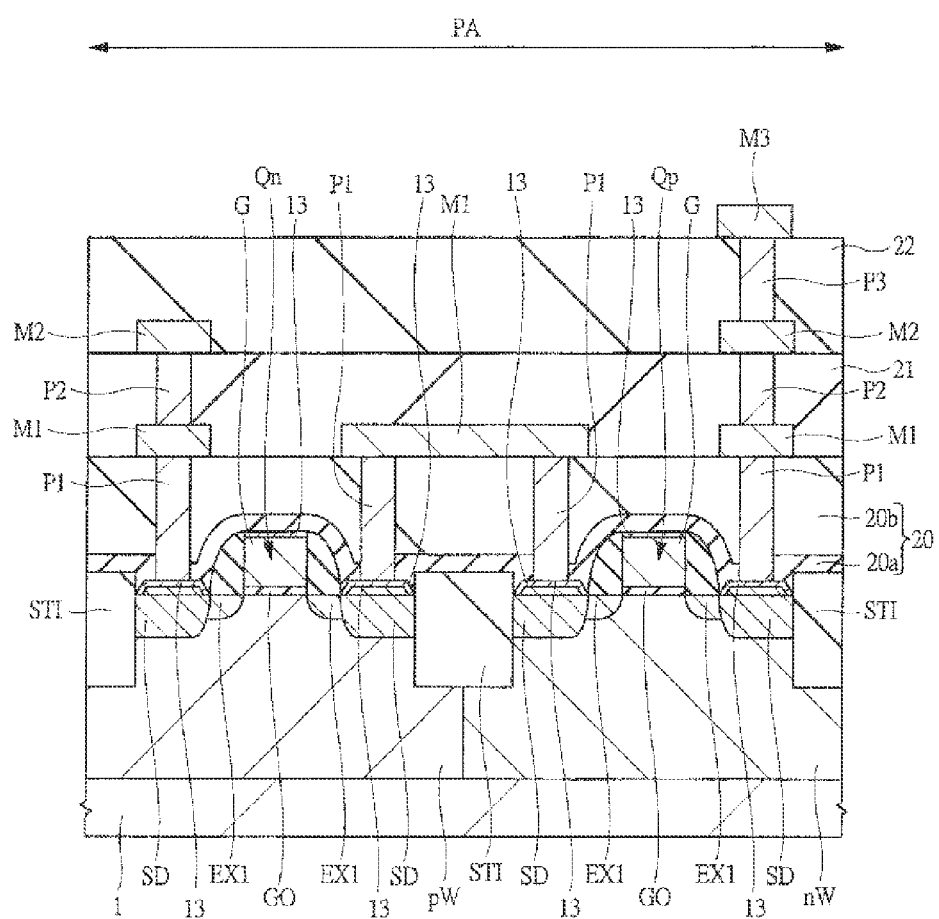
FIG. 18 is a cross-sectional view showing a peripheral circuit area in a semiconductor device of Embodiment 1.

FIG. 18 is a cross-sectional view showing the peripheral circuit area of the semiconductor device of the present embodiment. In the peripheral circuit area PA, MOSFETs (Qn and Qp) forming a logic circuit or the like are formed. Note that the MOSFETs Qn and Qp may also be shown simply as MOSFETs or transistors.

The MOSFETs to be formed are not limited. For example, high-breakdown-voltage MOSFETs each for an I/O (input/output) terminal are formed. In this case, the gate lengths thereof are set larger than those of the transistors included in the memory cells. However, for simpler illustration, the gate length of each of the MISFETs Qn and Qp is shown about equal to the gate length of the transistor (such as, e.g., the transistor Acc1) included in the memory cell in FIG. 18 and the like.

As shown in FIG. 18, the peripheral circuit area PA includes the n-channel MISFET (Qn) and the p-channel MISFET (Qp) which are disposed in the main surface of the supporting substrate 1. Here, the insulating layer BOX and the semiconductor region (element formation region) 3 located thereover have been removed, and the MISFETs (Qn and Qp), i.e., so-called bulk MISFETs are formed in the main surface of the supporting substrate 1.

The n-channel MISFET (Qn) is disposed in the main surface of a p-type well pW formed in the supporting substrate 1, while the p-channel MISFET (Qp) is disposed in the main surface of an n-type well nW formed in the supporting substrate 1

The n-channel MISFET (Qn) has the gate electrode G disposed over the supporting substrate 1 (p-type well pW) via the gate insulating film GO, and the source/drain regions disposed in the supporting substrate 1 (p-type well pW) on both sides of the gate electrode G. Each of the source/drain regions has an LDD configuration, and has the n-type lightly doped impurity region EX1 and the n-type heavily doped impurity region SD.

The p-channel MISFET (Qp) has the gate electrode disposed over the supporting substrate 1 (n-type well nW) via the gate insulating film, and the source/drain regions disposed in the supporting substrate 1 (n-type well nW) on both sides of the gate electrode. Each of the source/drain regions has an LDD configuration, and has the p-type lightly doped impurity region EX1 and the p-type heavily doped impurity region SD.

Over the n-channel MISFET (Qn) and the p-channel MISFET (Qp), in the same manner as in the memory area, the plurality of interconnect layers (M1 to M3) are disposed via interlayer insulating films (20, 21, and 22).

<Manufacturing Steps>
<Transistor Forming Steps>

Next, referring to the cross-sectional views of FIGS. 19 to 46, the manufacturing steps of the semiconductor device of the present embodiment will be described, and also the configurations of the memory area and the peripheral circuit area in the SRAM of the present embodiment will be made clearer. FIGS. 19 to 46 are the cross-sectional views showing the manufacturing steps of the semiconductor device of the present embodiment. The manufacturing steps will be described with reference mainly to the cross sections of the memory cell area MCA, the tap cell area F'A, and the peripheral circuit area PA in the SRAM.

Figure 19:
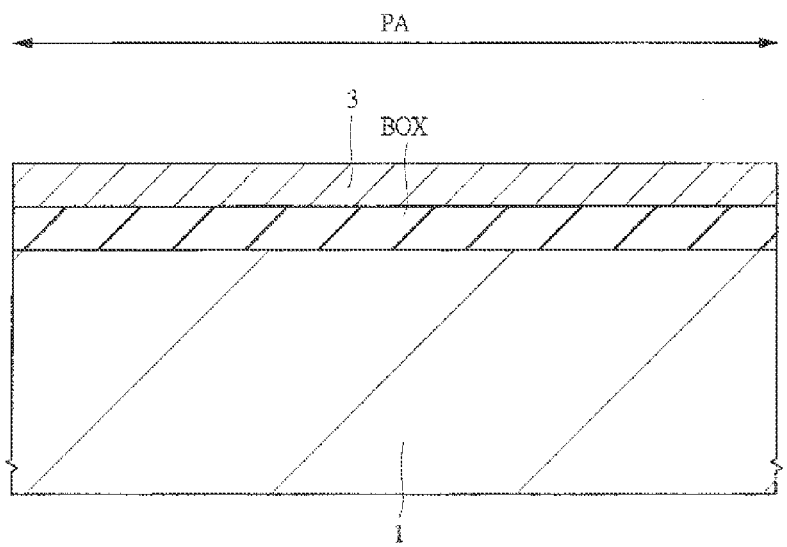
FIG. 19 is a cross-sectional view showing a manufacturing step of the semiconductor device of Embodiment 1.

The SOI substrate shown in FIG. 19 is prepared. As described above, the SOI substrate has the supporting substrate 1, the insulating layer BOX, and the semiconductor region (element formation region) 3 located thereover. The supporting substrate 1 is, e.g., a p-type single-crystal silicon substrate. The insulating layer BOX is, e.g., a silicon oxide film, and the film thickness thereof is, e.g., about 4 to 20 nm. The semiconductor region 3 is, e.g., a single-crystal silicon layer, and the thickness thereof is, e.g., about 4 to 20 nm.

Figure 20:
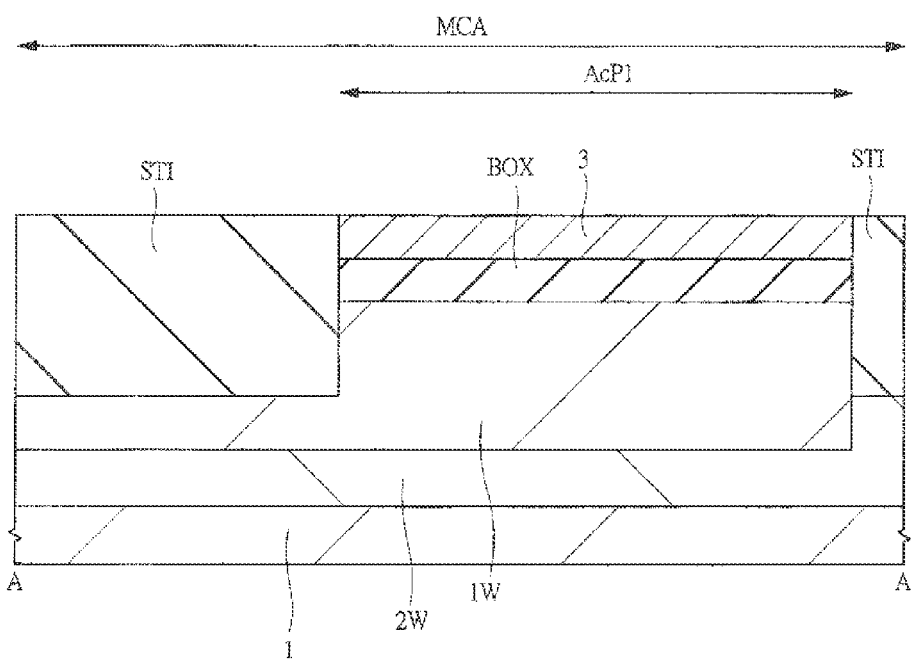
FIG. 20 is a cross-sectional view showing a manufacturing step of the semiconductor device of Embodiment 1.
Figure 21:
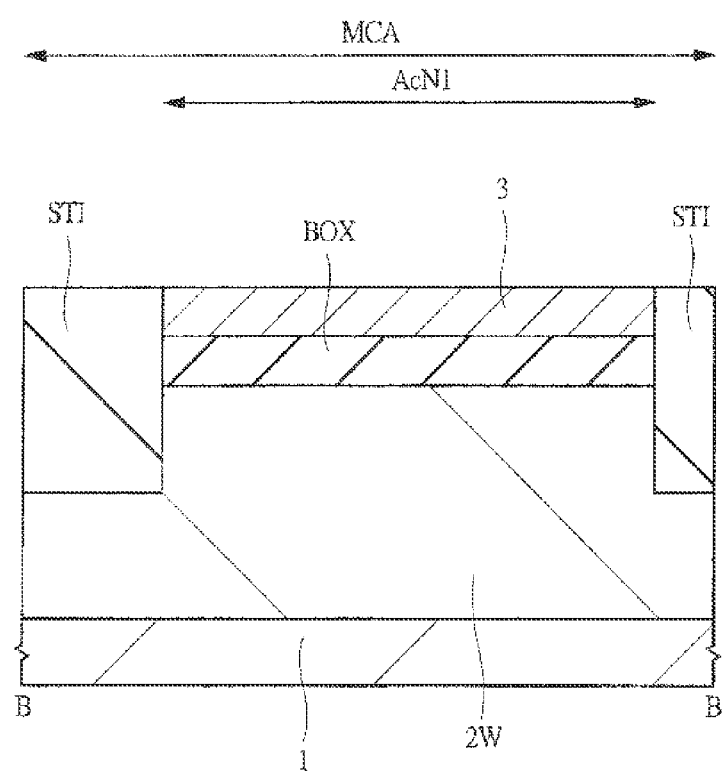
FIG. 21 is a cross-sectional view showing a manufacturing step of the semiconductor device of Embodiment 1.
Figure 22:
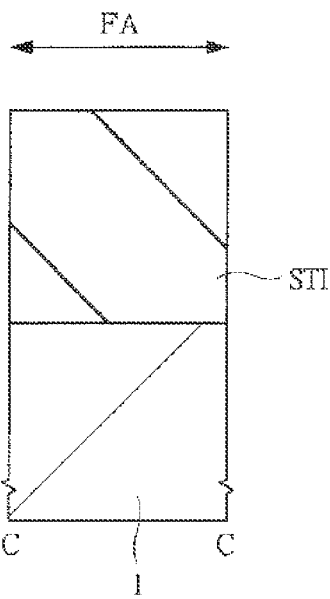
FIG. 22 is a cross-sectional view showing a manufacturing step of the semiconductor device of Embodiment 1.
Figure 23:
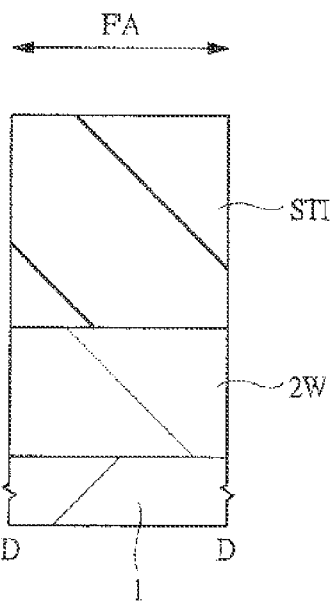
FIG. 23 is a cross-sectional view showing a manufacturing step of the semiconductor device of Embodiment 1.

Then, as shown in FIGS. 20 to 23, in the SOI substrate, the isolation region STI is formed. By the isolation region STI, the active regions (Ac) are defined. Note that, in the regions of the tap cell area F'A where the first plugs P1su and P1w are to be formed, the isolation region STI is formed (FIGS. 22 and 23).

The isolation region STI can be formed using a STI (shallow trench isolation) method. That is, in the SOI substrate, an isolation trench reaching the supporting substrate 1 is formed using a photolithographic technique and an etching technique. Then, an insulating film such as a silicon oxide film is formed over the semiconductor substrate so as to fill the isolation trench. The silicon oxide film is formed using a CVD (Chemical Vapor Deposition) method or the like. Thereafter, by a chemical mechanical polishing method (CMP), the unneeded silicon oxide film formed over the semiconductor substrate is removed. Thus, the isolation region STI can be formed in which only the isolation trench is filled with the silicon oxide film. The thickness of the silicon oxide film (thickness of the isolation region) is in a range of, e.g., about 300 nm to 700 nm.

Then, in the memory cell area MCA, in the supporting substrate 1, the p-type semiconductor region 1W and the n-type semiconductor region 2W are formed (FIGS. 20 and 21). The p-type semiconductor region 1W is formed by using, e.g., an ion implantation method and introducing a p-type impurity into the supporting substrate 1. For example, with an energy of 10 to 100 keV, boron (B) is ion-implanted at a concentration of $1 \times 10^{12}/cm^2$ to $4 \times 10^{14}/cm^2$ to form the p-type semiconductor region 1W. The depth of the p-type semiconductor region 1W is about 10 nm to 500 nm from the bottom portion of the insulating layer BOX. The bottom portion of the p-type semiconductor region 1W is deeper than the bottom portion of the isolation region STI.

The n-type semiconductor region 2W is formed by using, e.g., an ion implantation method and introducing an n-type impurity into the supporting substrate 1. For example, with an energy of 10 to 100 keV, phosphorus (P) is ion-implanted at a concentration of $1 \times 10^{12}/cm^2$ to $4 \times 10^{14}/cm^2$ to form the n-type semiconductor region 2W. The depth of the n-type semiconductor region 2W is about 10 nm to 500 nm from the bottom portion of the insulating layer BOX. At this time, the two semiconductor regions (1W and 2W) are formed such that the bottom portion of the n-type semiconductor region 2W is deeper than the bottom portion of the p-type semiconductor region 1W and the p-type semiconductor regions 1W are dotted over the n-type semiconductor region 2W (see FIGS. 4 to 6 and the like). That is, as described above, the two semiconductor regions (1W and 2W) are formed such that, in the memory area, the generally rectangular p-type semiconductor regions 1W are arranged as an array with the respective predetermined spacings (DX and DY) being provided therebetween in the X-direction and the Y-direction in planar view, and the n-type semiconductor region 2W is indiscretely disposed in a grid-like shape which is continuous in the X-direction and in the Y-direction in the foregoing predetermined spacing (DX and DY) portions in planar view (see FIGS. 4 and 5 and the like). As described above, the n-type semiconductor region 2W is formed deep in the depth direction so as to cover the bottom portion and side portions of the p-type semiconductor region 1W (see FIG. 6 and the like).

It will be appreciated that, in the introduction of the impurities described above, a photoresist mask (mask film) is formed appropriately to inhibit the impurities from being introduced into the region which does not need implantation of the impurities. In the ion implantation, the range is adjusted to allow the impurity regions (well regions) to be formed at desired depths by the subsequent diffusion of the impurities. When it is difficult to effect control by performing ion implantation once, ion implantation may also be performed a plurality of times in which an ion implantation energy is varied. Note that the "range" is defined as an average distance traveled by impurities (ions) which are incident in an implantation target (which is the supporting substrate 1 herein) till the impurities (ions) completely stop in the substance thereof.

At this time, in the region (D-D portion) of the tap cell area F'A where the first plug P1w is to be formed, the n-type semiconductor region 2W is formed (FIG. 23). On the other hand, in the region (C-C portion) of the tap cell area F'A where the first plug P1su is to be formed, the supporting substrate 1 is left as is without forming the p-type semiconductor region 1W and the n-type semiconductor region 2W therein (FIG. 22).

Figure 24:
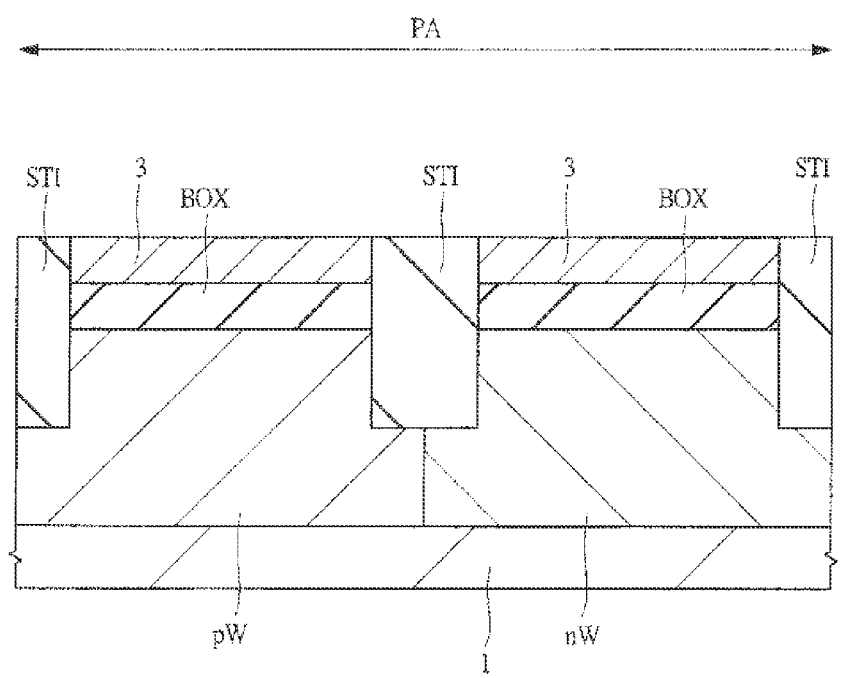
FIG. 24 is a cross-sectional view showing a manufacturing step of the semiconductor device of Embodiment 1.

Next, as shown in FIG. 24, in the peripheral circuit area PA, the p-type well pW and the n-type well nW are formed in the supporting substrate 1. The p-type well pW is formed by using, e.g., an ion implantation method and introducing the p-type impurity (B) into the supporting substrate 1. For example, with an energy of 10 to 100 keV, boron (B) is ion-implanted at a concentration of $1 \times 10^{12}/m^2$ to $4 \times 10^{14}/cm^2$. The n-type well nW is formed by using, e.g., an ion implantation method and introducing the n-type impurity (P or As) into the supporting substrate 1. For example, with an energy of 10 to 100 keV, phosphorus (P) is ion-implanted at a concentration of $1 \times 10^{12}/m^2$ to $4 \times 10^{14}/cm^2$. In the formation of the p-type well pW and the n-type well nW, implantation in which an ion implantation energy is varied is preferably performed a plurality of times.

Note that the order in which the semiconductor regions are formed can be changed appropriately. For example, it may also be possible to form the well regions (nW and pW), and then form the semiconductor regions (1W and 2W). It may also be possible to appropriately implant an impurity for threshold voltage adjustment into the channel region of each of the MISFETs. Such implantation of an impurity is called channel implantation. However, in the memory cell area MCA, it is preferable not to implant an impurity into the semiconductor region 3 such that the channel regions of the transistors are non-doped. An impurity for threshold voltage adjustment may also be implanted into the semiconductor region 3 (region serving as the channels) but, in this case, variations in transistor characteristics due to variations in impurity concentration increase. However, by forming the non-doped channel regions, variations in transistor characteristics can be reduced.

Figure 25:
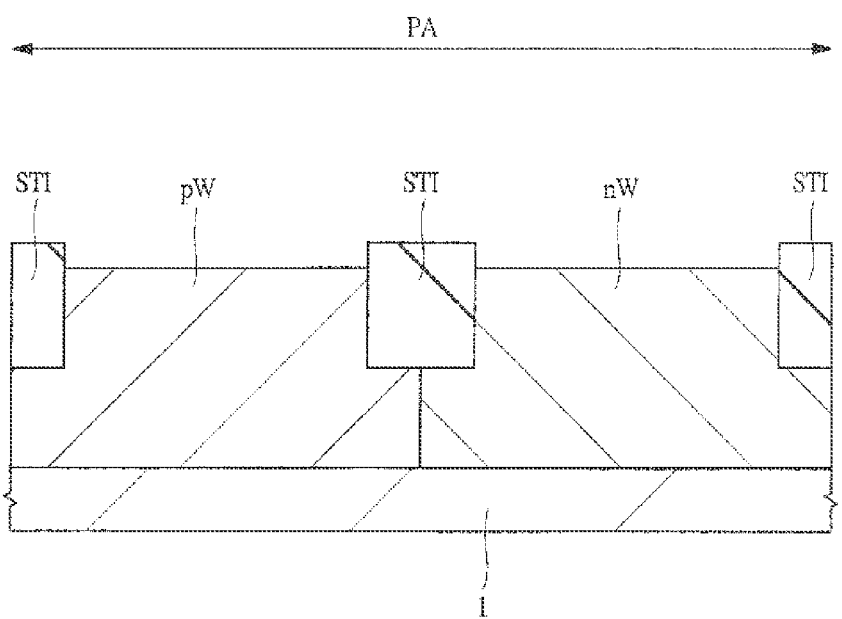
FIG. 25 is a cross-sectional view showing a manufacturing step of the semiconductor device of Embodiment 1.

Next, as shown in FIG. 25, the insulating layer BOX and the semiconductor region 3 which are located over the supporting substrate 1 in the peripheral circuit area PA are removed. For example, the single-crystal silicon layer forming the semiconductor region 3 is removed by dry etching or the like, and the silicon oxide film forming the insulating layer BOX is removed by wet etching or the like. At this time, a level difference is produced between the surface of the isolation region STI and the surface of the supporting substrate 1. The level difference can be reduced by the subsequent etching step, cleaning step, and the like.

Figure 26:
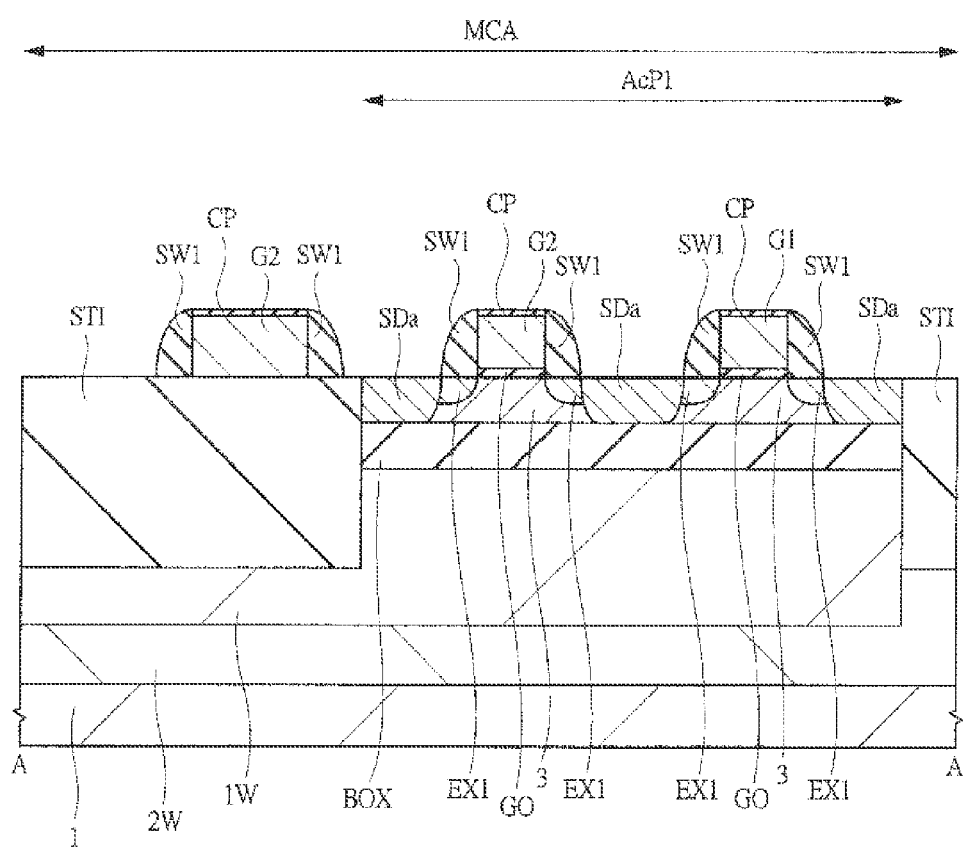
FIG. 26 is a cross-sectional view showing a manufacturing step of the semiconductor device of Embodiment 1.
Figure 27:
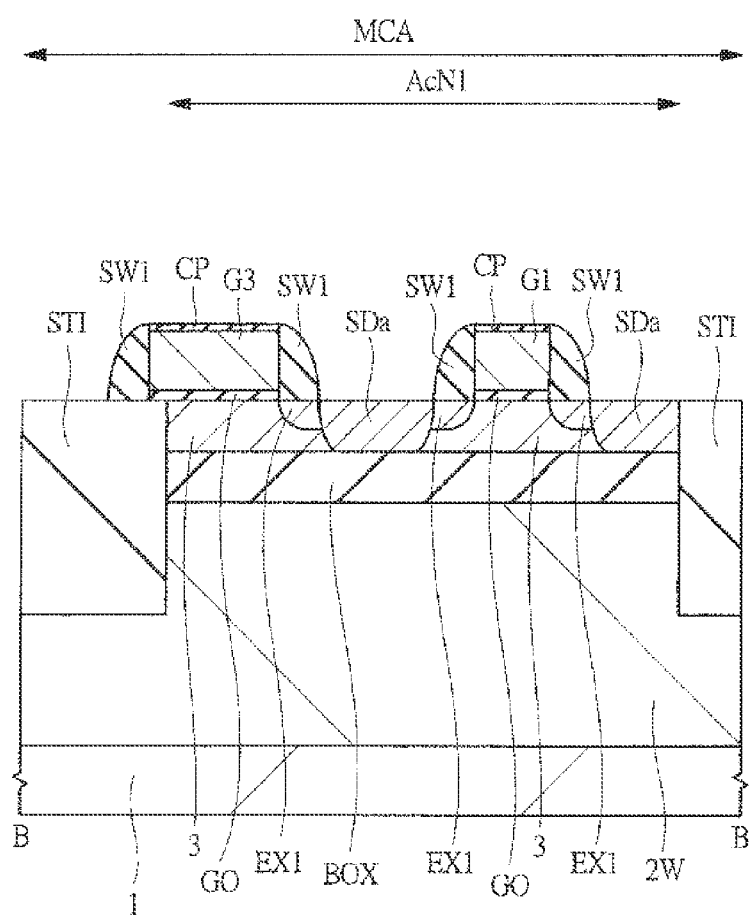
FIG. 27 is a cross-sectional view showing a manufacturing step of the semiconductor device of Embodiment 1.
Figure 28:
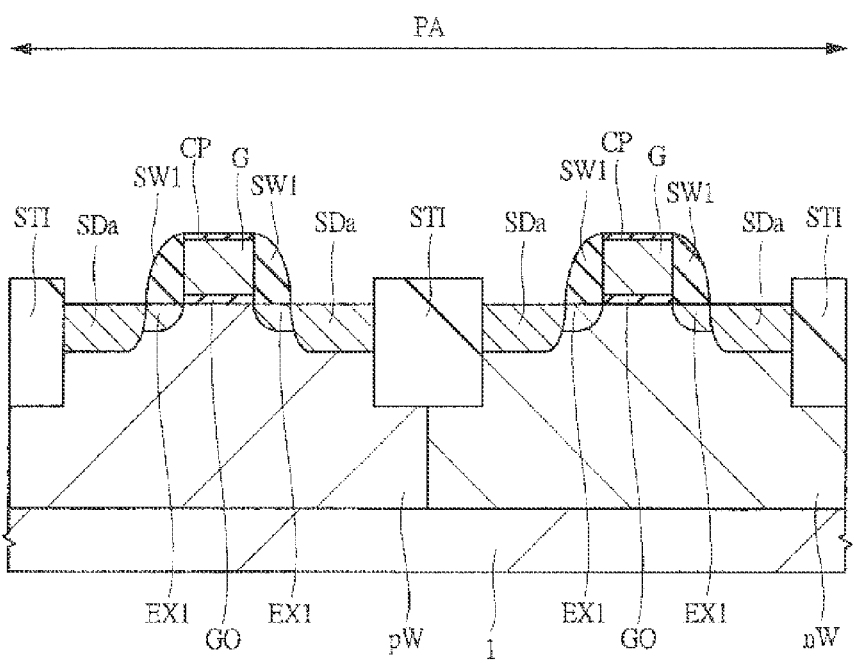
FIG. 28 is a cross-sectional view showing a manufacturing step of the semiconductor device of Embodiment 1.

Next, as shown in FIGS. 26 to 28, each of the transistors (Acc1, Dr1, Lo1, Acc2, Dr2, and Lo2) is formed in the main surface of the semiconductor region 3 in the memory cell area MCA, and each of the transistors (Qn and Qp) is formed in the main surface of the supporting substrate 1 in the peripheral circuit area PA.

First, over the main surface of the active region (Ac) of the memory cell area MCA, the gate insulating film GO is formed. As the gate insulating film GO, e.g., a silicon oxide film or the like can be used. For example, using a thermal oxidation method, a silicon oxide film having a thickness of, e.g., about 1 nm to 3 nm is formed. Note that the silicon oxide film may also be formed using a CVD method. Meanwhile, over the main surface of the active region (Ac) in the peripheral circuit area, the gate insulating film GO is formed. As the gate insulating film OG, e.g., a silicon oxide film or the like can be used. For example, using a thermal oxidation method, a silicon oxide film having a thickness of, e.g., about 10 nm to 20 nm is formed.

Note that, instead of the foregoing silicon oxide film, a silicon oxynitride film may also be used. Alternatively, the gate insulating film GO may also be formed of a high dielectric film (high-k) film. Otherwise, the gate insulating film GO may also be formed of a laminate film of a silicon oxide film and a high dielectric film (high-k film) stacked thereover.

Then, over the gate insulating film GO, the gate electrodes G each made of a conductive film are formed. As each of the gate electrodes G, e.g., a polysilicon film can be used. For example, using a CVD method or the like, a polysilicon film is deposited over the gate insulating film GO to a thickness of, e.g., about 10 nm to 50 nm, and a silicon nitride film having a thickness of about 100 nm to 300 nm is further deposited thereover. Then, the laminate film of the polysilicon film and the silicon nitride film are patterned to form the gate electrodes G. Over the gate electrodes G, cap insulating films CP each made of an insulating film such as a silicon nitride film remain.

Note that, as each of the gate electrodes G, a metal film may also be used. The gate electrode G may also be formed of a laminate film of a metal film and a polysilicon film stacked thereover. Thus, a so-called metal gate structure may also be used in which metal (including a compound having a metallic conductivity) is used as the gate electrode. Note that the gate lengths of the gate electrodes G in the memory cell area MCA are, e.g., about 60 to 80 nm, and the gate lengths of the gate electrodes G in the peripheral circuit area PA are, e.g., about 100 to 120 nm.

Then, in the active regions AcP1 and AcP2 and the p-type well pW on both sides of the gate electrodes G, the n-type lightly doped impurity regions EX1 are formed. The n-type lightly doped impurity regions EX1 are formed by using the gate electrodes G (including the cap insulating films CP remaining thereover) as a mask and introducing an n-type impurity into the active regions (AcP1, AcP2, and pW) by an ion implantation method. On the other hand, in the active regions AcN1 and AcN2 and the n-type well nW on both sides of the gate electrodes G, the p-type lightly doped impurity regions EX1 are formed. The p-type lightly doped impurity regions EX1 are formed by using the gate electrodes G as a mask and introducing a p-type impurity into the active regions (AcN1, AcN2, and pW) by an ion implantation method.

Then, over the both side walls of the gate electrodes G, sidewall films SW1 are formed. For example, an insulating film made of a laminate film of a silicon oxide film and a silicon nitride film stacked thereover is deposited over the gate electrodes G by a CVD method, and then subjected to anisotropic etching to be left as the sidewall films SW1 over the side walls of the gate electrodes G.

Then, in the active regions (AcP1, AcP2, and pW) on both sides of the composites of the gate electrodes G and the sidewall films SW1, n-type heavily doped impurity regions SDa are formed. For example, with an energy of 2 keV, arsenic (As) is ion-implanted at a concentration of $2 \times 10^{14}/\text{cm}^2$ to $8 \times 10^{14}/\text{cm}^2$ to form the n-type heavily doped impurity regions SDa.

Then, in the active regions (AcN1, AcN2, and nW) on both sides of the composites of the gate electrodes G and the sidewall films SW1, the p-type heavily doped impurity regions SDa are formed. For example, with an energy of 0.5 keV, boron (B) is ion-implanted at a concentration of $2 \times 10^{14}/\text{cm}^2$ to $8 \times 10^{14}/\text{cm}^2$ to form the p-type heavily doped impurity regions SDa.

Figure 29:
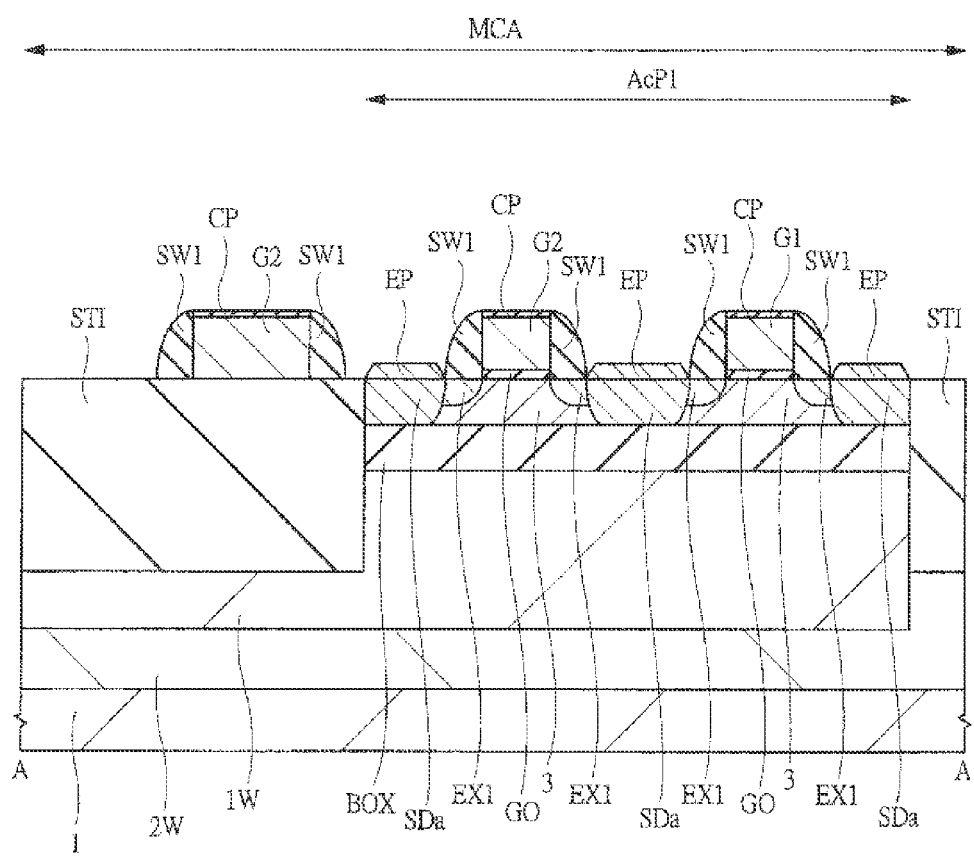
FIG. 29 is a cross-sectional view showing a manufacturing step of the semiconductor device of Embodiment 1.
Figure 30:
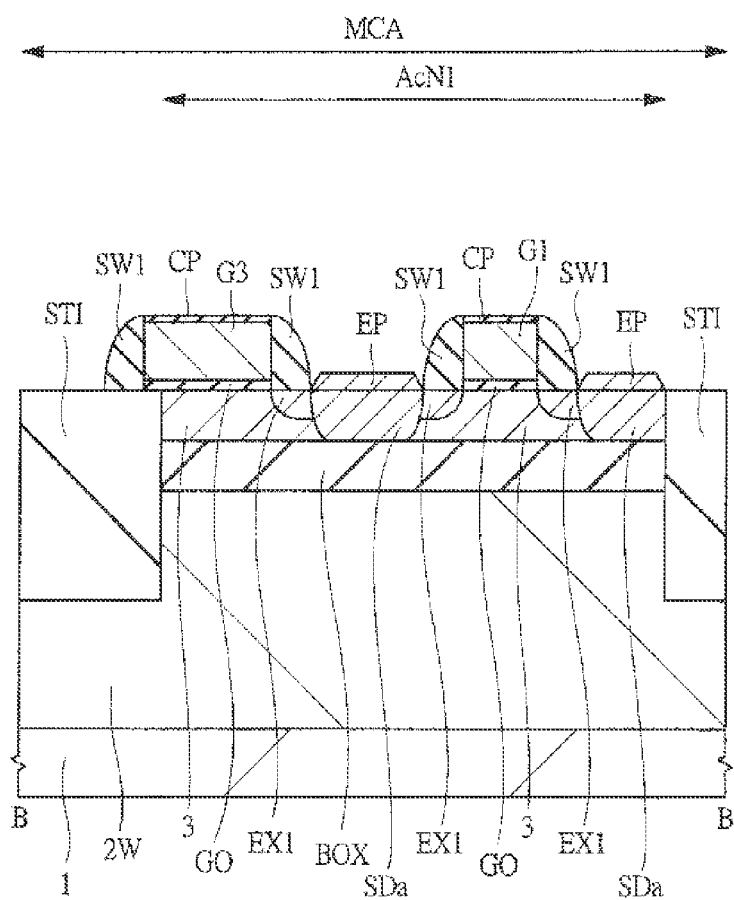
FIG. 30 is a cross-sectional view showing a manufacturing step of the semiconductor device of Embodiment 1.
Figure 31:
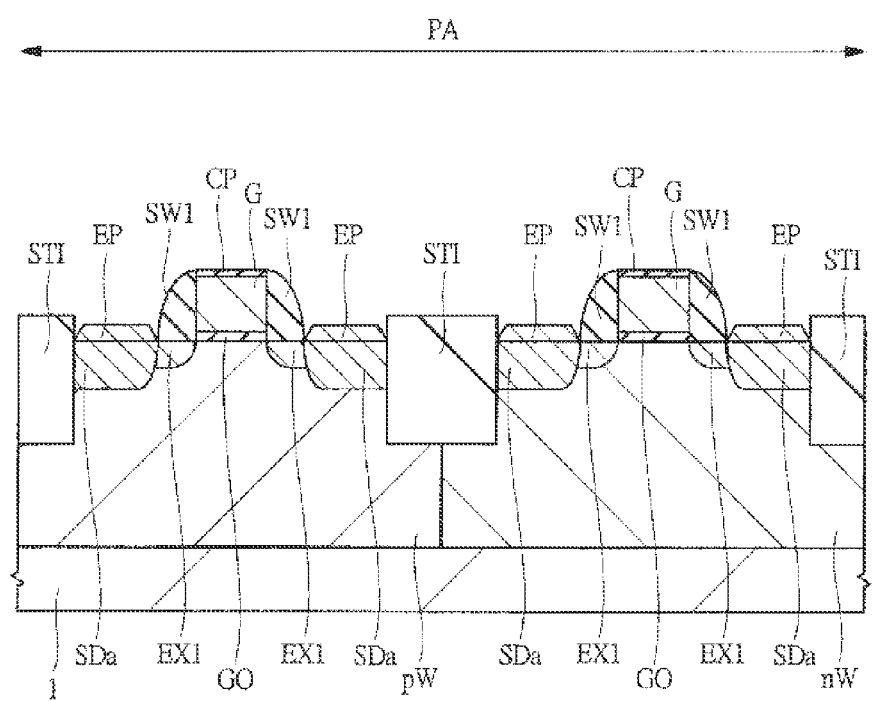
FIG. 31 is a cross-sectional view showing a manufacturing step of the semiconductor device of Embodiment 1.

Next, as shown in FIGS. 29 to 31, over the active regions (AcP1, AcP2, AcN1, AcN2, pW, and nW) on both sides of the composites of the gate electrodes G and the sidewall films SW1, i.e., over the heavily doped impurity regions SDa, semiconductor regions EP having film thicknesses of about 20 to 60 nm are formed by epitaxial growth. At this time, since the gate electrodes G are covered with the cap insulating films CP remaining thereover, the semiconductor regions EP are not epitaxially grown over the gate electrodes G. Thereafter, the cap insulating films CP over the gate electrodes G are removed by wet etching or the like, and the sidewall films SW1 are further removed by wet etching or the like.

Figure 32:
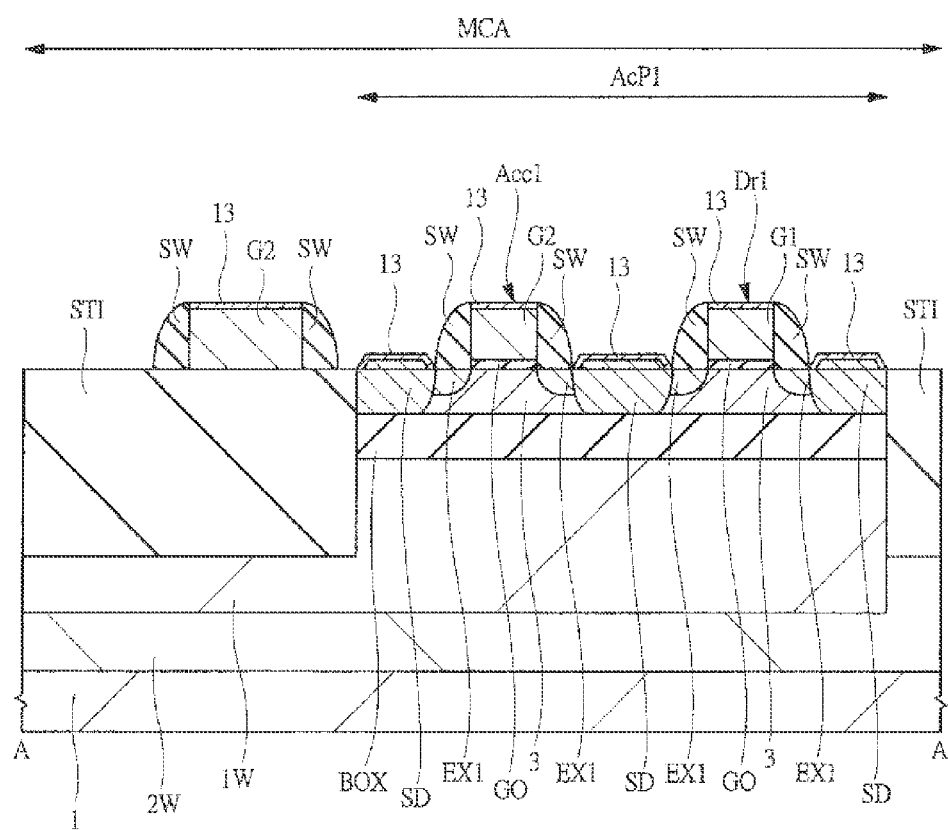
FIG. 32 is a cross-sectional view showing a manufacturing step of the semiconductor device of Embodiment 1.
Figure 33:
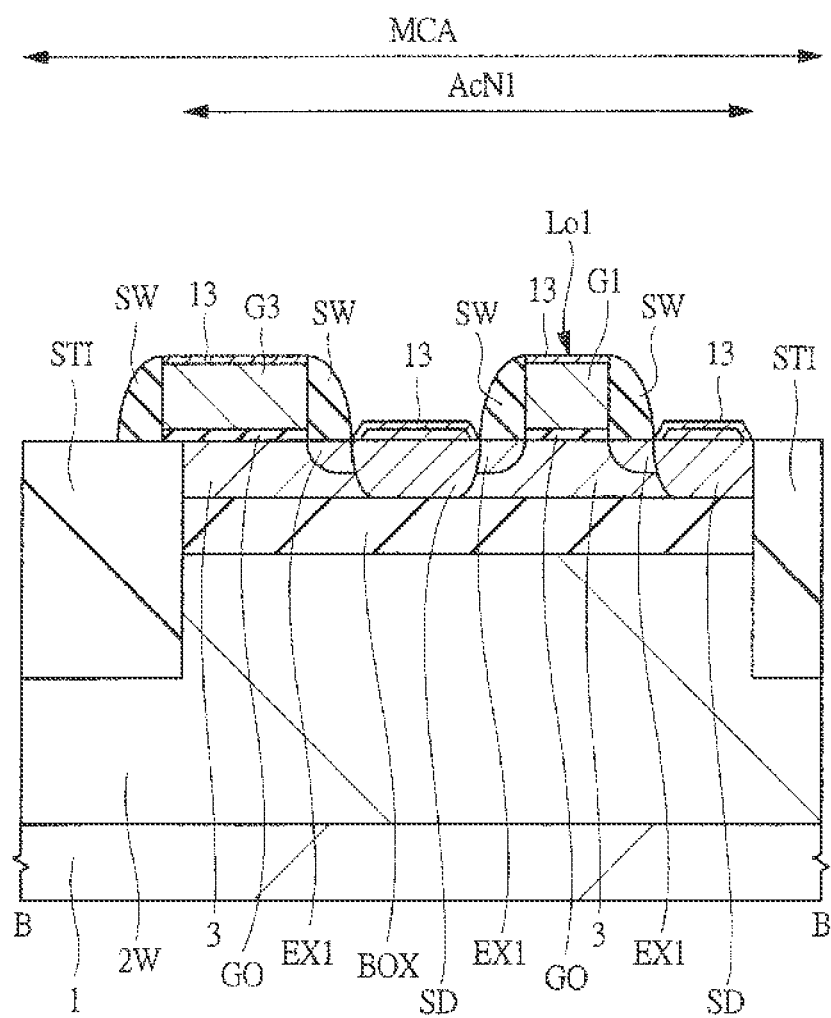
FIG. 33 is a cross-sectional view showing a manufacturing step of the semiconductor device of Embodiment 1.
Figure 34:
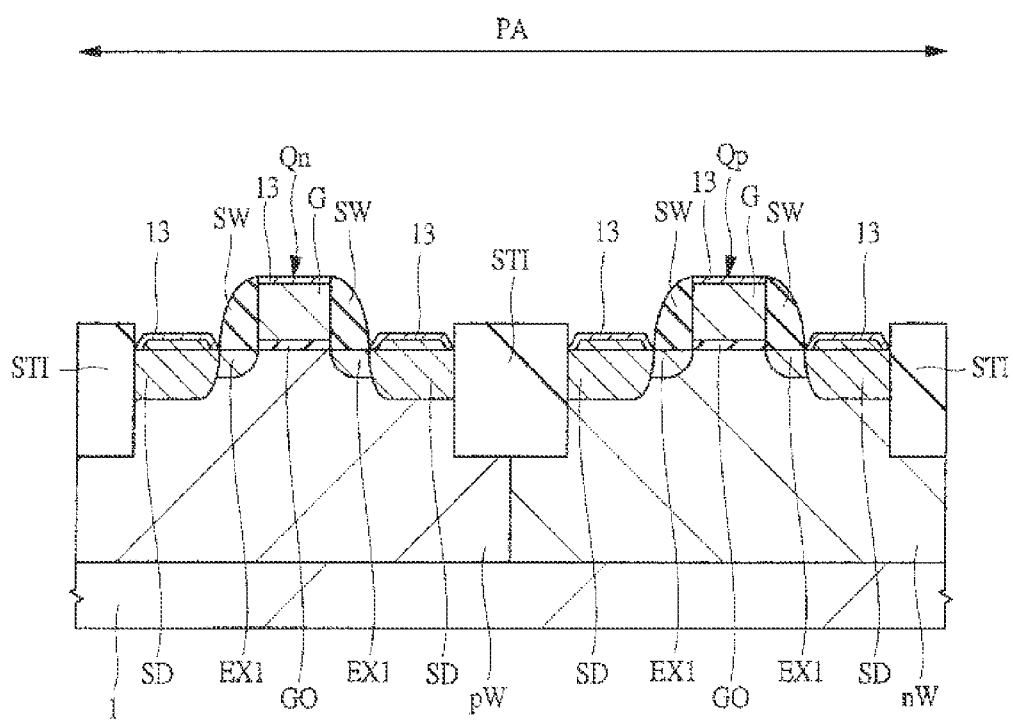
FIG. 34 is a cross-sectional view showing a manufacturing step of the semiconductor device of Embodiment 1.

Next, as shown in FIGS. 32 to 34, over the both side walls of the gate electrodes G, sidewalls are newly formed. The sidewalls are denoted by SW. For example, an insulating film made of a laminate film of a silicon oxide film and a silicon nitride film stacked thereover is deposited over the gate electrodes G by a CVD method, and then subjected to anisotropic etching to be left as the sidewall films SW over the side walls of the gate electrodes G.

Then, in the active regions (AcP1, AcP2, and pW) on both sides of the composites of the gate electrodes G and the sidewall films SW and in the semiconductor regions EP, the n-type heavily doped impurity regions SD are formed. For example, with an energy of 20 keV, arsenic (As) is ion-implanted at a concentration of about $4 \times 10^{15}/\text{cm}^2$ to form the n-type heavily doped impurity regions SD. Note that, with an energy of, e.g., 10 keV, additional implantation of arsenic (As) at a concentration of about $2 \times 10^{15}/\text{cm}^2$ may also be performed.

Then, in the active regions (AcN1, AcN2, and nW) on both sides of the composites of the gate electrodes G and the sidewall films SW and in the semiconductor regions EP, the p-type heavily doped impurity regions SD are formed. For example, with an energy of 2 keV, boron (B) is ion-implanted at a concentration of about $4 \times 10^{15}/\text{cm}^2$ to form the p-type heavily doped impurity regions SD. Note that, with an energy of, e.g., 1 keV, additional implantation of boron (B) at a concentration of about $2 \times 10^{15}/\text{cm}^2$ may also be performed.

Note that, here, the semiconductor regions (EP) formed by epitaxial growth and the heavily doped impurity regions in the semiconductor region 3 are collectively denoted by "SD".

By the foregoing steps, the six transistors (Dr1, Acc1, Lo1, Lo2, Acc2, and Dr2) in the memory cell area MCA and the MISFETs (Qn and Qp) in the peripheral circuit area PA are generally completed.

Then, over the gate electrodes G and the source/drain regions (SD), by a salicide (Self Aligned Silicide) technique, the metal silicide layers 13 are formed. For example, by forming metal films such as nickel (Ni) films over the transistors and performing heat treatment thereon, a silicidation reaction is caused in contact regions between the gate electrodes G and the Ni films and between the source/drain regions (SD) and the Ni films. Thereafter, the unreacted Ni films are removed to form nickel silicide films.

<Steps of Forming First Plugs>

Next, as shown in FIGS. 35 to 46, the first plugs (P1$a$ to P1$h$, SP1$s$, SP1$w$, P1$su$, and P1$w$) are formed over the source/drain regions (SD) of the individual transistors (Dr1, Acc1, Lo1, Lo2, Acc2, and Dr2).

Figure 35:
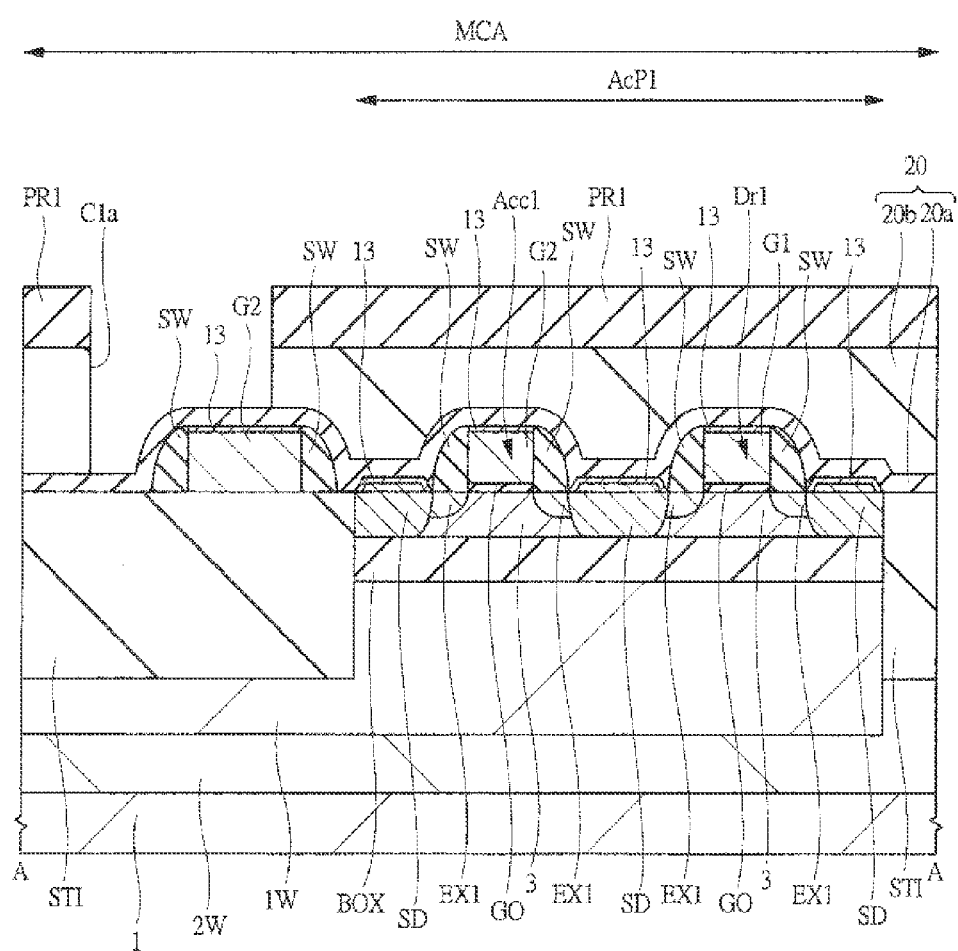
FIG. 35 is a cross-sectional view showing a manufacturing step of the semiconductor device of Embodiment 1.

First, as shown in FIG. 35 and the like, over each of the transistors (Dr1, Acc1, Lo1, Qn, Qp, and the like), a laminate film of a silicon nitride film 20$a$ and a silicon oxide film 20$b$ is formed as the interlayer insulating film 20. The silicon nitride film 20$a$ functions as an etching stopper when the silicon oxide film 20$b$ is etched, and is formed thinner than the silicon oxide film 20$b$.

Figure 36:
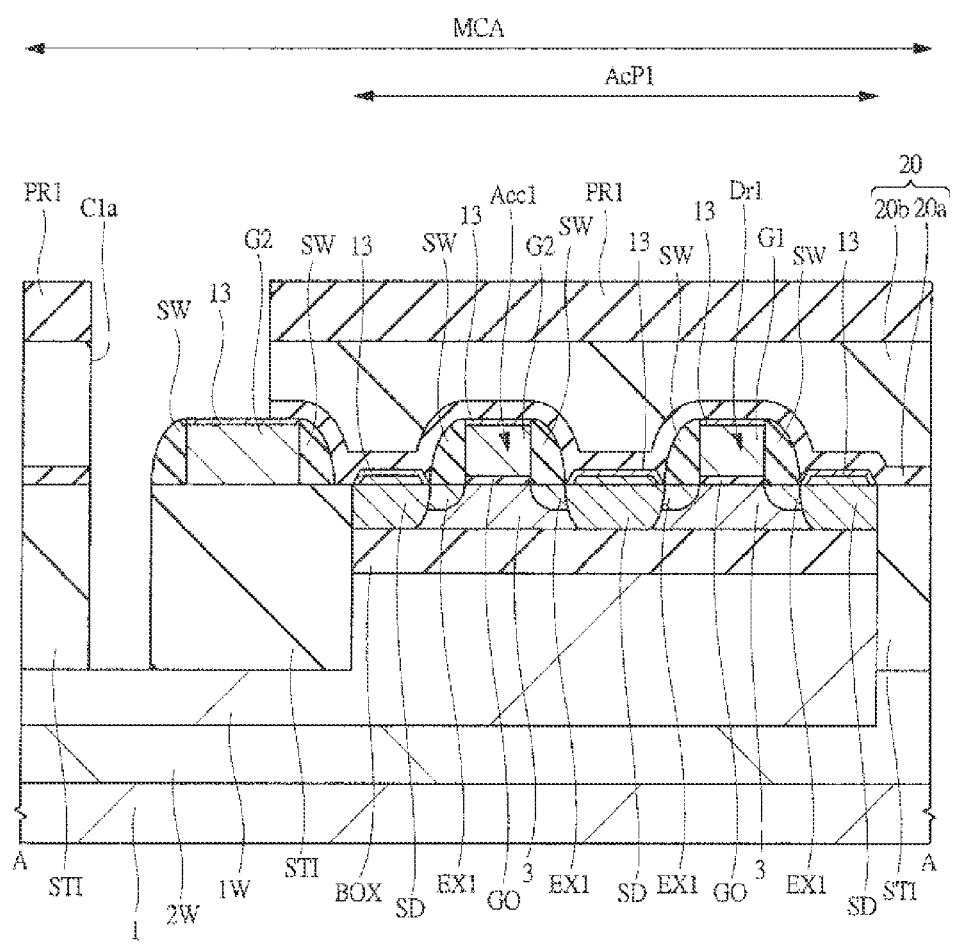
FIG. 36 is a cross-sectional view showing a manufacturing step of the semiconductor device of Embodiment 1.
Figure 37:
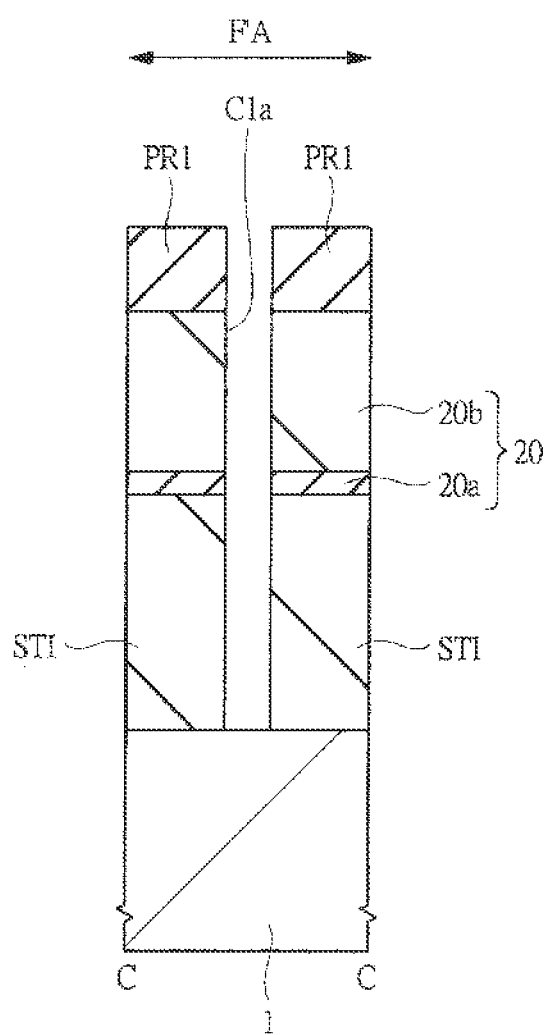
FIG. 37 is a cross-sectional view showing a manufacturing step of the semiconductor device of Embodiment 1.
Figure 38:
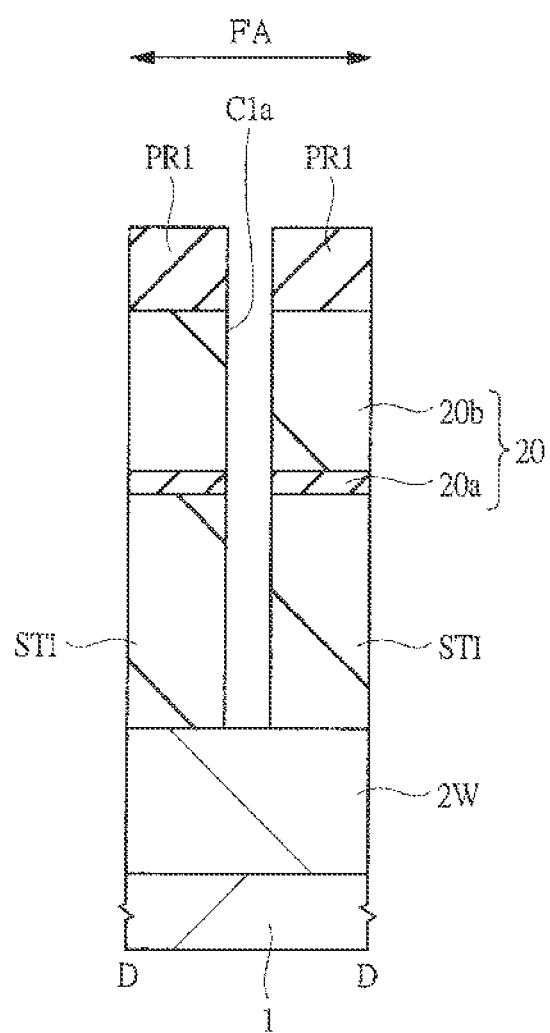
FIG. 38 is a cross-sectional view showing a manufacturing step of the semiconductor device of Embodiment 1.

Next, as shown in FIG. 35, over the interlayer insulating film 20, a photoresist film PR1 is formed and subjected to exposure/development treatment (photolithography) to open a region where the first plug (SP1$w$) is to be formed. Then, using the photoresist film PR1 as a mask, the silicon oxide film 20$b$ is etched till the silicon nitride film 20$a$ is exposed. Next, as shown in FIG. 36, the exposed silicon nitride film 20$a$ is etched, and then the isolation region STI located thereunder is also etched till the p-type semiconductor region 1W is exposed. By this step, a deep contact hole (coupling hole) C1$a$ extending through the interlayer insulating film 20 and the isolation region STI can be formed (FIG. 36). At this time, the regions where the plugs P1$a$ to P1$h$ and SP1$s$, which are shallow first plugs among the first plugs P1, are to be formed are covered with the photoresist film PR1 not to be etched. On the other hand, in each of the regions of the tap cell area F'A where the plugs P1$su$ and P1$w$, which are deep first plugs among the first plugs P1, are to be formed, the deep contact hole C1$a$ extending through the interlayer insulating film 20 and the isolation region STI is formed in the same manner as in the region where the plug SP1$w$ is formed (FIGS. 37 and 38).

Figure 39:
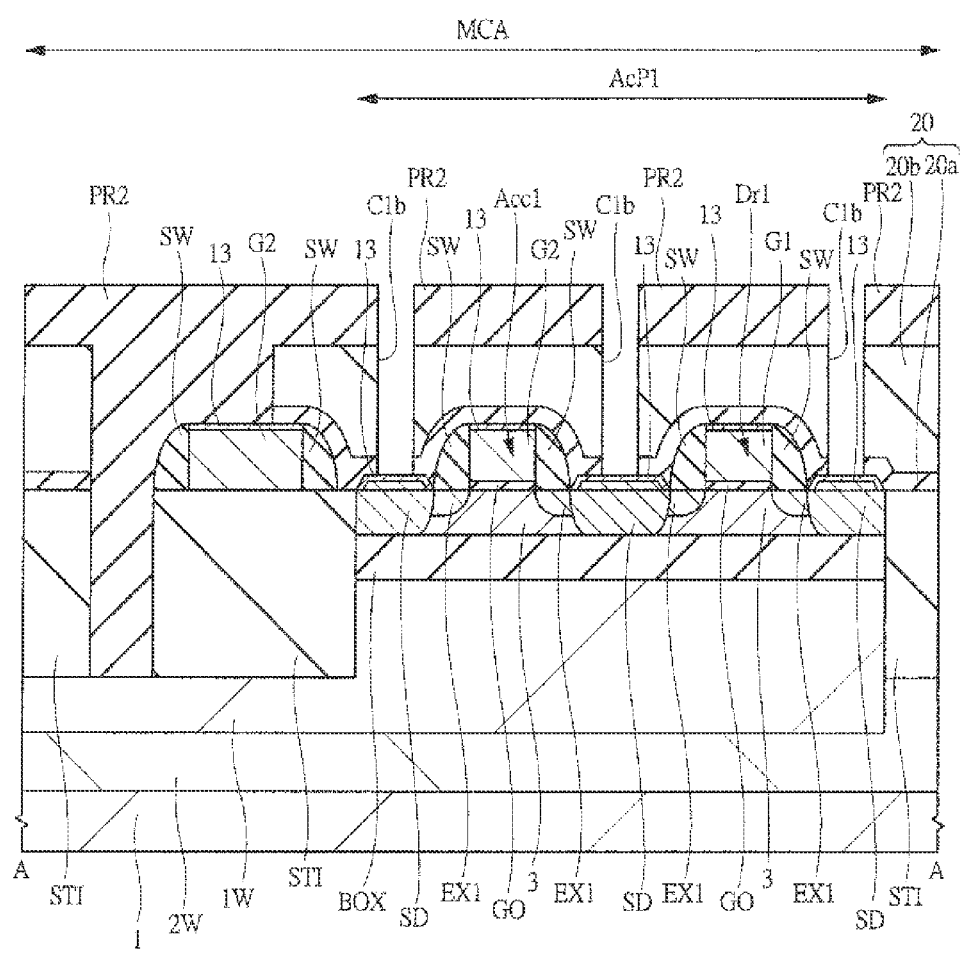
FIG. 39 is a cross-sectional view showing a manufacturing step of the semiconductor device of Embodiment 1.
Figure 40:
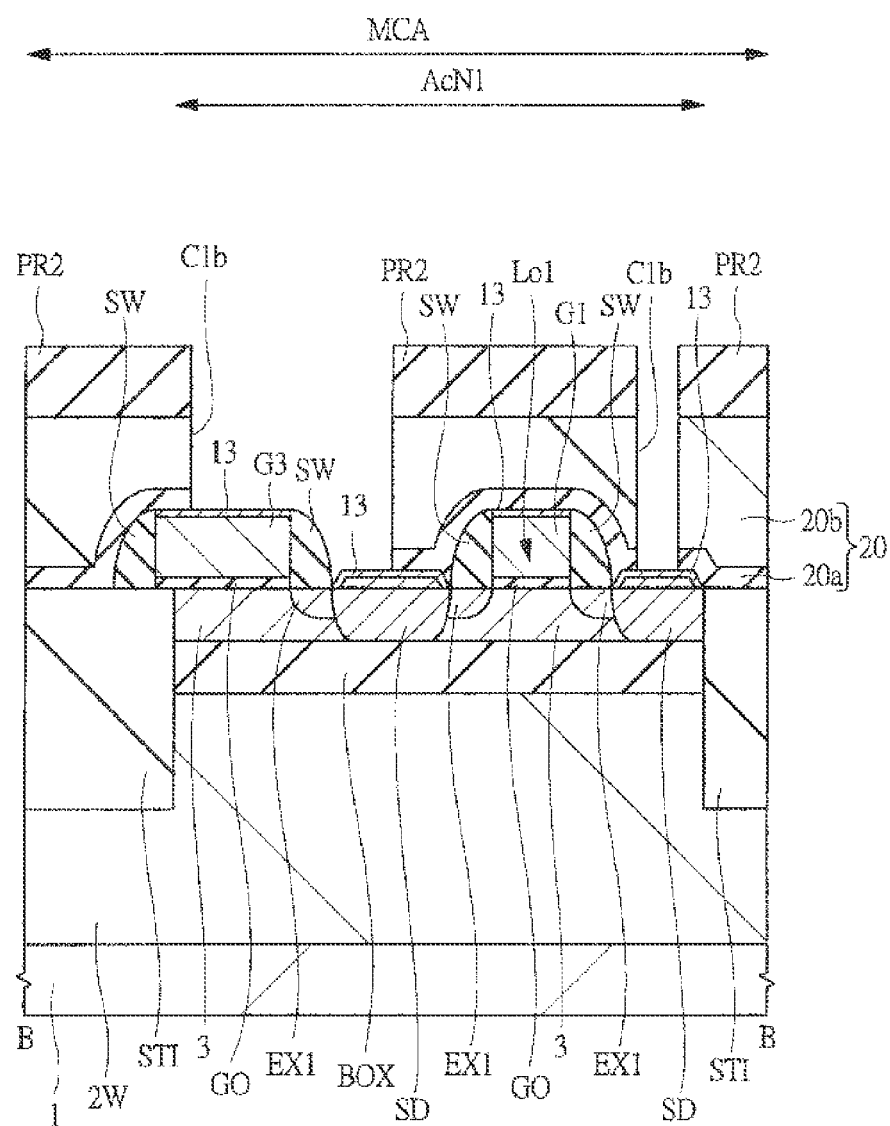
FIG. 40 is a cross-sectional view showing a manufacturing step of the semiconductor device of Embodiment 1.
Figure 41:
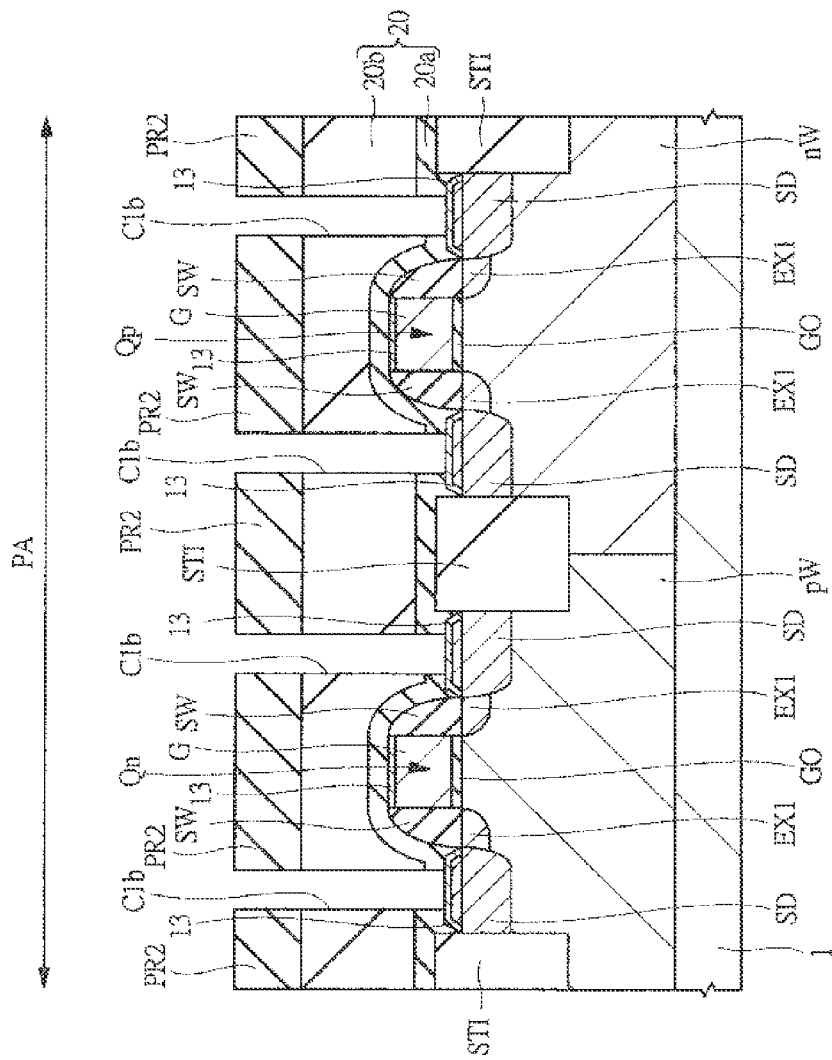
FIG. 41 is a cross-sectional view showing a manufacturing step of the semiconductor device of Embodiment 1.
Figure 42:
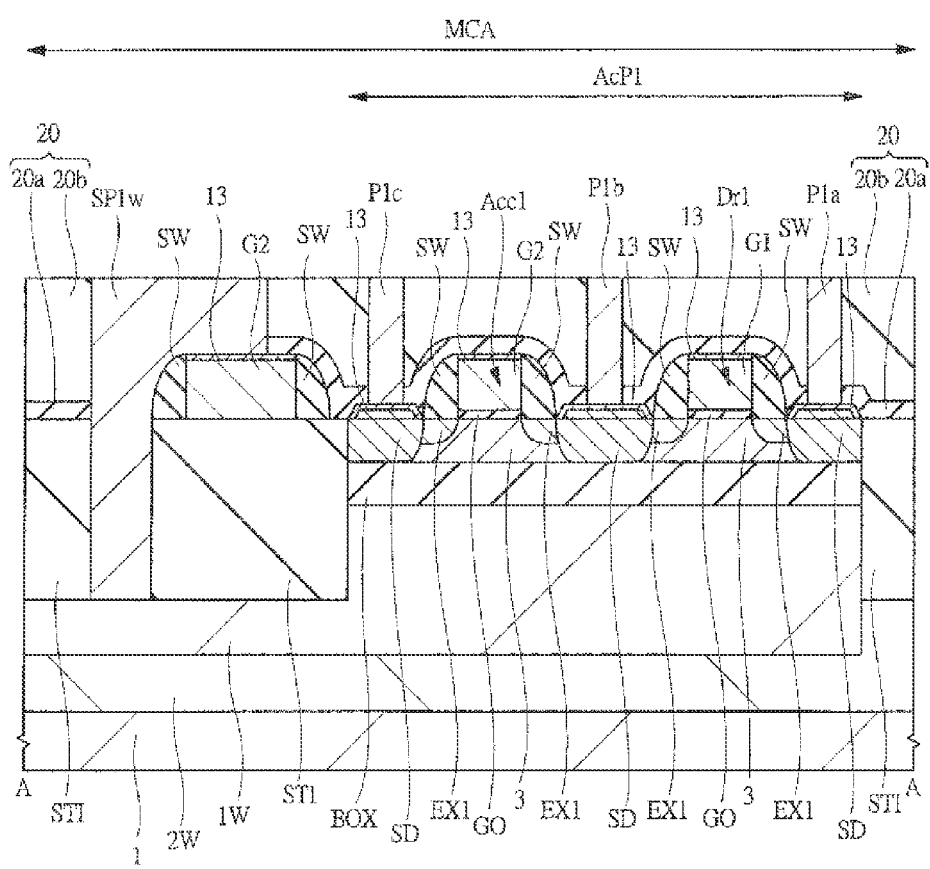
FIG. 42 is a cross-sectional view showing a manufacturing step of the semiconductor device of Embodiment 1.
Figure 43:
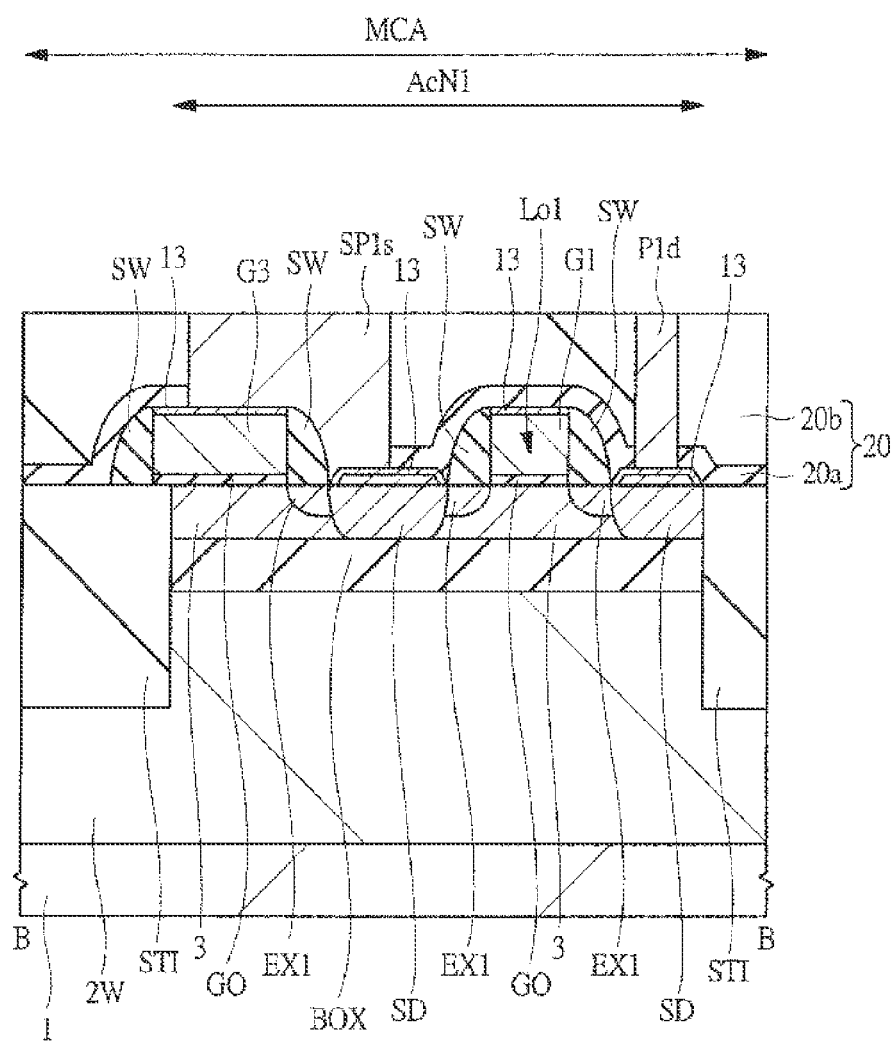
FIG. 43 is a cross-sectional view showing a manufacturing step of the semiconductor device of Embodiment 1.
Figure 44:
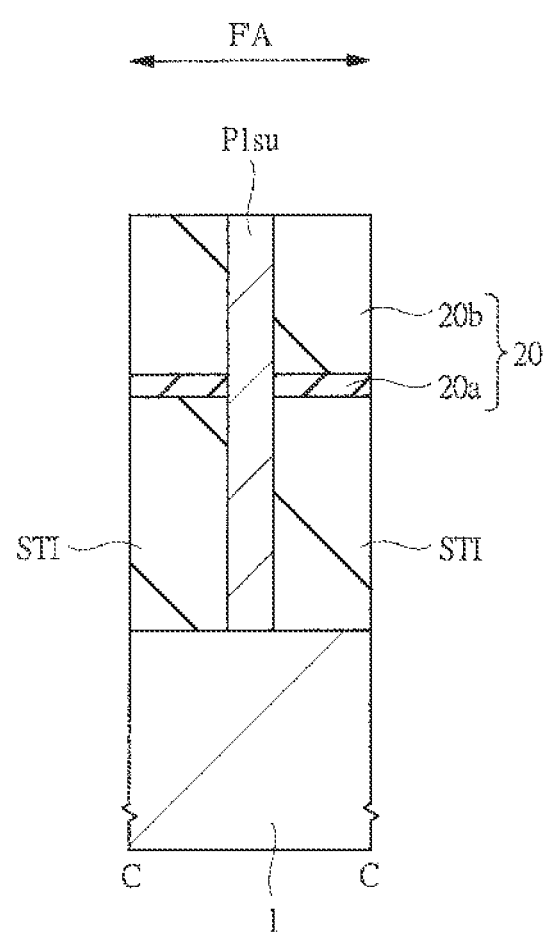
FIG. 44 is a cross-sectional view showing a manufacturing step of the semiconductor device of Embodiment 1.
Figure 45:
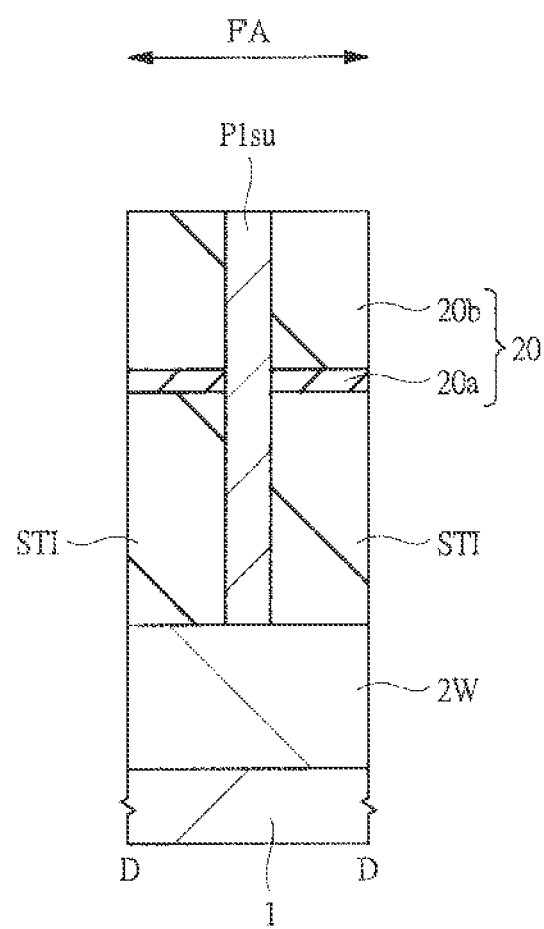
FIG. 45 is a cross-sectional view showing a manufacturing step of the semiconductor device of Embodiment 1.
Figure 46:
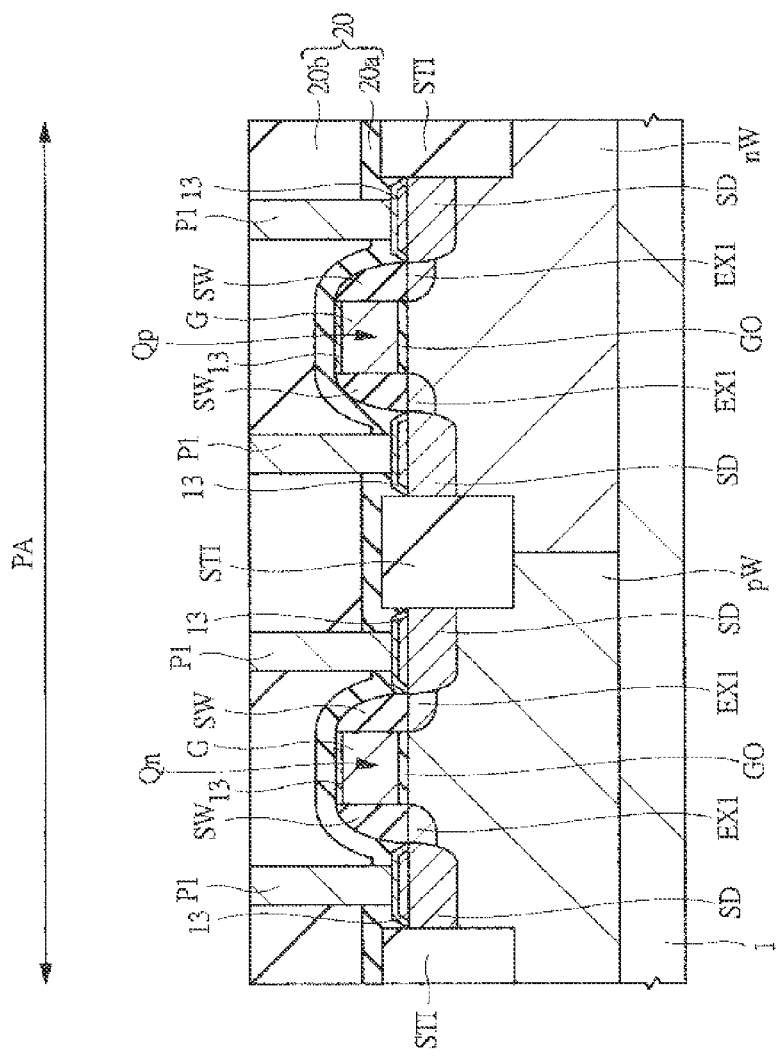
FIG. 46 is a cross-sectional view showing a manufacturing step of the semiconductor device of Embodiment 1.

Then, the photoresist film PR1 is removed by asking or the like. Subsequently, as shown in FIGS. 39 to 41, a photoresist film PR2 is formed over the interlayer insulating film 20 and subjected to exposure/development treatment to open the regions where the shallow first plugs (P1$a$ to P1$h$ and SP1$s$) are to be formed. At this time, the regions of the peripheral circuit area PA where the first plugs P1 are to be formed are also opened. Also, at this time, each of the deep contact holes C1a is filled with the photoresist film PR2.

Then, using the photoresist film PR2 as a mask, the silicon oxide film 20b is etched till the silicon nitride film 20a is exposed. Then, the exposed silicon nitride film 20a is etched to form shallow contact holes (coupling holes) C1b in the interlayer insulating film 20.

By thus forming the contact holes (C1a and C1b) at different depths in different process steps, the contact holes can be formed accurately to allow excellent contact to be achieved.

Then, the photoresist film PR2 is removed by asking or the like. Subsequently, as shown in FIGS. 42 to 46, the conductive film is deposited over the interlayer insulating film 20 including the insides of the contact holes C1a and C1b. As the conductive film, a laminate film of a barrier film (not shown) and a metal film can be used. As the barrier film, e.g., a Ti (titanium) film, a TiN (titanium nitride) film, or a laminate film thereof can be used. As the metal film, e.g., a W (tungsten) film or the like can be used. Of the deposited conductive film, the portion other than the portions in the contact holes is removed by using a CMP method or the like to fill each of the contact holes C1a and C1b with the conductive film and form the first plugs P1. The shallow first plugs (the plugs P1a to P1h and SP1s, and the plugs P1 in the peripheral circuit area PA) are formed to extend through the interlayer insulating film 20. The deep first plugs (SP1w, P1su, and P1w) are formed to extend through the interlayer insulating film 20 and the isolation region STI (FIGS. 42 to 46).

<Steps of Forming Interconnect Wires>

Then, over the plugs P1, the first-layer interconnect wires M1 to the third-layer interconnect wires M3 are formed. The first-layer interconnect wires M1 can be formed by patterning a conductive film of Al (aluminum) or the like. Subsequently, the interlayer insulating film 21 is formed over the first-layer interconnect wires M1 and, after the second plugs P2 are formed, a conductive film is patterned to form the second-layer interconnect wires M2. Further, over the second-layer interconnect wires M2, the interlayer insulating film 22 is formed to form the third plugs P3. Thereafter, the conductive film is patterned to form the third-layer interconnect wires M3 (see FIGS. 10, 11, and 18).

Note that the first-layer interconnect wires M1 to the third-layer interconnect wires M3 can also be formed as embedded wires (damascene wires). Hereinbelow, a brief description will be given to the forming steps when the damascene wires are formed.

The first-layer interconnect wires M1 are formed by filling, with the conductive film, each of interconnect trenches formed in an interconnect trench insulating film over the interlayer insulating film 20. For example, over the insulating film for trench formation including the insides (bottom portions and side walls) of the interconnect trenches, a barrier conductor film (e.g., a titanium nitride film) is formed, and a copper seed layer is further formed thereover by a CVD method, a sputtering method, or the like. Thereafter, using an electrolytic plating method or the like, a copper plating film is grown over the seed layer to fill the interconnect trenches with the copper plating film. Subsequently, the copper plating film, the seed layer, and the barrier conductor film in the region other than in the interconnect trenches are removed by a CMP method, while the copper plating film, the seed layer, and the barrier conductor film are left in the trenches to form the first-layer interconnect wires M1 using copper as a main conductive material. Thus, a method in which wires are formed by filling each of the interconnect trenches with the conductive film is called a damascene method. In particular, a method in which the plugs and the wires (conductive film) are formed in different steps is called a single damascene method. On the other hand, a method in which the contact holes and the trenches are simultaneously filled with the conductive film to form the plugs and the wires (conductive film) at a time, such as the method of forming the second-layer interconnect wires M2 described later, is called a dual damascene method.

Then, over the insulating film for trench formation in which the first-layer interconnect wires M1 are embedded, an insulating film and an insulating film for trench formation are formed and, using the dual damascene method, the second plugs P2 and the second-layer interconnect wires M2 are formed. For example, the insulating film and the insulating film for trench formation are patterned to form interconnect trenches and contact holes. Subsequently, in the interconnect trenches and the contact holes, a barrier conductor film and a copper seed layer are formed, and a copper plating film is further formed. Then, the copper plating film, the seed layer, and the barrier conductor film in the region other than in the interconnect trenches and the contact holes are removed by a CMP method. In this manner, the second plugs P2 and the second-layer interconnect wires M2 can be formed.

Then, similarly to the second plugs P2 and the second-layer interconnect wires M2, using the dual damascene method, the third plugs P3 and the third-layer interconnect wires M3 are formed.

Embodiment 2

In Embodiment 1, the contact holes (C1a and C1b) at different depths are formed in the different steps, and the shallow first plugs (the plugs P1a to P1h and SP1s, and the plugs P1 in the peripheral circuit area PA) and the deep first plugs (SP1w, P1su, and P1w) are formed. By contrast, in the present embodiment, coupling areas (opening areas) CA to the p-type semiconductor regions 1W are formed in advance in the regions where the first plugs SP1w and the like are formed to reduce the difference between the depths of contact holes C1 for the first plugs P1 and form the contact holes C1 in the same process step.

Embodiment 2 is the same as Embodiment 1 except in the structure of coupling between each of the first plugs (SP1w, P1su, and P1w) and the p-type semiconductor region 1W. Accordingly, a detailed description will be given to the structures of the first plugs (SP1w, P1su, and P1w) and the p-type semiconductor region 1W in the vicinity thereof and the manufacturing steps thereof.

FIGS. 47 to 50 are a plan view and cross-sectional views each showing a configuration of the memory cell area in the SRAM of the present embodiment.

Figure 47:
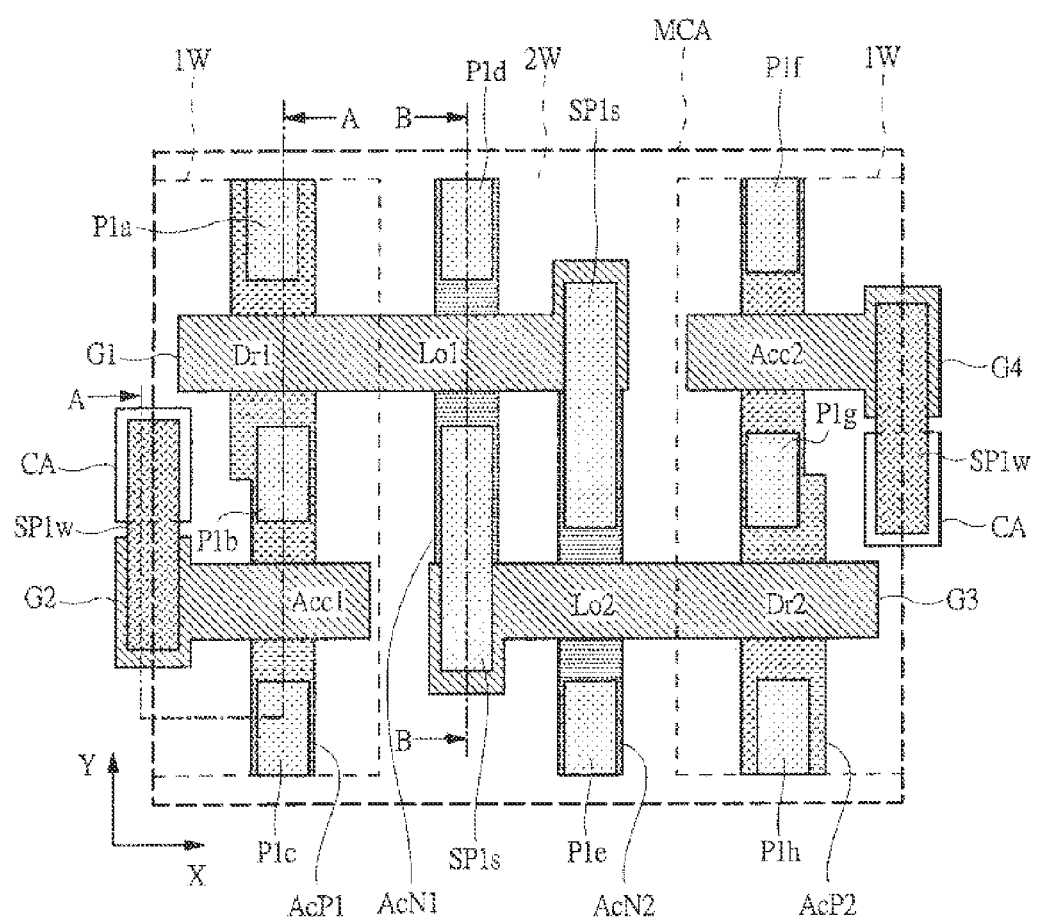
FIG. 47 is a plan view showing a configuration of a memory cell area in an SRAM of Embodiment 2.

As shown in FIG. 47, over the active region AcP1, in parallel with the foregoing common gate electrode G1, the gate electrode G2 is disposed. Consequently, the transistor Acc1 is disposed over the active region AcP1 so that the source/drain regions of the transistor Dr1 are coupled to the source/drain regions of the transistor Acc1 (commonalized). The gate electrode G2 extends from the active region AcP1 to a position over the isolation region STI and, over the gate electrode G2, the shared plug SP1w is disposed. The configuration is the same as in Embodiment 1 (FIG. 7).

Figure 48:
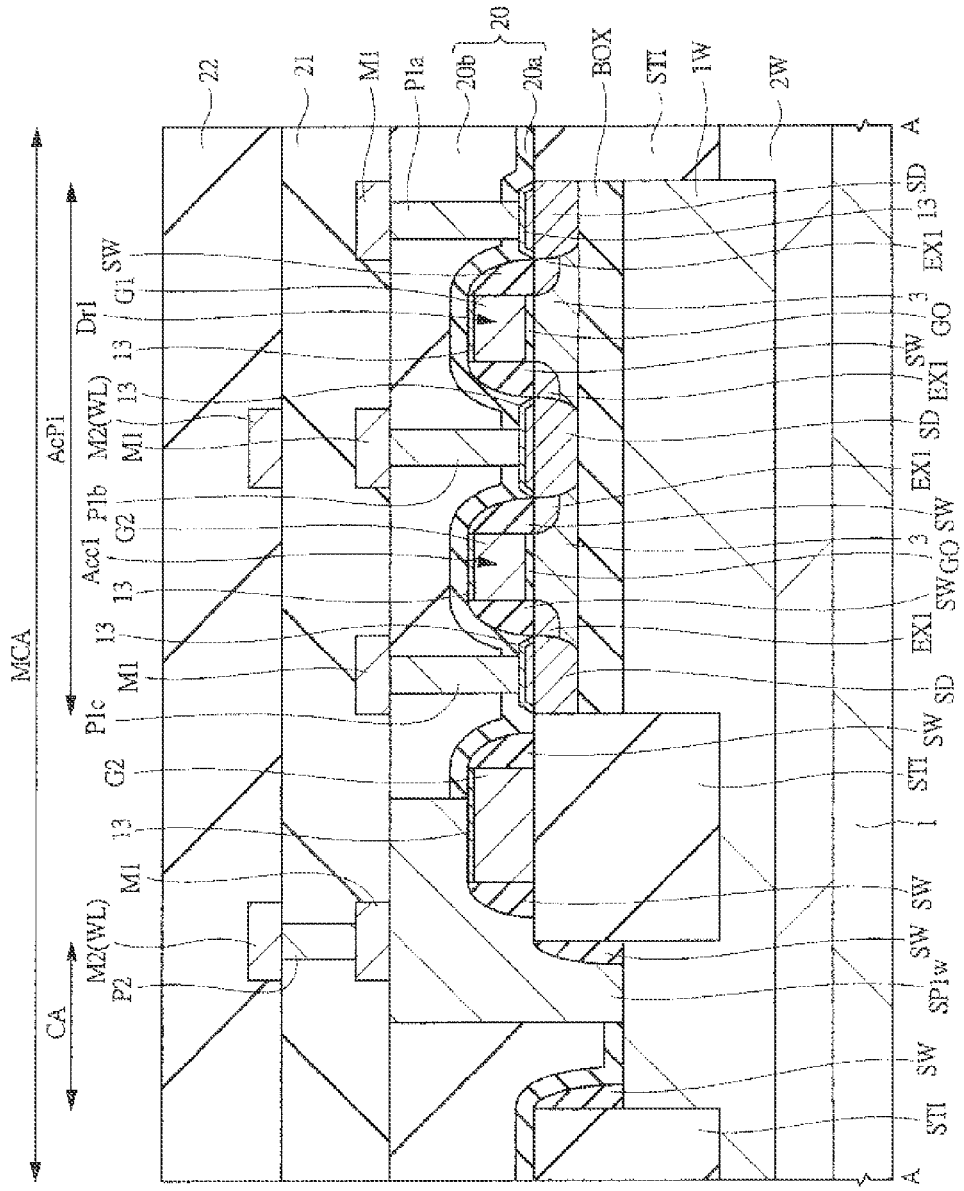
FIG. 48 is a cross-sectional view showing the configuration of the memory cell area in the SRAM of Embodiment 2.

However, in the present embodiment, the shared plug SP1w extends from over the gate electrode G2 to the coupling area CA (FIG. 47) through the interlayer insulating film 20 to be coupled to the p-type semiconductor region 1W of the coupling area CA (FIG. 48).

By thus providing the coupling area CA, the shared plug SP1w can be formed shallower than in Embodiment 1.

Over the active region AcP2, in parallel with the foregoing common gate electrode G3, the gate electrode G4 is disposed. Consequently, the transistor Acc2 is disposed over the active region AcP2 so that the source/drain regions of the transistor Dr2 are coupled to the source/drain regions of the transistor Acc2 (commonalized). The gate electrode G4 extends from the active region AcP2 to a position over the isolation region STI and, over the gate electrode G4, the shared plug SP1w is disposed. The configuration is the same as in Embodiment 1 (FIG. 7).

However, in the present embodiment, the shared plug SP1w extends from over the gate electrode G4 to the coupling area CA (FIG. 47) through the interlayer insulating film 20 to be coupled to the p-type semiconductor region 1W of the coupling area CA (see FIG. 48).

By thus providing the coupling area CA, the shared plug SP1w can be formed shallower than in Embodiment 1. In other words, the shared plug SP1w need not be disposed to extend through the isolation region STI, and the bottom portion of the shared plug SP1w is coupled to the p-type semiconductor region 1W at a position higher than that of the bottom portion of the isolation region STI.

Figure 49:
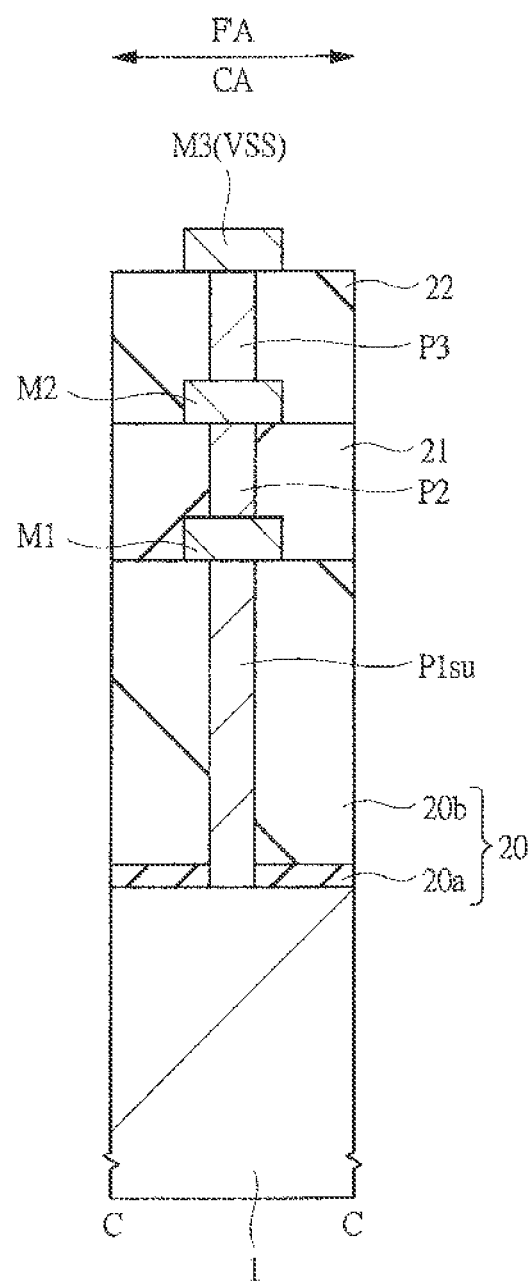
FIG. 49 is a cross-sectional view showing the configuration of the memory cell area in the SRAM of Embodiment 2.

Also, as shown in FIG. 49, in the region (C-C portion) of the tap cell area F'A where the first plug P1su is to be formed, the isolation region STI, the p-type semiconductor region 1W, the n-type semiconductor region 2W, and the like are not formed, but the coupling area CA made of the supporting substrate 1 is disposed to allow the first plug P1su to be formed shallow.

Figure 50:
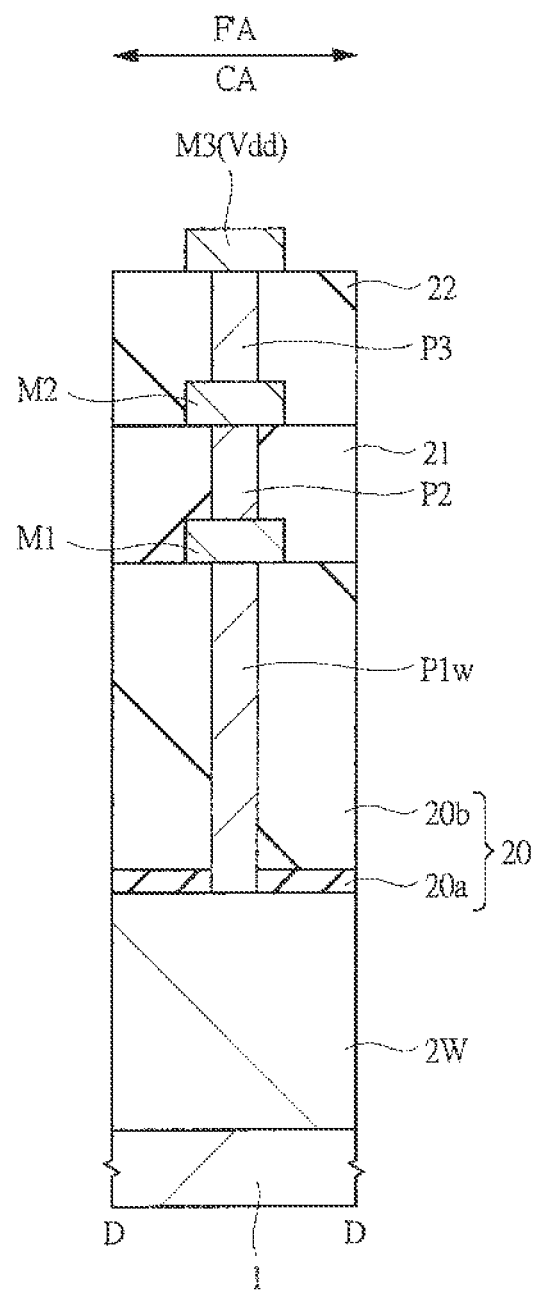
FIG. 50 is a cross-sectional view showing the configuration of the memory cell area in the SRAM of Embodiment 2.

As also shown in FIG. 50, in the region (D-D portion) of the tap cell area F'A where the first plug P1w is to be formed, the isolation region STI is not formed, but the coupling area CA made of the n-type semiconductor region 2W is disposed to allow the shared plug SP1w to be formed shallow.

<Manufacturing Steps>

Next, the manufacturing steps of the semiconductor device of the present embodiment will be described, and also the configuration of the memory area in the SRAM of the present embodiment will be made clearer.

Figure 51:
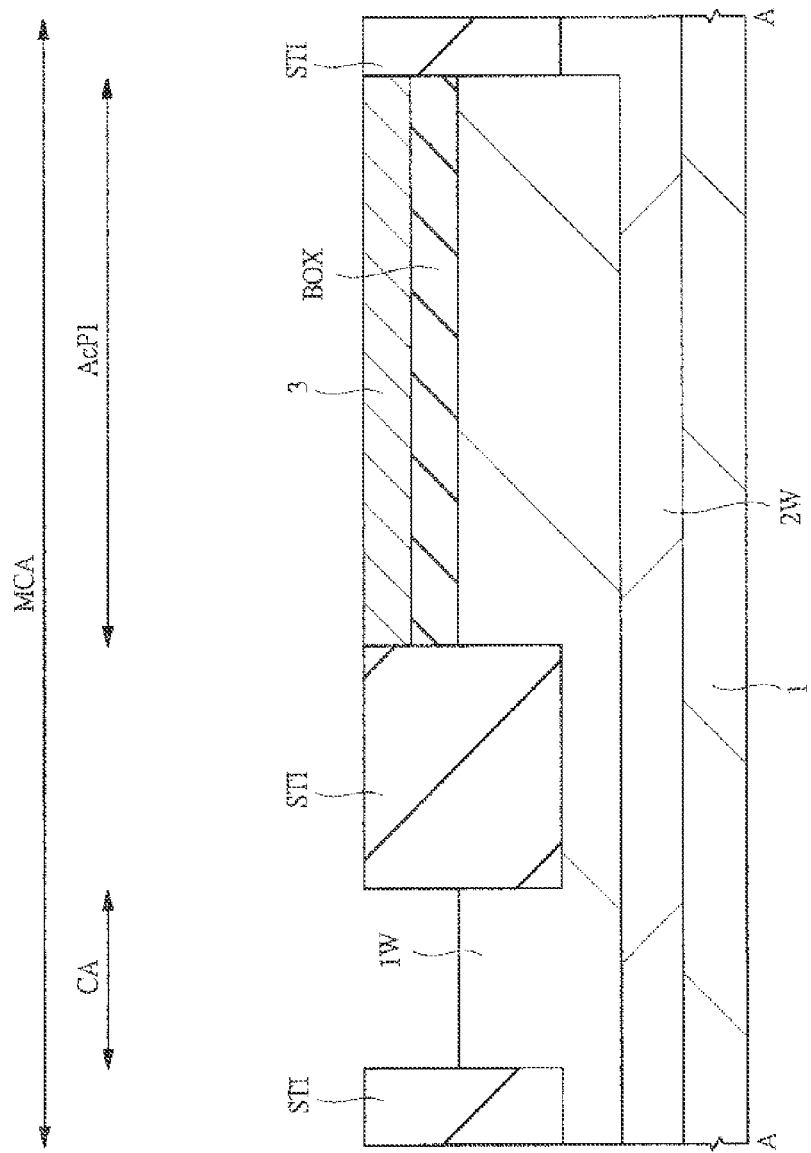
FIG. 51 is a cross-sectional view showing a manufacturing step of a semiconductor device of Embodiment 2.
Figure 52:
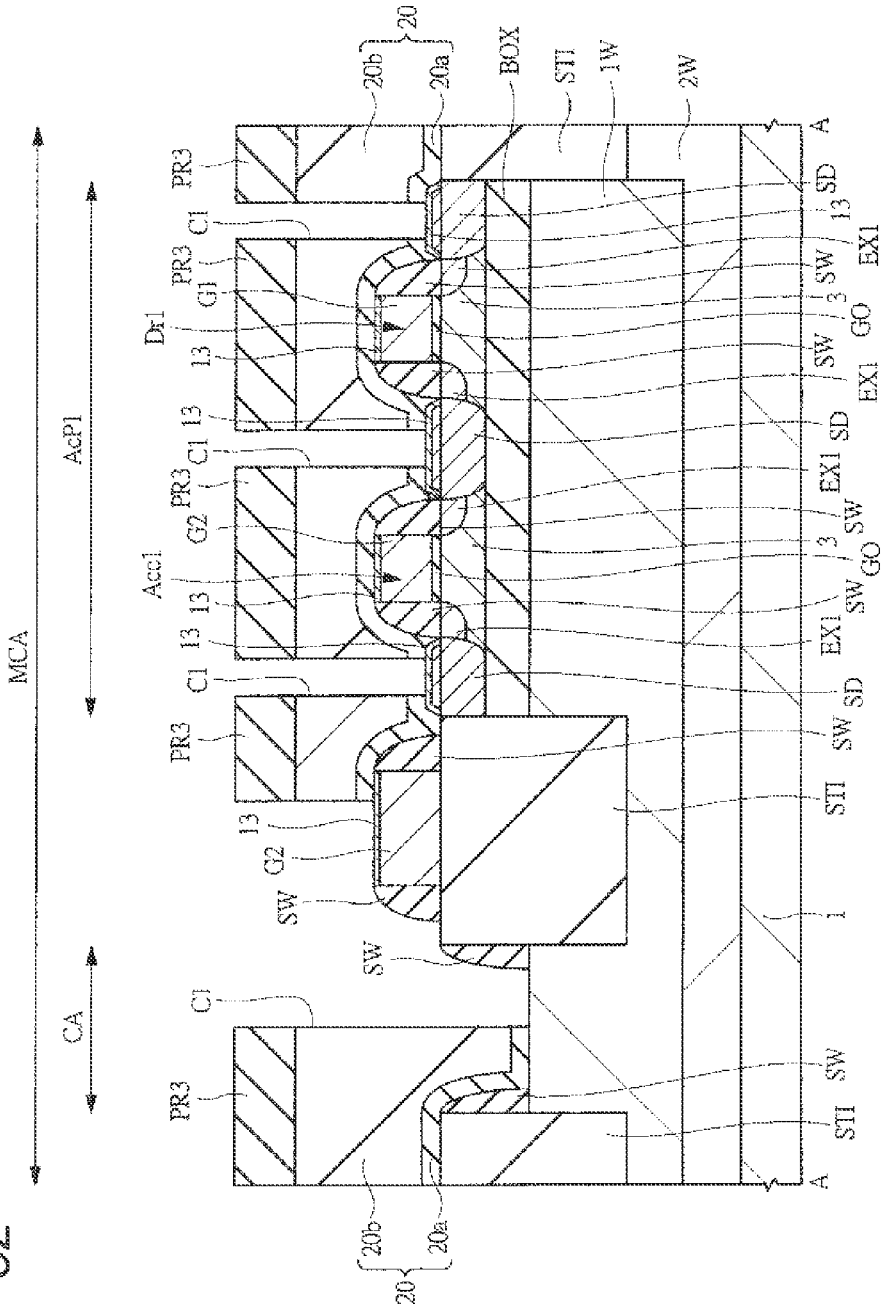
FIG. 52 is a cross-sectional view showing a manufacturing step of the semiconductor device of Embodiment 2.

FIGS. 51 and 52 are the cross-sectional views showing the manufacturing steps of the semiconductor device of the present embodiment. The manufacturing steps will be described with reference mainly to the cross section of the memory cell area MCA in the SRAM and the cross section of the tap cell area F'A (FIGS. 49 and 50).

First, in the same manner as in Embodiment 1, a SOI substrate including the supporting substrate 1, the insulating layer BOX, and the semiconductor region 3 located thereover is prepared. After the isolation region STI is formed, the p-type semiconductor region 1W and the n-type semiconductor region 2W are formed (FIG. 51). At this time, in the coupling area CA, the isolation region STI is not formed, but the p-type semiconductor region 1W and the n-type semiconductor region 2W located thereunder are formed (FIG. 51). Note that, in the region (D-D portion) of the tap cell area F'A where the first plug P1w is to be formed, the n-type semiconductor region 2W is formed (FIG. 50). In the region (C-C portion) of the tap cell area F'A where the first plug P1su is to be formed, the supporting substrate 1 is left as is without forming the p-type semiconductor region 1W and the n-type semiconductor region 2W (FIG. 49).

Then, in the same manner as in Embodiment 1, in the supporting substrate 1 in the peripheral circuit area PA, the p-type well pW and the n-type well NW are formed (see FIG. 24).

Then, in the same manner as in Embodiment 1, the insulating layer BOX and the semiconductor region 3 over the supporting substrate 1 in the peripheral circuit area PA are removed (see FIG. 25). Here, in the present embodiment, in the memory cell area MCA and the coupling area CA of the tap cell area F'A also, the insulating layer BOX and the semiconductor region 3 over the supporting substrate 1 are removed (FIGS. 51, 49, and 50).

Then, in the same manner as in Embodiment 1, each of the transistors (Acc1, Dr1, Lo1, Acc2, Dr2, and Lo2) is formed in the main surface of the semiconductor region 3 in the memory cell area MCA and each of the transistors (Qn and Qp) is formed in the main surface of the supporting substrate 1 in the peripheral circuit area PA. Additionally, in the same manner as in Embodiment 1, over the gate electrodes G and the source/drain regions (SD), the metal silicide layers 13 are formed by a salicide technique (see FIGS. 26 to 34).

Then, over the source/drain regions (SD) of the individual transistors (Dr1, Acc1, Lo1, Lo2, Acc2, and Dr2), the first plugs P1 (P1a to P1h, SP1s, SP1w, P1su, and P1w) are formed.

First, as shown in FIG. 52, over each of the transistors (Dr1, Acc1, Lo1, Qn, Qp, and the like), a laminate film of the silicon nitride film 20a and the silicon oxide film 20b is formed as the interlayer insulating film 20. The silicon nitride film 20a functions as an etching stopper when the silicon oxide film 20b is etched, and is formed thinner than the silicon oxide film 20b.

Next, over the interlayer insulating film 20, a photoresist film PR3 is formed and subjected to exposure/development treatment (photolithography) to open regions where the first plugs (SP1w) are to be formed. Then, using the photoresist film PR3 as a mask, the silicon oxide film 20b is etched till the silicon nitride film 20a is exposed. Next, the exposed silicon nitride film 20a is etched to form the contact holes C1. At this time, in the region where the first plug SP1w is to be formed, the p-type semiconductor region 1W of the coupling area CA is exposed. In the region (D-D portion) of the tap cell area F'A where the first plug P1w is to be formed, the n-type semiconductor region 2W is exposed (see FIG. 50). In the region (C-C portion) of the tap cell area F'A where the first plug P1su is to be formed, the supporting substrate 1 is exposed (FIG. 49). Then, the photoresist film PR3 is removed by asking or the like. Note that an impurity of the same conductivity type (e.g., a p-type impurity for the p-type semiconductor region 1W) may also be implanted into the p-type semiconductor region 1W in the exposed coupling area CA, i.e., into the bottom portion of the contact hole C1 to thereby increase the impurity concentration of the contact portion and reduce a coupling resistance.

Then, in the same manner as in Embodiment 1, the contact holes C1 are each filled with the conductive film to form the first plugs P1 (see FIGS. 42 to 46). The first plugs P1 (the plugs P1a to P1h and SP1s, and the plugs P1, SP1w, P1su, and P1w in the peripheral circuit area PA) are formed to extend through the interlayer insulating film 20 (FIGS. 48 to 50).

By thus providing the coupling area (lead-out area) CA in advance, the contact holes C1 can be formed in the same step. Moreover, the contact holes C1 can be accurately formed. Thus, in the present embodiment, not only the effects achieved in Embodiment 1, but also excellent contact due to the foregoing first plugs P1 can be achieved.

Embodiment 3

In Embodiment 1, the semiconductor region 1W has the p-type conductivity and the semiconductor region 2W has the n-type conductivity. However, the semiconductor region 1W and the semiconductor region 2W may also have the opposite conductivity types. That is, in the present embodiment, the semiconductor region 1W has the n-type conductivity and the semiconductor region 2W has the p-type conductivity.

As for the "Circuit Configuration" and "Memory Operation" of each of the memory cells in the SRAM of the present embodiment, they are as described above in Embodiment 1 with reference to FIG. 1.

Figures 53A, 53B:
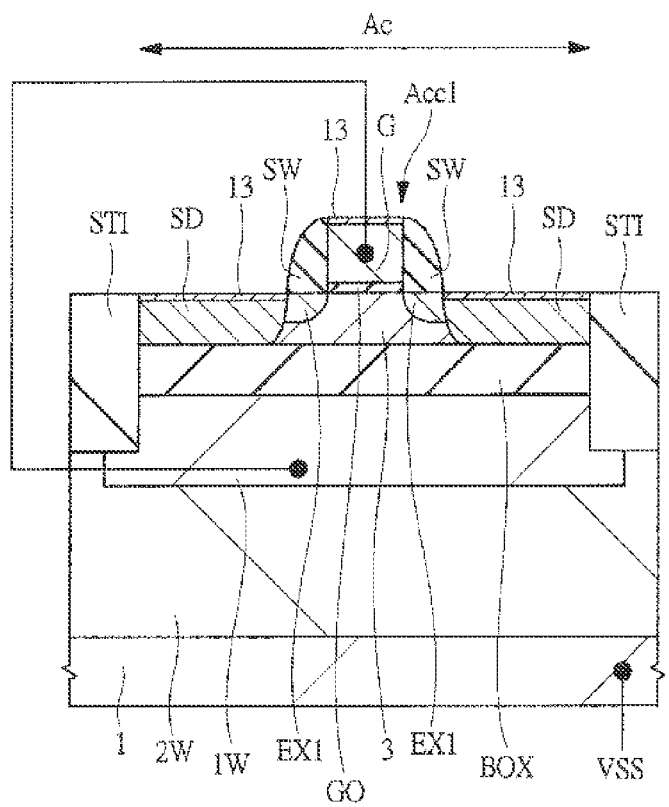
FIG. 53A is a schematic cross-sectional view of an access transistor included in a memory cell in an SRAM of Embodiment 3.
FIG. 53B is a table showing the states of applied potentials in the access transistor.
Figure 54:
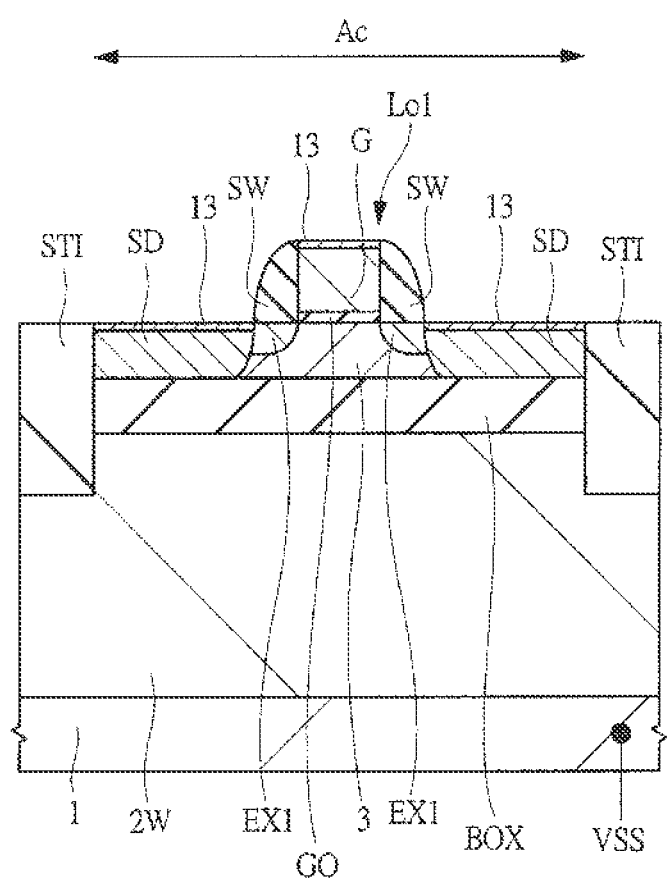
FIG. 54 is a schematic cross-sectional view of the load transistor (Lo1) included in the memory cell in the SRAM of Embodiment 3.

A schematic configuration of the memory cell in the SRAM of the present embodiment will be described with reference to FIGS. 53 and 54. FIG. 53A is a schematic cross-sectional view of each of the access transistors (Acc1 and Acc2) included in the memory cell in the SRAM of the present embodiment. FIG. 53B is a table showing the states of applied potentials in the access transistor (Acc1). Note that the access transistor (Acc2) also has the same configuration. Each of the driver transistors (Dr1 and Dr2) which are similarly the n-type transistors also has the same configuration. FIG. 54 is a schematic cross-sectional view of the load transistor (Lo1) included in the memory cell in the SRAM of the present embodiment. Note that the load transistor (Lo2) also has the same configuration.

As shown in FIGS. 53 and 54, the six transistors included in the memory cell in the SRAM of the present embodiment are formed in the SOI substrate. The SOI substrate includes the supporting substrate 1 made of a semiconductor such as p-type silicon, the insulating layer BOX located thereover, and the semiconductor region (isolation region) 3 located thereover. The element formation region is isolated by the isolation region STI, and the region defined by the isolation region STI serves as the active region (element formation region or transistor formation region) Ac.

As shown in FIG. 53A, the access transistor Acc1 is formed in the main surface of the semiconductor region 3 included in the SOI substrate. The transistor includes the gate electrode G disposed over the semiconductor region 3 via the gate insulating film GO, and source/drain regions disposed on both sides of the gate electrode G. Each of the source/drain regions has an LDD structure, and includes the n-type lightly doped impurity region EX1 and the n-type heavily doped impurity region SD. Note that the source/drain region indicates the region serving as the source or drain. Note that 13 denotes the metal silicide layer.

Under the semiconductor region 3 in which the transistor is disposed, the n-type semiconductor region 1W is disposed via the insulating layer BOX. The bottom portion of the n-type semiconductor region 1W is located at a position deeper than that of the bottom portion of the isolation region STI. Further under the n-type semiconductor region 1W, the p-type semiconductor region 2W of the conductivity type opposite to that of the n-type semiconductor region 1W is disposed. That is, the n-type semiconductor region 1W is surrounded by the p-type semiconductor region 2W to be pn-isolated. Specifically, over the n-type semiconductor region 1W, the insulating layer BOX is located, and the bottom portion and side portions of the n-type semiconductor region 1W are located so as to come in contact with the p-type semiconductor region 2W. Note that a part of each of the side portions of the n-type semiconductor region 1W may also be in contact with the isolation region STI. Note that, as will be described later, the p-type semiconductor region 2W is continuous under the isolation region STI so as to extend to a position under the load transistor Lo1.

Here, in the present embodiment, the gate electrode G of the access transistor is electrically coupled to the n-type semiconductor region 1W located thereunder. The p-type semiconductor region 2W is fixed together with the supporting substrate 1 to the ground potential (VSS, reference potential, second potential, or potential lower than the foregoing first potential).

Thus, the n-type semiconductor region 1W under the region (Ac or active regions AcP1 and AcP2 described later) where the access transistor is formed is electrically isolated by the p-type semiconductor region 2W located under the bottom portion thereof and around the outer periphery thereof, while the gate electrode G of the access transistor is electrically coupled to the foregoing n-type semiconductor region 1W, to allow improvements in the transistor operation characteristics of the access transistor (Acc1 or Acc2). That is, when the access transistor (Acc1 or Acc2) is in the ON state (on), a potential in the n-type semiconductor region 1W serving as the back gate is simultaneously increased, and therefore an ON current for the transistor can be increased. In addition, a forward bias voltage is not applied between the n-type semiconductor region 1W and the p-type semiconductor region 2W, and a leakage current therebetween can be reduced.

As shown in FIG. 54, the load transistor Lo1 is formed in the main surface of the semiconductor region 3 included in the SOI substrate. The transistor includes the gate electrode G disposed over the semiconductor region 3 via the gate insulating film GO, and the source/drain regions disposed on both sides of the gate electrode G. Each of the source/drain regions has an LDD structure, and includes the p-type lightly doped impurity region EX1 and the p-type heavily doped impurity region SD.

Under the semiconductor region 3 in which the load transistor Lo1 is disposed, the p-type semiconductor region 2W is disposed via the insulating layer BOX. The bottom portion of the p-type semiconductor region 2W is located at a position deeper than that of the bottom portion of the isolation region STI. Moreover, as described above, the p-type semiconductor region 2W has the conductivity type opposite to that of the n-type semiconductor region 1W, extends continuously to a position under the n-type semiconductor region 1W under the driver transistor and the access transistor (Dr1 and Acc1), and is fixed together with the supporting substrate 1 to the ground potential (VSS).

Figure 55:
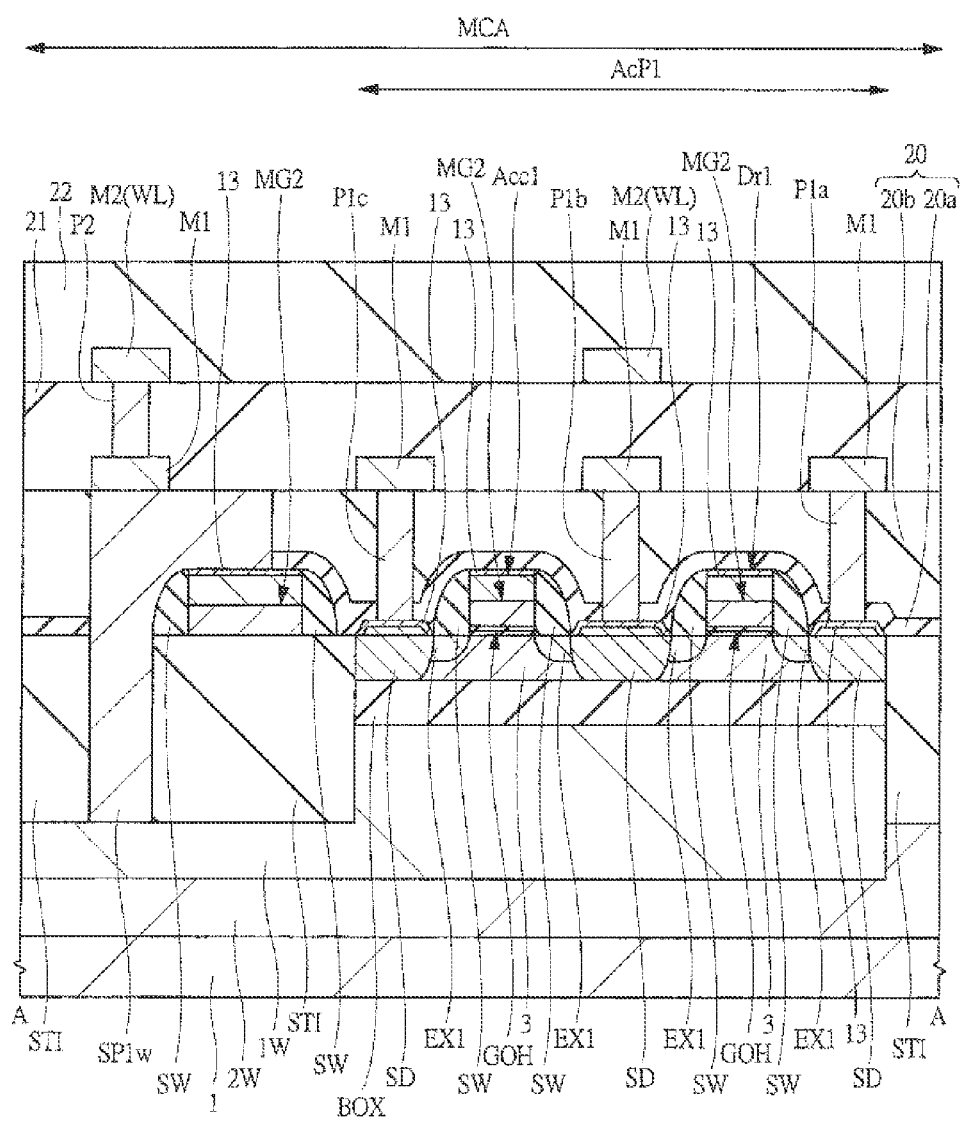
FIG. 55 is a cross-sectional view showing a configuration of a semiconductor device of Embodiment 3.
Figure 56:
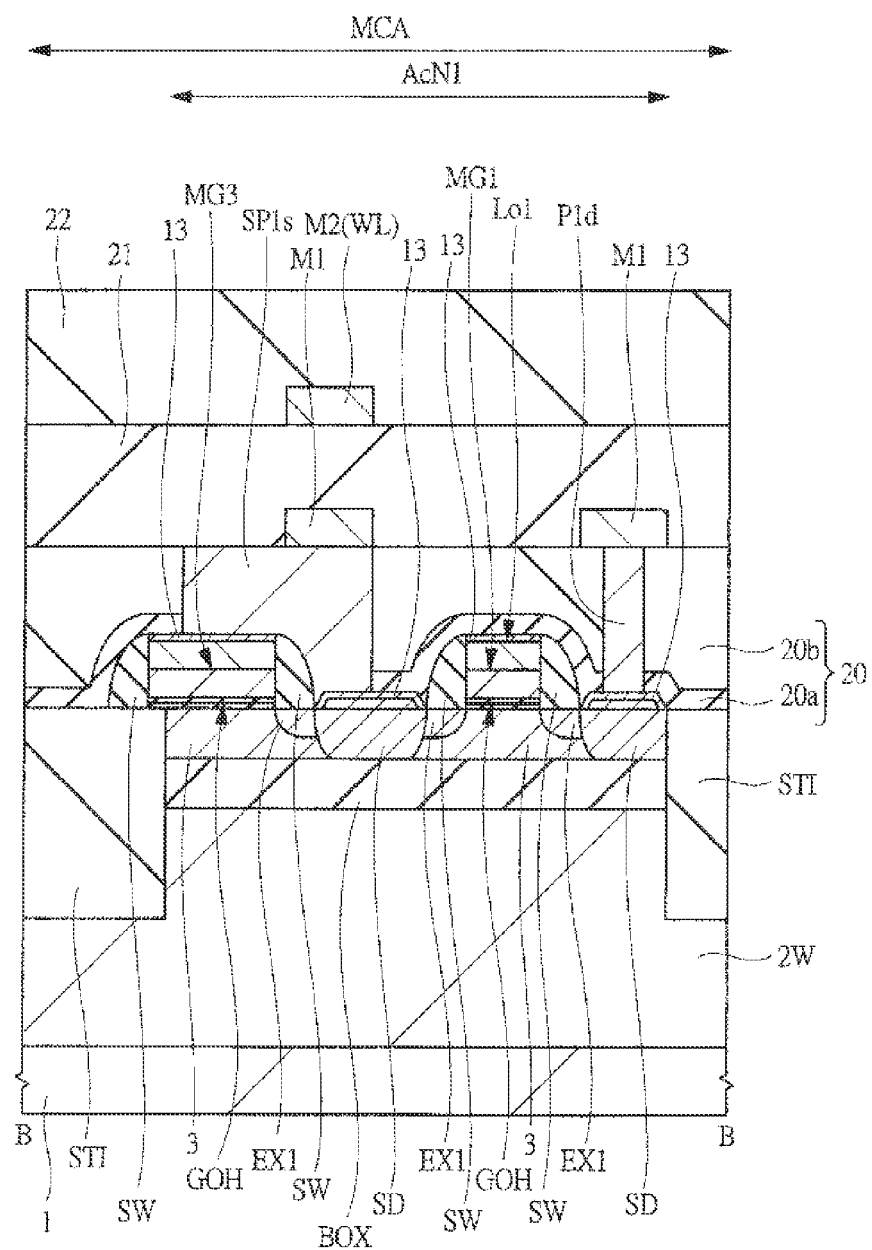
FIG. 56 is a cross-sectional view showing the configuration of the semiconductor device of Embodiment 3.
Figure 57:
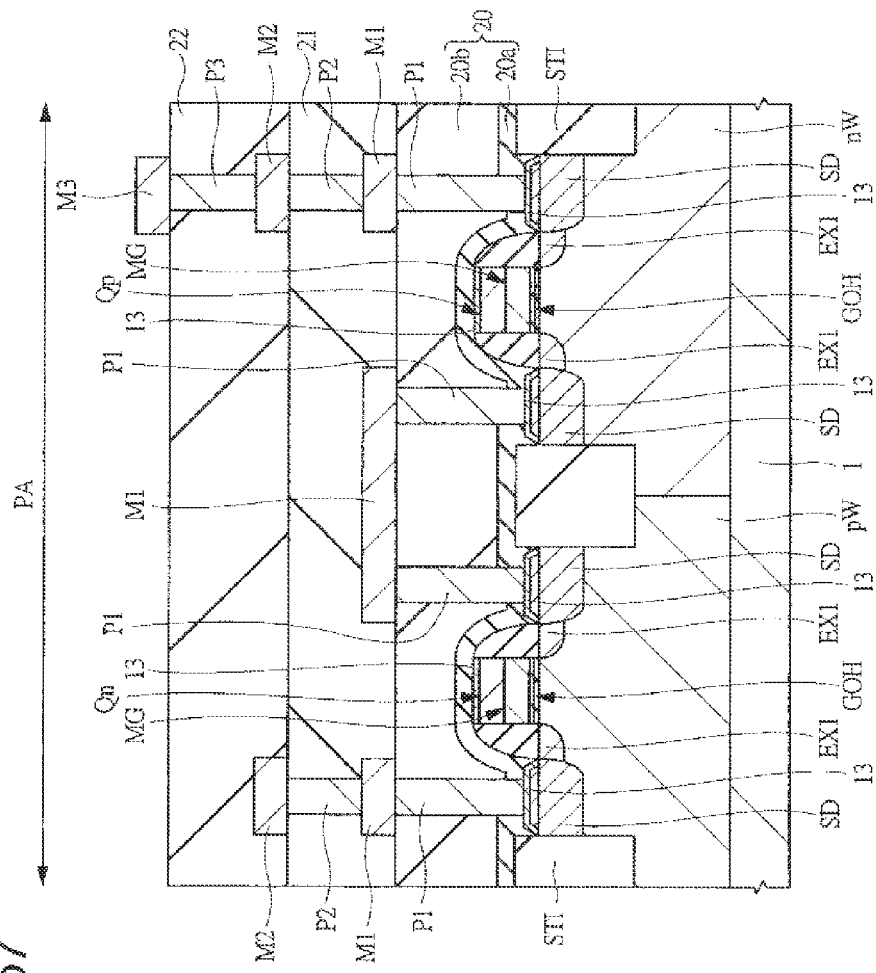
FIG. 57 is a cross-sectional view showing the configuration of the semiconductor device of Embodiment 3.

A two-dimensional configuration of various patterns in the memory cell area in the SRAM of the present embodiment is the same as in Embodiment 1 (FIGS. 4 to 6 and FIGS. 7 to 9) except that the semiconductor region 1W and the semiconductor region 2W have the opposite conductivity types. As for the cross-sectional structure thereof, it can be configured in the same manner as in Embodiment 1 (FIGS. 10 and 11) except that the semiconductor region 1W and the semiconductor region 2W have the opposite conductivity types. However, as shown in FIGS. 55 and 56, here, as a gate insulating film GOH of each of the six transistors included in each of the memory cells, a high dielectric film (high-k film) is used. A high dielectric film is defined as an insulating film having a dielectric constant higher than that of a silicon oxide film. As the gate electrode of each of the six transistors, a metal gate electrode (gate electrode having a metal portion) MG is used. For each of the MISFETs (Qn and Qp) in the peripheral circuit area PA also, the high dielectric film is used as the gate insulating film GOH, and the metal gate electrode MG is used as the gate electrode (FIG. 57). FIGS. 55 to 57 are cross-sectional views each showing a configuration of the semiconductor device of the present embodiment.

<Manufacturing Steps>

Next, the manufacturing steps of the semiconductor device of the present embodiment will be described, and also the configurations of the memory area in the SRAM of the present embodiment and the peripheral circuit area will be made clearer.

<Steps of Forming Transistors>

FIGS. 58 to 63 are the cross-sectional views showing the manufacturing steps of the semiconductor device of the present embodiment. The manufacturing steps will be described with reference mainly to the cross section of the memory cell area MCA in the SRAM and the cross section of the peripheral circuit area PA.

Figure 58:
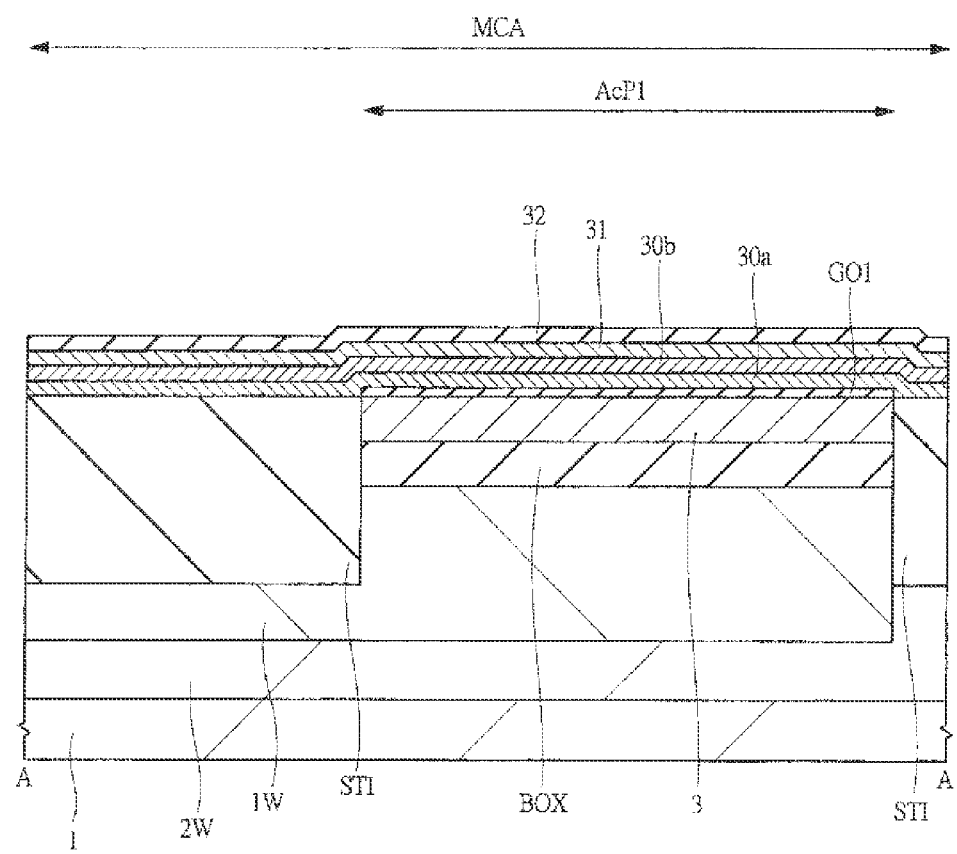
FIG. 58 is a cross-sectional view showing a manufacturing step of the semiconductor device of Embodiment 3.
Figure 59:
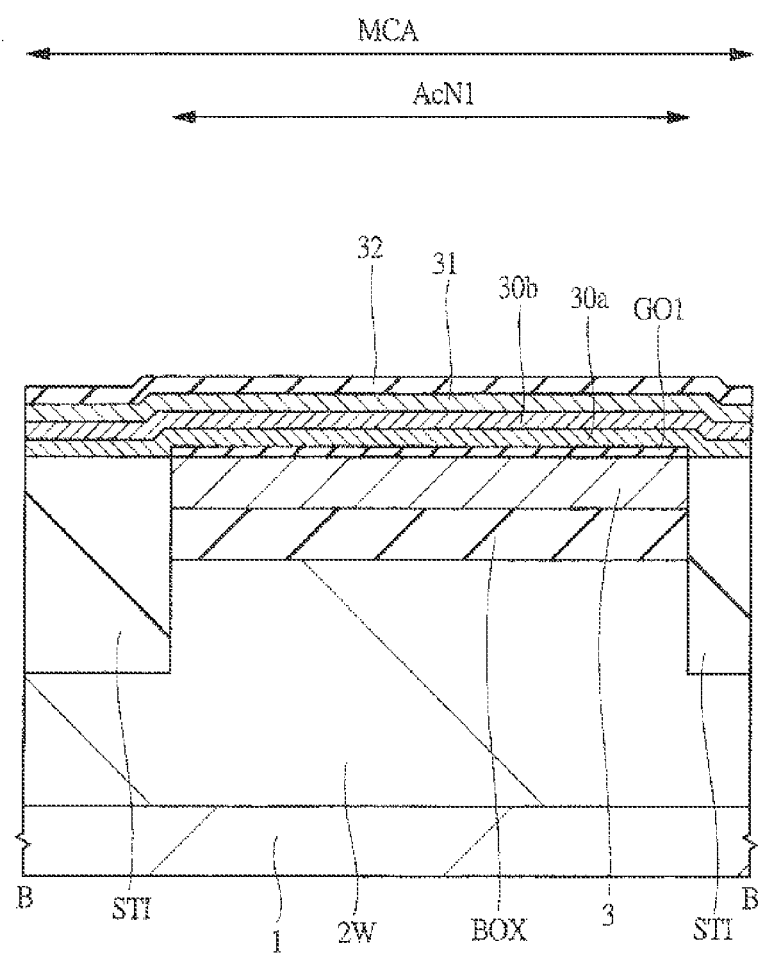
FIG. 59 is a cross-sectional view showing a manufacturing step of the semiconductor device of Embodiment 3.

First, in the same manner as in Embodiment 1, a SOI substrate including the supporting substrate 1, the insulating layer BOX, and the semiconductor region 3 located thereover is prepared. After the isolation region STI is formed, the semiconductor region 1W and the semiconductor region 2W are formed. At this time, the conductivity types of implanted impurities are opposite to those in Embodiment 1. That is, the p-type semiconductor region 1W and the n-type semiconductor region 2W are formed (FIGS. 58 and 59). For example, with an energy of 5 to 20 keV, boron (B) is ion-implanted at a concentration of $1 \times 10^{13}/cm^2$ to $5 \times 10^{14}/cm^2$ to form the p-type semiconductor region 1W. On the other hand, with an energy of 5 to 20 keV, phosphorus (P) is ion-implanted implanted at a concentration of $1 \times 10^{13}/cm^2$ to $5 \times 10^{14}/cm^2$ to form the n-type semiconductor region 2W.

Figure 60:
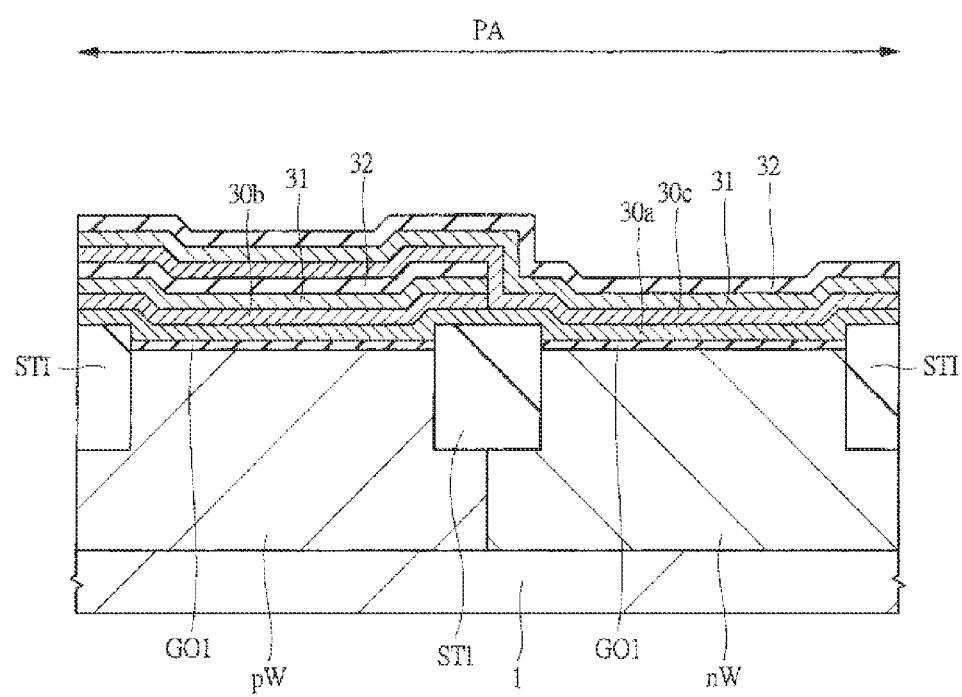
FIG. 60 is a cross-sectional view showing a manufacturing step of the semiconductor device of Embodiment 3.

Then, in the same manner as in Embodiment 1, in the supporting substrate 1 in the peripheral circuit area PA, the p-type well pW and the n-type well nW are formed and, in the same manner as in Embodiment 1, the insulating layer BOX and the semiconductor region 3 which are located over the supporting substrate 1 in the peripheral circuit area PA are removed (see FIG. 60).

Then, in the same manner as in Embodiment 1, each of the transistors (Acc1, Dr1, Lo1, Acc2, Dr2, and Lo2) is formed in the main surface of the semiconductor region 3 in the memory cell area MCA and each of the transistors (Qn and Qp) is formed in the main surface of the supporting substrate 1 in the peripheral circuit area PA. The gate insulating film GOH and the metal gate electrode MG which are included in each of the transistors are formed as follows. Here, a description will be given to the case of using, as the gate insulating film GOH, a laminate film of a first gate insulating film GO1 made of a silicon oxide film or the like and a high-dielectric-constant second gate insulating film GO2 made of a HfLaON film, a HfAlON film, or the like. A description will be given also to the case of using, as the metal gate electrode MG, a laminate film of a metal film and a silicon film.

<Steps of Forming Gate Insulating Film>

First, as shown in FIGS. 58 to 60, over the main surface in each of the memory cell area MCA and the peripheral circuit area PA, e.g., a thin silicon oxide film is formed as the first gate insulating film GO1 using, e.g., a thermal oxidation method. Note that, instead of the silicon oxide film, a silicon oxynitride film may also be used. Note that, in FIGS. 58 to 60, for improved clarity of illustration, each of the various films (such as GO1 and GO2) over the main surface in each of the memory cell area MCA and the peripheral circuit area PA is shown thicker than in FIGS. 55 to 57.

Then, in the memory cell area MCA and in the region of the peripheral circuit area PA where the n-channel MISFET (Qn) is to be formed, a HfLaON film is formed as the second gate insulating film GO2 and, in the region of the peripheral circuit area PA where the p-channel MISFET (Qp) is to be formed, a HfAlON film is formed.

For example, a $HfO_2$ film (hafnium dioxide film) is formed over the first gate insulating film GO1 by a CVD method or the like and nitrogenized to form a HfON film (hafnium oxynitride film) 30a.

Then, over the HfON film 30a, a La film 30b, a TiN film 31, and a silicon nitride film 32 are deposited successively. The resulting laminate film thereof is etched to leave a La film 30b and the like over the HfON film 30a in the memory cell area MCA and in the region of the peripheral circuit area PA where the n-channel MISFET (Qn) is to be formed.

Then, in each of the memory cell area MCA and the peripheral circuit area PA, an Al film 30c, a TiN film 31, and a silicon nitride film 32 are deposited successively (see FIGS. 58, 59, and 60).

By the foregoing steps, a configuration is provided in which, in the region of the peripheral circuit area PA where the p-channel MISFET (Qp) is to be formed, the Al film 30c is disposed over the HfON film 30a and, in the memory cell area MCA and in the region of the peripheral circuit area PA where the n-channel MISFET (Qn) is to be formed, the La film 30b is disposed over the HfON film 30a. Note that the foregoing TiN film and the like function as a hard mask which functions as an oxidation preventing film. In FIGS. 58 and 59, the illustration of the uppermost three layers (layers including and located over 30c) is omitted.

Then, heat treatment is performed to mix Al or La in the HfON film 30a to form a HfAlON film as the second gate insulating film GO2 of the p-channel MISFET (Qp) and, as the second gate insulating film GO2 of each of the six transistors included in the memory cell and the n-channel MISFET (Qn) in the peripheral circuit area PA, a HfLaON film is formed.

Thereafter, the remaining TiN film 31, silicon nitride film 32, Al film 30c, and La film 30b are removed to allow the high-dielectric-constant gate insulating film GOH (high dielectric film or high-k film) made of the laminate film of the first gate insulating film GO1 and the gate insulating film GO2 to be formed. Note that, as the gate insulating film GOH, another high dielectric film may also be used. Alternatively, the gate insulating film GOH may also be formed of a single-layer high dielectric film.

<Steps of Forming Metal Gate Electrodes>

Figure 61:
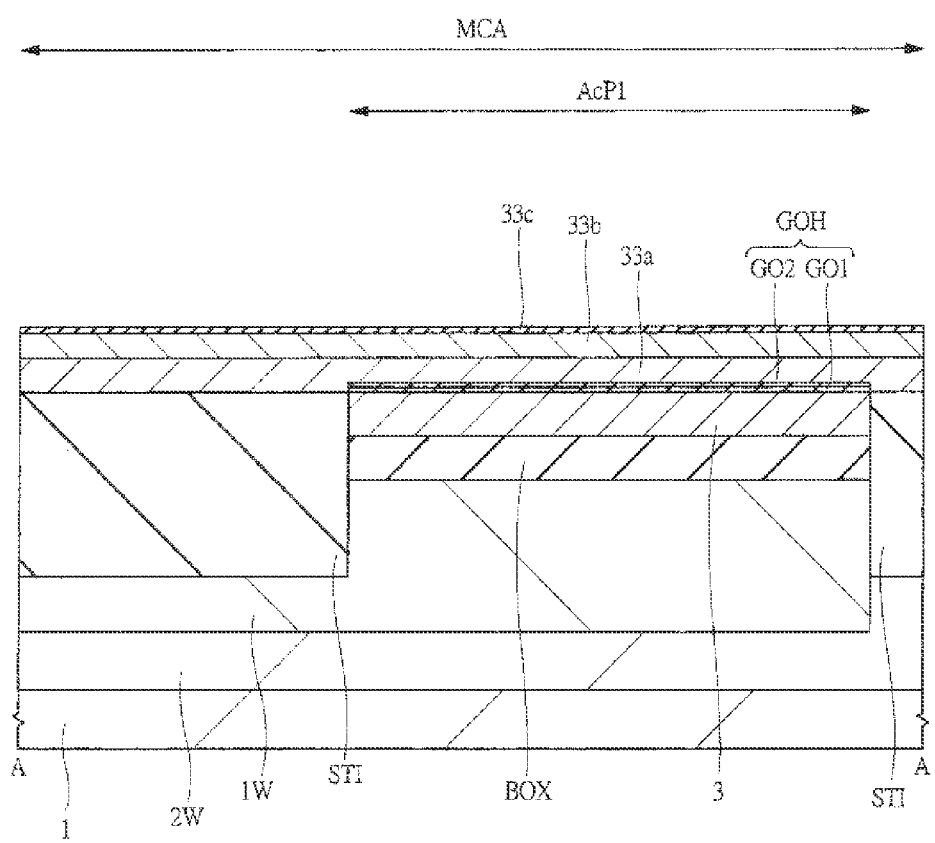
FIG. 61 is a cross-sectional view showing a manufacturing step of the semiconductor device of Embodiment 3.
Figure 62:
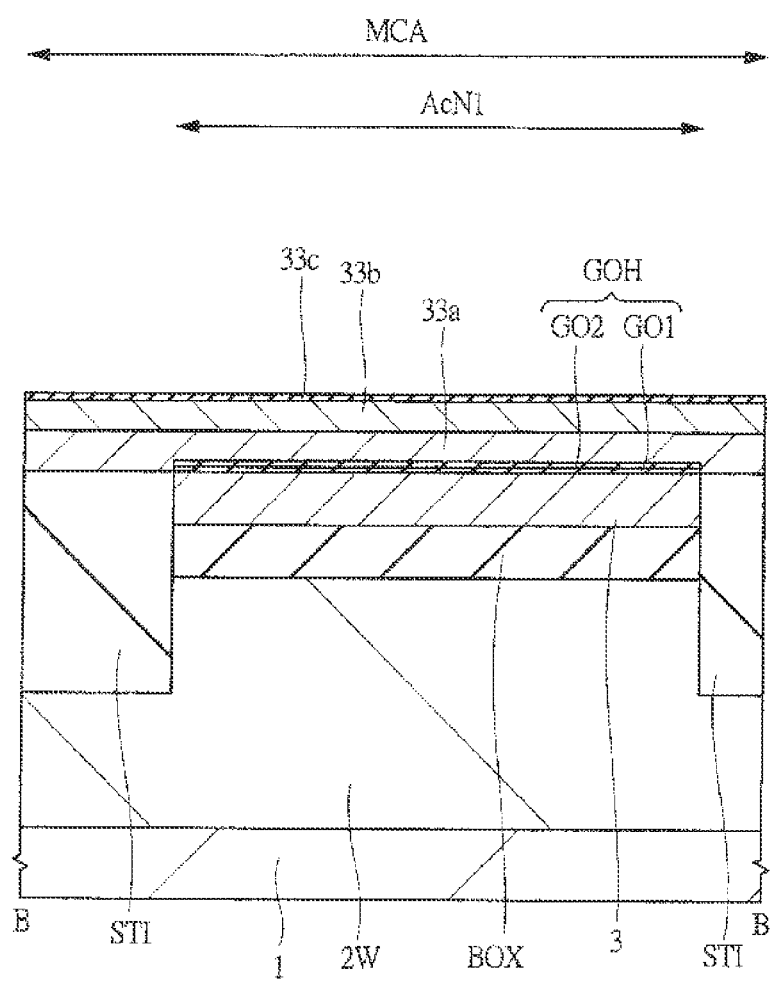
FIG. 62 is a cross-sectional view showing a manufacturing step of the semiconductor device of Embodiment 3.
Figure 63:
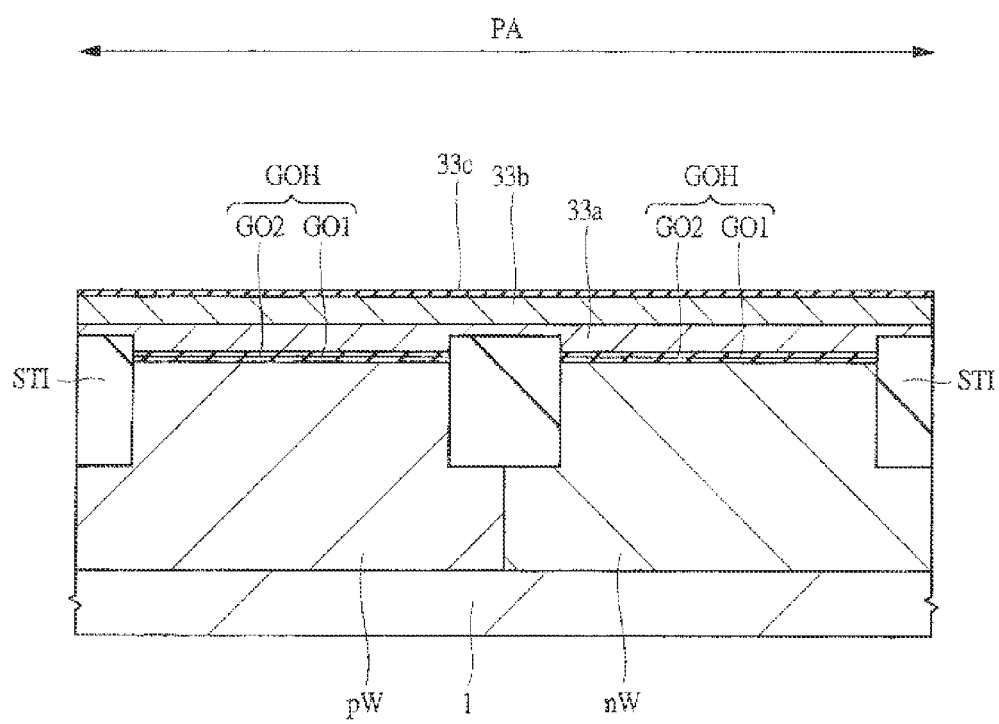
FIG. 63 is a cross-sectional view showing a manufacturing step of the semiconductor device of Embodiment 3.

Then, as shown in FIGS. 61 to 63, over the gate insulating film GOH, e.g., a TiN film is formed as a metal film 33a for metal gates to a thickness of about 10 nm by a sputtering method or the like. The metal film (metal layer) for metal gates is defined as a conductive film showing metallic conduction and contains not only a single-element metal and an alloy, but also a metal compound film (such as a metal nitride film or a metal carbide film) showing metallic conduction.

Next, over the metal film 33a, a polysilicon film 33b is formed to a thickness of about 100 to 200 nm. By forming the metal film 33a thick, the step of forming the silicon film 33 can also be omitted. However, by laminating the silicon film 33b, the thickness of the metal film 33a can be reduced, and etching damage when the metal film 33a is patterned can be reduced.

Then, over the polysilicon film 33b, a silicon nitride film 33c is deposited. Subsequently, a laminate film of the metal film 33a, the polysilicon film 33b, and the silicon nitride film 33c is patterned to form the metal gate electrodes MG. Over the gate electrodes MG, cap insulating films each made of an insulating film such as a silicon nitride film remain.

Thereafter, in the same manner as in Embodiment 1, the semiconductor regions (EP) formed by epitaxial growth and the source/drain regions each having an LDD structure are formed on both sides of the gate electrodes G. By the foregoing steps, in the main surface in each of the memory cell area MCA and the semiconductor region 3, each of the transistors (Acc1, Dr1, Lo1, Acc2, Dr2, and Lo2) is formed, while each of the transistors (Qn and Qp) is formed in the supporting substrate 1 in the peripheral circuit area PA (FIGS. 55 to 57).

Furthermore, in the same manner as in Embodiment 1, over the gate electrodes G and the source/drain regions (SD), the metal silicide layers 13 are formed by a salicide technique. At this time, when the cap insulating films remain over the gate electrodes MG, the cap insulating films are removed, and then silicidation is performed. Also, in the same manner as in Embodiment 1, the interlayer insulating films (20, 21, and 22), the plugs (P1, P2, and P3), and the wires (M1, M2, and M3) are formed.

Thus, even when the semiconductor region 1W and the semiconductor region 2W have the conductivity types opposite to those in embodiment 1, the semiconductor region 1W and the semiconductor region 2W can be pn-isolated and, by coupling the gate electrode G of the access transistor (Acc1 or Acc2) to the n-type semiconductor region 1W, an ON current for the transistor can be increased. When the back gate (1W) of the n-type transistor has the n-type conductivity and the back gate (2W) of the p-type transistor has the p-type conductivity, it tends to be difficult to adjust the threshold potentials of the transistors. However, by using the high-dielectric-constant gate insulating film and the metal gate structure in the configurations of the transistors, the threshold potentials can be increased. This increases a margin for allowing threshold adjustment to be performed using the impurity concentrations of the semiconductor regions 1W and 2A and facilitates adjustment of the threshold potentials of the transistors. For example, the threshold potentials can be adjusted in a range of about 0.1 to 0.3 V. Thus, the characteristics of the transistors can be improved.

Note that, in the present embodiment also, in the tap cell area F'A, the ground potential (VSS) is applied to the supporting substrate 1. That is, it is sufficient to couple the supporting substrate 1 to the ground potential line (VSS) via the plugs and the wires which are disposed in the tap cell area F'A.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, the configurations of the foregoing embodiments can be combined appropriately to be used. For example, it may also be possible to apply the configuration of Embodiment 2 to the configuration of Embodiment 3.

Also, in the foregoing embodiments, the SRAM has been described by way of example but, as is obvious from FIG. 2 or the like, the present embodiment is widely applicable to a semiconductor device having transistors (n-channel transistors).

The present invention is widely applicable to semiconductor devices.

What is claimed is:

1. A semiconductor device, comprising:
   (a1) a first transistor coupled between a first potential and a first node;
   (a2) a second transistor coupled between the first node and a second potential lower than the first potential;
   (a3) a third transistor coupled between the first potential and a second node;
   (a4) a fourth transistor coupled between the second node and the second potential;
   (a5) a fifth transistor coupled between the first node and a first bit line;
   (a6) a sixth transistor coupled between the second node and a second bit line;
   (b1) a first active region which is surrounded by an isolation region and in which the fifth transistor is disposed;
   (b2) a second active region which is surrounded by the isolation region and in which the sixth transistor is disposed;
   (c) an insulating layer disposed under the first active region and the second active region;
   (d1) a first semiconductor region of a first conductivity type disposed under the first active region via the insulating layer; and
   (d2) a second semiconductor region of a second conductivity type opposite to the first conductivity type disposed under the first semiconductor region,
   wherein a bottom portion and a side portion of the first semiconductor region are disposed so as to come in contact with the second semiconductor region, and
   wherein the first semiconductor region is coupled to a gate electrode of the fifth transistor.

2. A semiconductor device according to claim 1, further comprising:
   (d3) a third semiconductor region of the first conductivity type disposed under the second active region via the insulating layer,
   wherein a bottom portion and a side portion of the third semiconductor region are disposed so as to come in contact with the second semiconductor region, and
   wherein the third semiconductor region is coupled to a gate electrode of the sixth transistor.

3. A semiconductor device according to claim 2, further comprising:
   (b3) a third active region which is surrounded by the isolation region and in which the first transistor is disposed,
   wherein, under the third active region, the second semiconductor region is disposed via the insulating layer.

4. A semiconductor device according to claim 3,
   wherein the first, second, and third active regions are arranged to be aligned in a first direction,
   wherein the third active region is disposed between the first active region and the second active region, and
   wherein the second semiconductor region disposed under the third active region via the insulating layer extends to positions under the first semiconductor region and the third semiconductor region.

5. A semiconductor device according to claim 4, further comprising:
   (b4) a fourth active region which is surrounded by the isolation region and in which the second transistor is disposed,
   wherein the fourth active region is disposed between the third active region and the second active region.

6. A semiconductor device according to claim 5,
   wherein the third transistor is disposed in the first active region, and the fourth transistor is disposed in the second active region.

7. A semiconductor device according to claim 1,
   wherein the coupling between the first semiconductor region and the gate electrode of the fifth transistor is achieved by an indiscrete first conductive film extending from over the gate electrode of the fifth transistor to over the first semiconductor region.

8. A semiconductor device according to claim 2,
   wherein the coupling between the second semiconductor region and the gate electrode of the sixth transistor is achieved by an indiscrete second conductive film extending from over the gate electrode of the sixth transistor to over the second semiconductor region.

9. A semiconductor device according to claim 1, further comprising:
a memory cell array including a plurality of memory cells each including the first to six transistors, the memory cells being repeatedly arranged line-symmetrically with respect to a line extending in a first direction and line-symmetrically with respect to a line extending in a second direction intersecting the first direction,
wherein, in the memory cell array, a plurality of the first semiconductor regions are arranged with a first spacing being provided therebetween in the first direction and with a second spacing being provided therebetween in the second direction, and
wherein the second semiconductor region is disposed to come in contact with the bottom portion and the side portion of each of the first semiconductor regions and continuously disposed so as to be located under the insulating layer in a first portion in which the first spacing is provided and in a second portion in which the second spacing is provided.

10. A semiconductor device according to claim 1, wherein the first conductivity type is a p-type and the second conductivity type is an n-type.

11. A semiconductor device according to claim 1, wherein the first conductivity type is an n-type and the second conductivity type is a p-type.

12. A semiconductor device according to claim 11, wherein the gate electrode of the fifth transistor has a metal portion.

13. A semiconductor device according to claim 12, wherein a gate insulating film located between the gate electrode of the fifth transistor and the first active region has an insulating film portion having a dielectric constant higher than that of a silicon oxide film.

14. A semiconductor device according to claim 7, wherein the first conductive film achieving the coupling between the first semiconductor region and the gate electrode of the fifth transistor is disposed to extend through the isolation region.

15. A semiconductor device according to claim 14, wherein the first conductive film is disposed in the isolation region and in an interlayer insulating film disposed over the isolation region.

16. A semiconductor device according to claim 15, further comprising:
a third conductive film disposed over each of source/drain regions of the fifth transistor,
wherein a first coupling hole in which the first conductive film is disposed is formed by a step different from a step by which a second coupling hole in which the third conductive film is disposed is formed.

17. A semiconductor device according to claim 7,
wherein the first conductive film achieving the coupling between the first semiconductor region and the gate electrode of the fifth transistor is not disposed to extend through the isolation region, and
wherein a bottom portion of the first conductive film is coupled to the first semiconductor region at a position higher than that of a bottom portion of the isolation region.

18. A semiconductor device according to claim 17,
wherein the first conductive film is made of a conductive material formed in a coupling hole, and
wherein the coupling hole is formed in an opening region including a region in which the first conductive film is formed after the insulating layer located in the opening region and a semiconductor region over the insulating layer are removed.

19. A semiconductor device according to claim 18, further comprising:
a third conductive film disposed over each of source/drain regions of the fifth transistor,
wherein a first coupling hole in which the first conductive film is disposed is formed by the same step as that by which a second coupling hole in which the third conductive film is disposed is formed.

* * * * *

UNITED STATES PATENT AND TRADEMARK OFFICE
CERTIFICATE OF CORRECTION

PATENT NO. : 8,872,267 B2  
APPLICATION NO. : 13/675682  
DATED : October 28, 2014  
INVENTOR(S) : Toshiaki Iwamatsu et al.

Page 1 of 1

It is certified that error appears in the above-identified patent and that said Letters Patent is hereby corrected as shown below:

In the Specification,

Column 2, Line 36: Delete "(MOSFETs" and insert -- (MISFETs --

Column 6, Line 38: Delete "(or MOSFETs," and insert -- (or MISFETs, --

Column 6, Line 40: Delete "MOSFETs," and insert -- MISFETs, --

Column 6, Line 42: Delete "MOSFETs for" and insert -- MISFETs for --

Column 15, Line 29: Delete "MOSFETs" and insert -- MISFETs --

Column 15, Line 31: Delete "MOSFETs" and insert -- MISFETs --

Column 15, Line 33: Delete "MOSFETs" and insert -- MISFETs --

Column 15, Line 34: Delete "MOSFETs" and insert -- MISFETs --

Column 17, Line 51: Delete "1 x $10^{12}/m^2$" and insert -- 1 x $10^{12}/cm^2$ --

Column 17, Line 56: Delete "1 x $10^{12}/m^2$" and insert -- 1 x $10^{12}/cm^2$ --

Column 20, Line 61: Delete "asking" and insert -- ashing --

Column 21, Line 11: Delete "asking" and insert -- ashing --

Column 24, Line 41: Delete "asking" and insert -- ashing --

Signed and Sealed this  
Twenty-fourth Day of March, 2015

Michelle K. Lee  
*Director of the United States Patent and Trademark Office*